(12) United States Patent
Park et al.

(10) Patent No.: US 11,621,305 B2
(45) Date of Patent: Apr. 4, 2023

(54) DISPLAY DEVICE

(71) Applicant: Samsung Display Co., Ltd., Yongin-si (KR)

(72) Inventors: Sang Jin Park, Yongin-si (KR); Hyun Ae Kim, Seoul (KR); Hee Ra Kim, Yongin-si (KR); Ha Na Seo, Suwon-si (KR); Chong Sup Chang, Hwaseong-si (KR); Eui Kang Heo, Seoul (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 252 days.

(21) Appl. No.: 16/904,715

(22) Filed: Jun. 18, 2020

(65) Prior Publication Data

US 2021/0074769 A1 Mar. 11, 2021

(30) Foreign Application Priority Data

Sep. 11, 2019 (KR) .................. 10-2019-0113123

(51) Int. Cl.
*H01L 27/32* (2006.01)
*H01L 33/58* (2010.01)
(Continued)

(52) U.S. Cl.
CPC ........ *H01L 27/322* (2013.01); *H01L 25/0753* (2013.01); *H01L 27/3246* (2013.01);
(Continued)

(58) Field of Classification Search
CPC . H01L 27/322; H01L 27/3246; H01L 33/504; H01L 33/508; H01L 33/58;
(Continued)

(56) References Cited

U.S. PATENT DOCUMENTS 10,096,647 B2 10/2018 Takeya et al.
10,409,110 B2 9/2019 Koo et al.
(Continued)

FOREIGN PATENT DOCUMENTS

| JP | 05-019117 | 1/1993 |
|---|---|---|
| JP | 201822133 | 2/2018 |
| KR | 10-2019-0014293 | 2/2019 |

*Primary Examiner* — Michael M Trinh
(74) *Attorney, Agent, or Firm* — Kile Park Reed & Houtteman PLLC

(57) ABSTRACT

A display device includes a first display substrate and a second display substrate. The first display substrate includes a first base, a first electrode disposed on the first base, a second electrode spaced apart from the first electrode, and a light emitting element disposed between the first electrode and the second electrode. The second display substrate faces the first display substrate and is configured to receive light emitted from the light emitting element. The second display substrate includes a second base, a first color filter disposed on a surface of the second base, and a first wavelength conversion pattern disposed on the first color filter. The first wavelength conversion pattern includes a first surface facing the first display substrate, and a second surface facing the first surface and the first color filter. The first surface includes a curved surface portion recessed toward the second surface.

24 Claims, 41 Drawing Sheets

(51) Int. Cl.
*H01L 51/52* (2006.01)
*H01L 25/075* (2006.01)
*H01L 33/50* (2010.01)
*H01L 33/20* (2010.01)
*H01L 25/16* (2023.01)

(52) U.S. Cl.
CPC .......... *H01L 33/504* (2013.01); *H01L 33/508* (2013.01); *H01L 33/58* (2013.01); *H01L 51/5275* (2013.01); *H01L 25/167* (2013.01); *H01L 33/20* (2013.01)

(58) Field of Classification Search
CPC ... H01L 33/20; H01L 25/167; H01L 25/0753; H01L 51/5275; G02F 1/133514; G02F 1/133516
See application file for complete search history.

(56) References Cited

U.S. PATENT DOCUMENTS

| | | | |
|---|---|---|---|
| 2013/0334169 A1* | 12/2013 | Tsao | H04N 13/324 |
| | | | 216/24 |
| 2015/0084026 A1 | 3/2015 | Miyamoto et al. | |
| 2016/0190212 A1 | 6/2016 | Takii | |
| 2018/0341147 A1* | 11/2018 | Sugitani | G02F 1/133617 |
| 2018/0351054 A1* | 12/2018 | Chen | H01L 33/486 |
| 2019/0041700 A1* | 2/2019 | Koo | G02F 1/133509 |
| 2019/0081261 A1 | 3/2019 | Lee et al. | |
| 2019/0137815 A1* | 5/2019 | Kim | H01L 27/3265 |
| 2019/0212610 A1 | 7/2019 | Kim et al. | |
| 2019/0319168 A1* | 10/2019 | Kim | H01L 51/5218 |
| 2020/0013766 A1* | 1/2020 | Kim | H01L 25/167 |
| 2021/0280750 A1* | 9/2021 | Park | H01L 33/504 |
| 2021/0328168 A1* | 10/2021 | Park | H01L 27/322 |
| 2022/0077239 A1* | 3/2022 | Kim | G02F 1/133514 |

* cited by examiner

DISPLAY DEVICE

CROSS-REFERENCE TO RELATED APPLICATION

This application claims priority to and the benefit of Korean Patent Application No. 10-2019-0113123, filed Sep. 11, 2019, which is hereby incorporated by reference for all purposes as if fully set forth herein.

BACKGROUND

Field

Exemplary embodiments generally relate to a display device.

Discussion

The importance of a display device has increased with the development of multimedia. Accordingly, various types of display devices, such as a liquid crystal display (LCD) device, an organic light emitting diode display (OLED) device, and an inorganic light emitting diode display device, have been developed.

Among display devices, an inorganic light emitting display device includes an inorganic light emitting element that is a self-light (or self-luminous) emitting element. An inorganic light emitting element is typically disposed between two electrodes facing each other, and receives an electrical signal from each of the electrodes to emit light of a specific wavelength band via an active layer. Further, among display devices, an organic light emitting display device includes an organic light emitting element that is a self-light emitting element. An organic light emitting element typically includes two electrodes facing each other and an organic light emitting layer interposed therebetween. Electrons and holes provided from the two electrodes are recombined in the organic light emitting layer to generate excitons, and the generated excitons are shifted from an excited state to a lower (e.g., ground) state to emit light.

Accordingly, self-light emitting display devices do not need an additional light source, have low power consumption, and can be made thin and lightweight. In addition, self-light emitting display devices generally have high-quality characteristics, such as a wide viewing angle, high luminance and contrast, and rapid response time. Therefore, self-light emitting display devices have attracted considerable attention as next-generation display devices.

The above information disclosed in this section is only for understanding the background of the inventive concepts, and, therefore, may contain information that does not form prior art.

SUMMARY

Some aspects are capable of providing a display device including a light transmission pattern and wavelength conversion patterns, each having a curved surface.

Additional aspects will be set forth in the detailed description which follows, and, in part, will be apparent from the disclosure, or may be learned by practice of the inventive concepts.

According to some aspects, a display device includes a first display substrate and a second display substrate. The first display substrate includes a first base, a first electrode disposed on the first base, a second electrode spaced apart from the first electrode, and a light emitting element disposed between the first electrode and the second electrode. The second display substrate faces the first display substrate and is configured to receive light emitted from the light emitting element. The second display substrate includes a second base, a first color filter disposed on a surface of the second base, and a first wavelength conversion pattern disposed on the first color filter. The first wavelength conversion pattern includes a first surface facing the first display substrate, and a second surface facing the first surface and the first color filter. The first surface includes a curved surface portion recessed toward the second surface.

According to some aspects, a display device includes a first display substrate and a second display substrate. The first display substrate includes a first light emitting area, a second light emitting area spaced apart from the first light emitting area in a first direction, and a non-light emitting area disposed between the first light emitting area and the second light emitting area. The second display substrate is disposed on the first display substrate. The second display substrate includes a first light transmitting area, a second light transmitting area spaced apart from the first light transmitting area in the first direction, and a non-light transmitting area disposed between the first light transmitting area and the second light transmitting area. The first display substrate further includes a first light emitting element disposed in the first light emitting area and a second light emitting element disposed in the second light emitting area. The second display substrate further includes a first color filter disposed in the first light transmitting area, a light transmission pattern disposed on the first color filter, a second color filter disposed in the second light transmitting area, and a first wavelength conversion pattern disposed on the second color filter. Each of the light transmission pattern and the first wavelength conversion pattern includes a first surface facing the first display substrate and a second surface facing the first surface. The first surface includes a curved surface portion recessed toward the second surface.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF SOME EXEMPLARY EMBODIMENTS

Figure 1:
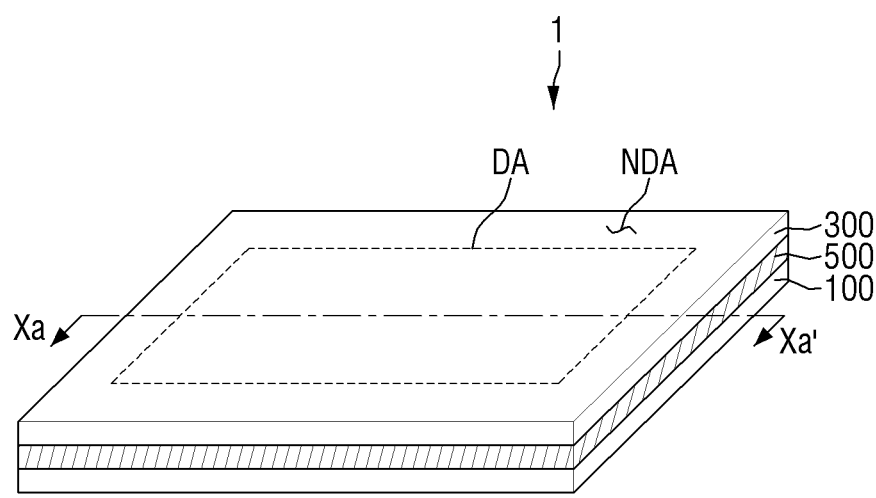
FIG. 1 is a perspective view of a display device according to an exemplary embodiment.
Figure 1:
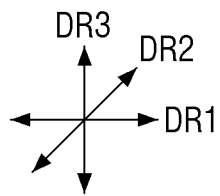

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the DR1-axis, the DR2-axis, and the DR3-axis are not limited to three axes of a rectangular coordinate system, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Figure 2:
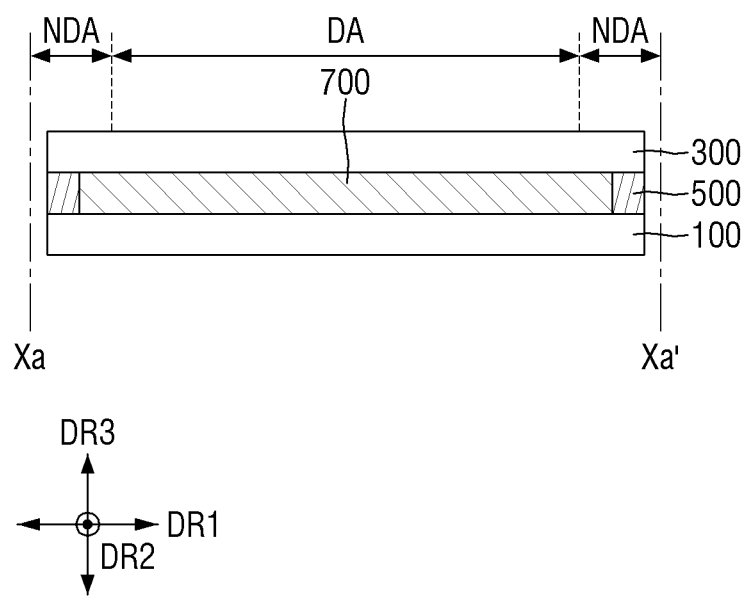
FIG. 2 is a schematic cross-sectional view of the display device taken along sectional line Xa-Xa' in FIG. 1 according to some exemplary embodiments.

Hereinafter, various exemplary embodiments will be explained in detail with reference to the accompanying drawings FIG. 1 is a perspective view of a display device according to some exemplary embodiments. FIG. 2 is a schematic cross-sectional view of the display device taken along sectional line Xa-Xa' in FIG. 1 according to some exemplary embodiments.

Referring to FIGS. 1 and 2, a display device 1 may be applied to (or in association with) various electronic appliances, such as tablet personal computers (PCs), smart phones, car navigation units, cameras, center information displays (CIDs) for cars, wrist watch-type electronic devices, personal digital assistant (PDAs), portable multimedia players (PMPs), game machines, televisions, outside billboards, monitors, personal computers, notebook computers, etc. These appliances are provided only as examples, and it is to be understood that exemplary display devices can be applied to other electronic appliances, as long as it does not depart from the inventive concepts.

In some embodiments, the display device 1 may have a rectangular (or generally rectangular) shape in a plan view. The display device 1 may include two first sides extending in a first direction DR1 and two second sides extending in a second direction DR2 crossing the first direction DR1. A corner where a first side and a second side of the display device 1 meet each other may be a right angle, but exemplary embodiments are not limited thereto. For instance, one or more corners may have a surface, such as an arcuate surface. In some embodiments, the first side may be shorter than the second side, but exemplary embodiments are not limited thereto. The planar shape of the display device 1 is not limited to the illustrated one, and may have a circular (or generally circular) shape or other different shapes.

The display device 1 may include a display area DA where an image is displayed and a non-display area NDA where an image is not displayed. In some embodiments, the non-display area NDA may be located around the display area DA, and may surround the display area DA.

In an embodiment, the display device 1 includes a first display substrate 100 and a second display substrate 300 facing the first display substrate 10, and may further include a sealing member 500 coupling the first display substrate 100 and the second display substrate 300. A filler 700 may be charged (or disposed) between the first display substrate 100 and the second display substrate 300.

Unless otherwise defined in this specification, the terms/phrase "on," "over," "upper side," "top side," and/or "upper surface" refer to a direction of a third direction DR3 crossing the first direction DR1 and the second direction DR2 in which second display substrate 300 is stacked over first display substrate 100, and the terms/phrases "beneath," "under," "lower side," "bottom side," and/or "lower surface" refer to a direction opposite to the direction in which the second display substrate 300 is stacked over the first display substrate 100.

The first display substrate 100 may include elements and circuits for displaying an image. For example, the first display substrate 100 may include a light emitting element layer EML (see, e.g., FIG. 8) including light emitting elements disposed in the display area DA and emitting light, and a circuit element layer PAL (see, e.g., FIG. 8) including circuit elements for driving the light emitting elements disposed on the light emitting element layer EML. The light emitting element of the light emitting element layer EML may include a self-light (or self-luminous) emitting element. In an exemplary embodiment, the self-light emitting element may include at least one of an organic light emitting diode, a quantum dot light emitting diode, and an inorganic light emitting diode. Hereinafter, a case where the self-light emitting element is an inorganic light emitting diode will be described; however, exemplary embodiments are not limited thereto.

The second display substrate 300 may be disposed over the first display substrate 100 and face the first display substrate 100. The second display substrate 300 may include a color conversion pattern for converting the color of light incident from the first display substrate 100. In some embodiments, the color conversion pattern may include at least one of a color filter and a wavelength conversion pattern.

The sealing member 500 may be disposed between the first display substrate 100 and the second display substrate 300 in the non-display area NDA. The sealing member 500 may be disposed along the edges of the first display substrate 100 and the second display substrate 300 in the non-display area NDA to surround the display area DA on a plane. The first display substrate 100 and the second display substrate 300 may be coupled to each other through the sealing member 500. In some embodiments, the sealing member 500 may be made of an organic material. For example, the sealing member 500 may be made of epoxy resin, but exemplary embodiments are not limited thereto.

The filler 700 may be located in a space between the first display substrate 100 and the second display substrate 300.

The space may be surrounded by the sealing member 500. The filler 700 may fill the space between the first display substrate 100 and the second display substrate 300. The filler 700 may be made of a light-transmitting material. In some exemplary embodiments, the filler 700 may be made of an organic material. For example, the filler 700 may be made of a Si-based organic material, an epoxy-based organic material, and/or the like, but exemplary embodiments are not limited thereto. In some cases, the filler 700 may be omitted. Hereinafter, a structure of the display device 1 will be described in more detail with reference to FIGS. 1 and 2, as well as various other drawings.

Figure 3:
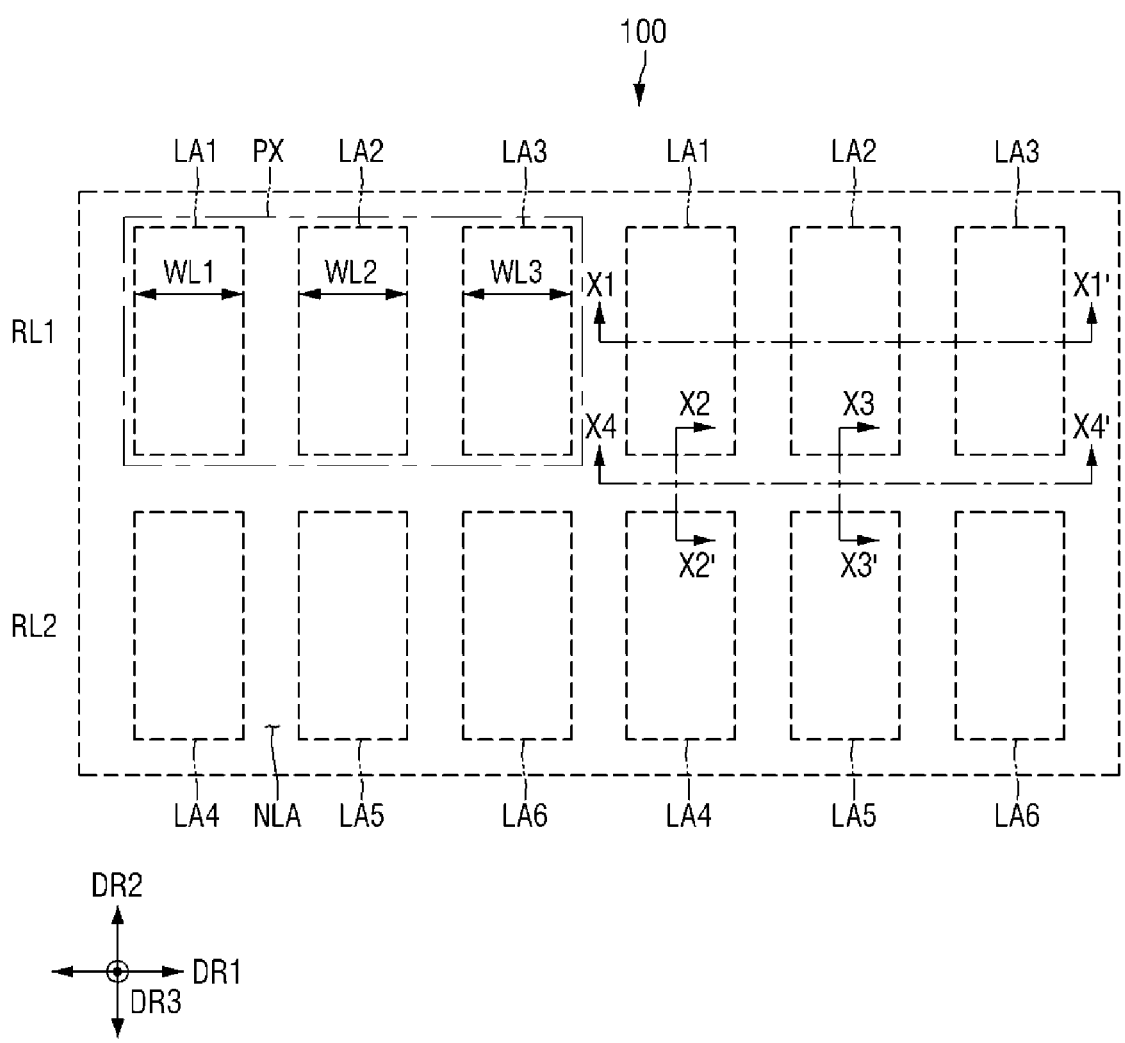
FIG. 3 is a schematic plan view showing a display area of a first display substrate according to some embodiments.
Figure 4:
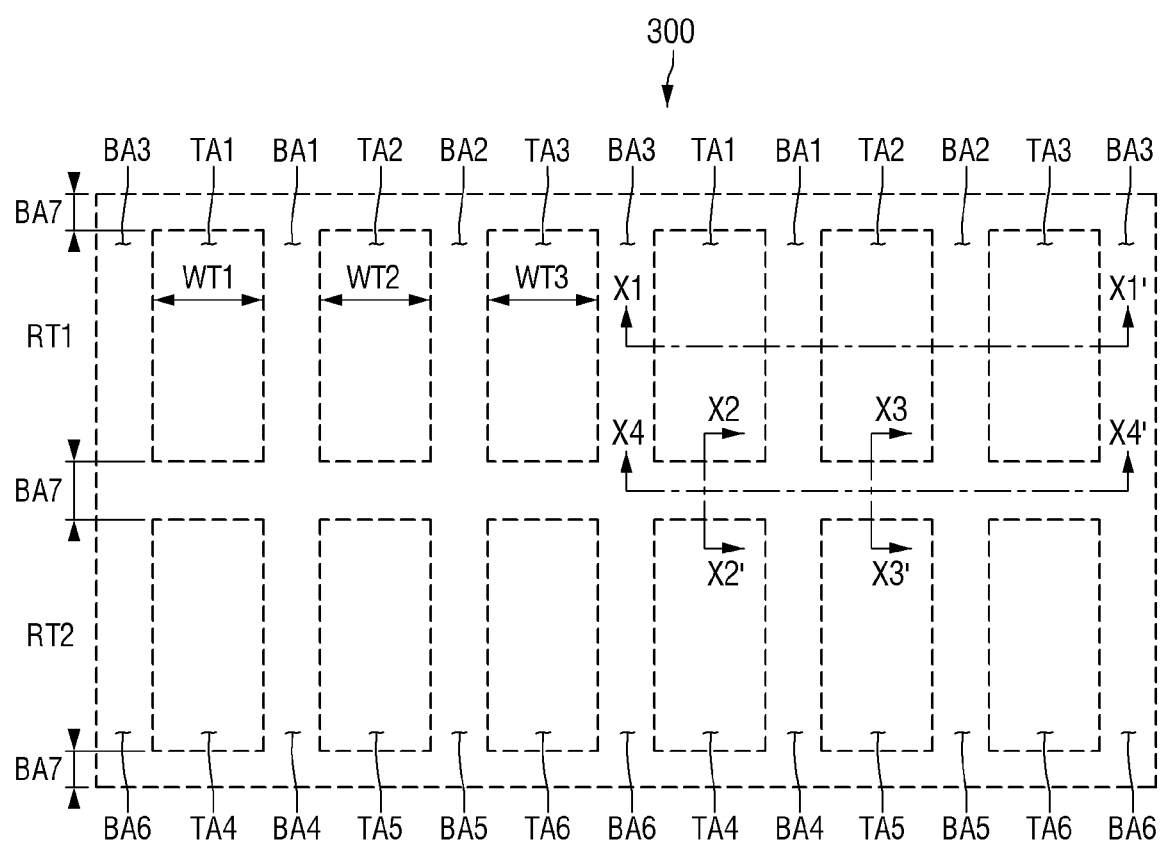
FIG. 4 is a schematic plan view showing a display area of a second display substrate according to some exemplary embodiments.

FIG. 3 is a schematic plan view showing a display area of a first display substrate according to some exemplary embodiments. FIG. 4 is a schematic plan view showing a display area of a second display substrate according to some exemplary embodiments.

Referring to FIGS. 1 to 4, a plurality of light emitting areas LA1, LA2, LA3, LA4, LA5, and LA6 and a non-light emitting area NLA may be defined in the display area DA of the first display substrate 100. Each of the light emitting areas LA1, LA2, LA3, LA4, LA5, and LA6 may be an area where light generated by the light emitting elements of the first display substrate 100 is emitted to the outside of the first display substrate 100, and the non-light emitting area NLA may be an area where the light is not emitted to the outside of the first display substrate 100.

In an embodiment, the light emitted from each of the light emitting areas LA1, LA2, LA3, LA4, LA5, and LA6 to the outside of the first display substrate 100 may be light having a specific (or determined) central wavelength band. In some embodiments, the light may be blue light, and may have a peak wavelength ranging from about 440 nm to about 480 nm.

The first display substrate 100 may include light emitting areas LA1, LA2, and LA3 arranged in a first row RL1 in the display area DA, and light emitting areas LA4, LA5, and LA6 arranged in a second row RL2 in the display area DA. In the first display substrate 100, a first light emitting area LA1, a second light emitting area LA2, and a third light emitting area LA3 may be arranged in the first row RL1 along the first direction DR1. According to an embodiment, in the first display substrate 100, the first light emitting area LA1, the second light emitting area LA2, and the third light emitting area LA3 may be sequentially and repeatedly arranged in the first row RL1 along the first direction DR1. Further, the fourth light emitting area LA4, the fifth light emitting area LA5, and the sixth light emitting area LA6 may also be sequentially and repeatedly arranged along the first direction DR1 in the second row RL2 adjacent to the first row RL1 in the second direction DR2.

In some embodiments, the first width WL1 of the first light emitting area LA1, the second width WL2 of the second light emitting area LA2, and the third width WL3 of the third light emitting area LA3 may be substantially the same. However, exemplary embodiments are not limited thereto. For instance, one or more of the plurality of light emitting areas LA may have different widths from each other.

For example, the first width WL1 of the first light emitting area LA1 measured along the first direction DR1 may be narrower than the second width WL2 of the second light emitting area LA2 measured along the first direction DR1, and may narrower than the third width WL3 of the third light emitting area LA3 measured along the first direction DR1. Further, the second width WL2 of the second light emitting area LA2 and the third width WL3 of the third light emitting area LA3 may also be different from each other. For instance, the second width WL2 of the second light emitting area LA2 may be wider than the third width WL3 of the third light emitting area LA3. In some embodiments, the area of the second light emitting area LA2 may be smaller than the area of the third light emitting area LA3.

Although it is shown in the drawings that the widths of the first light emitting area LA1, the second light emitting area LA2, and the third light emitting area LA3 in the first display substrate 100 are the same as each other, exemplary embodiments are not limited thereto.

The fourth light emitting area LA4 adjacent to the first light emitting area LA1 along the second direction DR2 may be the same as the first light emitting area LA1, except that it is located in the second row RL2, and may be substantially the same as the first light emitting area LA1 in terms of width, area, and structure of components in the area. Similarly, the second light emitting area LA2 and the fifth light emitting area LA5 adjacent to each other along the second direction DR2 may have substantially the same structure, and the third light emitting area LA3 and the sixth light emitting area LA6 adjacent to each other along the second direction DR2 may have substantially the same structure.

The display area DA of the first display substrate 100 may include a plurality of pixels PX. The plurality of pixels PX may be arranged in a matrix direction or arrangement, but exemplary embodiments are not limited thereto. Each of the pixels PX may have a rectangular (or generally rectangular) shape or a square (or generally square) shape in a plan view, but the shapes are not limited thereto. For instance, the pixels may have a rhombus (or generally rhombus) shape in which each side is inclined with respect to one direction, or some other geometric shape. Each of the pixels PX may include at least one light emitting element 30 (shown in FIG. 5) that emits light of a specific wavelength band to display a specific color.

Each of the pixels PX may include a plurality of sub-pixels PXn (where "n" is an integer greater than zero), and each of the sub-pixels PXn may include a light emitting area. As shown in the drawings, the first light emitting area LA1, the second light emitting area LA2, and the third light emitting area LA3 may be included in one pixel PX, and may be included in the sub-pixels PXn different from each other, respectively. Details thereof will be described later.

The second display substrate 300 may face the first display substrate 100. A plurality of light emitting areas TA1, TA2, TA3, TA4, TA5, and TA6 and light blocking area BA may be defined in the display area DA of the second display substrate 300. Each of the light emitting areas TA1, TA2, TA3, TA4, TA5, and TA6 may be an area where light emitted from the first display substrate 100 is transmitted through the second display substrate 300 and is provided to the outside of the display device 1. The light blocking area BA may be an area where the light emitted from the first display substrate 100 is not transmitted through the second display substrate 300.

The second display substrate 300 may include light transmitting areas TA1, TA2, and TA3 arranged in a first row RT1 in the display area DA, and light transmitting areas TA4, TA5, and TA6 arranged in a second row RT2 in the display area DA. In the second display substrate 300, a first light transmitting area TA1, a second light transmitting area TA2, and a third light transmitting area TA3 may be arranged in the first row RT1 along the first direction DR1. In the second display substrate 300, the first light transmitting area TA1, the second light transmitting area TA2, and the third light transmitting area TA3 may be sequentially and repeatedly arranged in the first row RT1 along the first direction DR1.

The first light transmitting area TA1 may correspond to or overlap the first light emitting area LA1. Similarly, the second light transmitting area TA2 may correspond to or overlap the second light emitting area LA2, and the third light transmitting area TA3 may correspond to or overlap the third light emitting area LA3. As described above, the first light emitting area LA1, the second light emitting area LA2, and the third light emitting area LA3 of the first display substrate 100 may be sequentially and repeatedly arranged in the first direction DR1, and the first light transmitting area TA1, the second light transmitting area TA2, and the third light transmitting area TA3 of the second display substrate 300, corresponding to or overlapping these light emitting areas LA1, LA2, and LA3, may also be sequentially and repeatedly arranged in the first direction DR1.

The light L provided from the first display substrate 100 may be transmitted through the first light transmitting area TA1, the second light transmitting area TA2, and the third light transmitting area TA3 to be provided to the outside of the display device 1. When the light emitted from the first light transmitting area TA1 to the outside of the display device 1 is referred to as first emission light, the light emitted from the second light transmitting area TA2 to the outside of the display device 1 is referred to as second emission light, and light emitted from the third light transmitting area TA3 to the outside of the display device 1 is referred to as third emission light, the first emission light may be light of a first color, the second emission light may be light of a second color different from the first color, and the third emission light may be light of a third color different from the first color and the second color. In some embodiments, the light of the first color may be blue light having a peak wavelength in a range of about 440 nm to about 480 nm, the light of the second color may be green light having a peak wavelength in a range of about 510 nm to about 550 nm, and the light of the third color may be red light having a peak wavelength in a range of 610 nm to about 650 nm.

A fourth light transmitting area TA4, a fifth light transmitting area TA5, and a sixth light transmitting area TA6 may be arranged in the second row RT2 adjacent to the first row RT1 along the second direction DR2. The fourth light transmitting area TA4, the fifth light transmitting area TA5, and the sixth light transmitting area TA6 may also be arranged sequentially and repeatedly in the second row RT2 along the first direction DR1. The fourth light transmitting area TA4 may correspond to or overlap the fourth light emitting area LA4, the fifth light transmitting area TA5 may correspond to or overlap the fifth light emitting area LA5, and the sixth light transmitting area TA6 may correspond to or overlap the sixth light emitting area LA6.

In some embodiments, the relationship of the widths WT1, WT2, and WT3 respectively of the first light transmitting area TA1, the second light transmitting area TA2, and the third light transmitting area TA3, measured in the first direction DR1, may be similar to the relationship of the widths WL1, WL2, and WL3 respectively of the first light emitting area LA1, the second light emitting area LA2, and the third light emitting area LA3, measured in the first direction DR1. For example, the first width WT1 of the first light transmitting area TA1 measured along the first direction DR1, the second width WT2 of the second light transmitting area TA2 measured along the first direction DR1, and the third width WT3 of the third light transmitting area TA3 measured along the first direction DR1 may be substantially the same as each other. However, exemplary embodiments are not limited thereto. For instance, at least one of the plurality of light transmitting areas TA may have different widths from each other.

For example, the first width WT1 of the first light transmitting area LT1 measured along the first direction DR1 may be narrower than the second width WT2 of the second light transmitting area TA2 measured along the first direction DR1, and may narrower than the third width WT3 of the third light transmitting area LA3 measured along the first direction DR1. Further, the second width WT2 of the second light transmitting area TA2 and the third width WT3 of the third light transmitting area TA3 may also be different from each other. For example, the second width WT2 of the second light transmitting area TA2 may be wider than the third width WT3 of the third light transmitting area TA3. In some embodiments, the area of the second light transmitting area TA2 may be smaller than the area of the third light transmitting area TA3.

Although it is shown in the drawings that the widths of the first light transmitting area TA1, the second light transmitting area TA2, and the third light transmitting area TA3 in the second display substrate 300 are the same as each other, exemplary embodiments are not limited thereto.

The fourth light emitting area LA4, the fifth light emitting area LA5, and the sixth light emitting area LA6, adjacent to each other along the second direction DR2, may be substantially the same as the first light transmitting area LA1, the second light transmitting area LA2, and the third light transmitting area LA3, respectively, in terms of width, area, structure of components in the area, and color of light emitted to the outside.

In the display area DA of the second display substrate 300, the light blocking area BA may be located outside (e.g., around) the light transmitting areas TA1, TA2, TA3, TA4, TA5, and TA6. In some embodiments, the light blocking area BA may be divided into a first light blocking area BA1, a second light blocking area BA2, a third light blocking area BA3, a fourth light blocking area BA4, a fifth light blocking area BA5, a sixth light blocking area BA6, and a seventh light blocking area BA7.

The first light blocking area BA1 may be located between the first light transmitting area TA1 and the second light transmitting area TA2 along the first direction DR1, the second light blocking area BA2 may be located between the second light transmitting area TA2 and the third light transmitting area TA3 along the first direction DR1, and the third light blocking area BA3 may be located between the third light transmitting area TA3 and another first light transmitting area TA1 along the first direction DR1.

The fourth light blocking area BA4 may be located between the fourth light transmitting area TA4 and the fifth light transmitting area TA5 along the first direction DR1, the fifth light blocking area BA5 may be located between the fifth light transmitting area TA5 and the sixth light transmitting area TA6 along the first direction DR1, and the sixth light blocking area BA6 may be located between the sixth light transmitting area TA6 and another fourth light transmitting area TA4 along the first direction DR1.

The seventh light blocking area BA7 may be located between the first row RT1 and the second row RT2 that are adjacent to each other along the second direction DR2. Moreover, the seventh light blocking area BA7 may also be located between other rows other than the first row RT1 and the second row RT2.

Hereinafter, structures of the first display substrate 100 and the second display substrate 300 of the display device 1 will be described in more detail with reference to FIGS. 1 to 4, as well as some other drawings.

Figure 5:
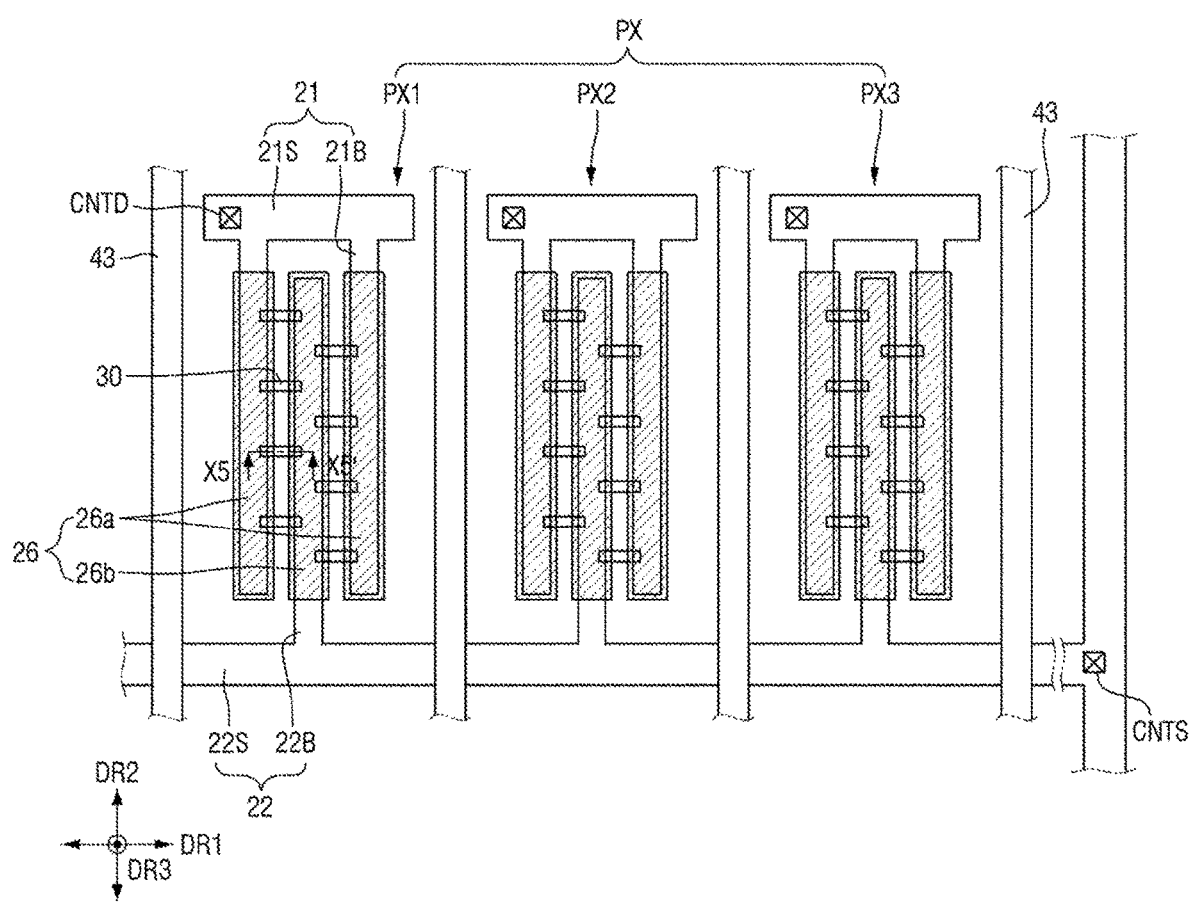
FIG. 5 is a schematic plan view showing a pixel of a first display substrate according to some exemplary embodiments.

FIG. 5 is a schematic plan view showing one pixel of a first display substrate according to some exemplary embodiments.

Referring to FIG. 5, each of the plurality of pixels PXs may include a first sub-pixel PX1, a second sub-pixel PX2, and a third sub-pixel PX3. Each of the sub-pixels PXn may include a light emitting area LA in which the light emitting element 30 is disposed to emit light of a specific wavelength band.

In some embodiments, the first sub-pixel PX1, the second sub-pixel PX2, and the third sub-pixel PX3 may emit light L1 of the same first color, respectively. Each of the sub-pixels PXn may include the same type of light emitting element 30 and emit the same light emitted therefrom, for example, light L1 of a first color. However, exemplary embodiments are not limited thereto. For instance, the first sub-pixel PX1 may emit light L1 of a first color, the second sub-pixel PX2 may emit light L2 of a second color, and the third sub-pixel PX3 may emit light L3 of a third color. Although it is shown in FIG. 5 that the pixel PX includes three sub-pixels PXn, exemplary embodiments are not limited thereto. For instance, the pixel PX may include a smaller or larger number of sub-pixels PXn.

Figure 6:
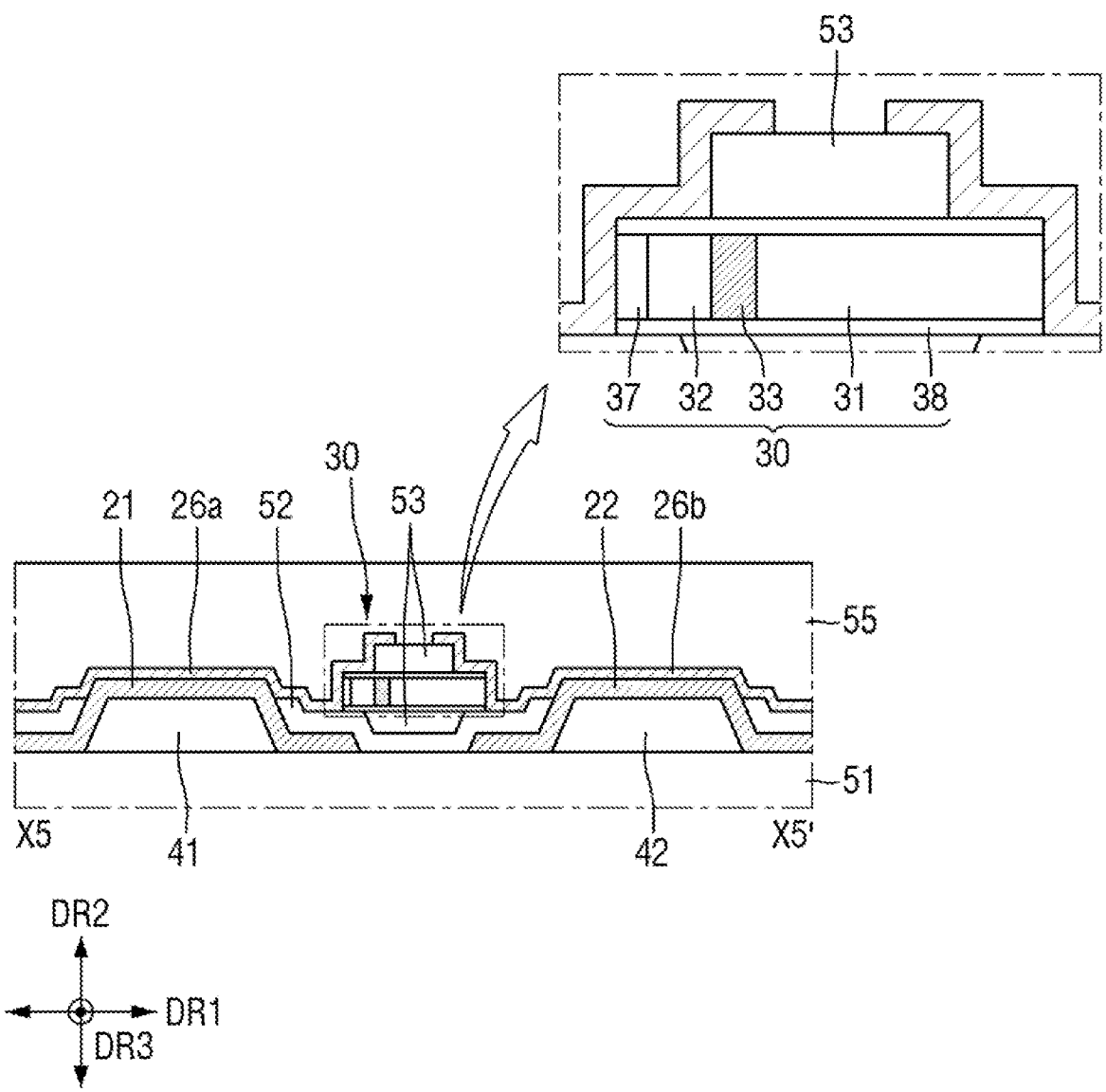
FIG. 6 is a cross-sectional view taken along sectional line X5-X5' in FIG. 5 according to some exemplary embodiments.

Each of the sub-pixels PXn of the first display substrate 100 may include a plurality of electrodes 21 and 22, a light emitting element 30, a plurality of contact electrodes 26, a plurality of inner banks 41 and 42 (shown in FIG. 6), a plurality of outer banks 43, and one or more insulating layers 51, 52, 53, and 55 (shown in FIG. 6).

The plurality of electrodes 21 and 22 are electrically connected to the light emitting elements 30, and may receive predetermined voltages such that the light emitting elements 30 emit light of a specific wavelength band. At least one of the electrodes 21 and 22 may be utilized to form an electric field in the sub-pixel PXn in order to align the light emitting elements 30.

The plurality of electrodes 21 and 22 may include a first electrode 21 and a second electrode 22. In an exemplary embodiment, the first electrode 21 may be a pixel electrode separated for each sub-pixel PXn, and the second electrode 22 may be a common electrode connected in common along each sub-pixel PXn. One of the first electrode 21 and the second electrode 22 is an anode electrode of the light emitting element 30, and the other of the first electrode 21 and the second electrode 22 may be a cathode electrode of the light emitting element 30, or vice versa. However, exemplary embodiments are not limited thereto.

The first electrode 21 and the second electrode 22 may include electrode stem portions 21S and 22S extending in the first direction DR1 and electrode branch portions 21B and 22B extending in the second direction DR2 and branched from the electrode stem portions 21S and 22S, respectively.

The first electrode 21 may include a first electrode stem portion 21S extending in the first direction DR1 and at least one first electrode branch portion 21B extending in the second direction DR2 and branched from the first electrode stem portion 21S.

The first electrode stem portion 21S of any one pixel may be terminated such that both ends thereof are spaced apart from each other between the adjacent sub-pixels PXn, and may be placed on substantially the same line as the first electrode stem portion 21S adjacent thereto in the same row (for example, adjacent thereto in the first direction DR1. Since the first electrode stem portion 21S of each sub-pixel PXn is configured such that both ends thereof are spaced apart from each other, different electrical signals from each other may be applied to the first electrode branch portions 21B, and the first electrode branch portions 21B may be separately driven.

The first electrode branch portion 21B may be branched from at least a portion of the first electrode stem portion 21S and extend in the second direction DR2, but may be terminated in a state of being spaced apart from the second electrode stem portion 22S disposed to face the first electrode stem portion 21S.

The second electrode 22 may include a second electrode stem portion 22S extending in the first direction DR1, spaced apart from the first electrode stem portion 21S and facing the first electrode stem portion 21S, and a second electrode branch portion 22B branched from the second electrode stem portion 22S and extending in the second direction DR2. The second electrode stem portion 22S may be connected to the second electrode stem portion 22S of another sub-pixel PXn whose other end is adjacent in the first direction DR1. That is, unlike the first electrode stem portion 21S, the second electrode stem portion 22S may extend in the first direction DR1 to cross the sub-pixels PXn. The second electrode stem portion 22S crossing the sub-pixels PXn may be connected to an outer portion of the display area DA in which each pixel PX (or sub-pixels PXn) is disposed, or a portion extending from the non-display area NDA in one direction.

The second electrode branch portion 22B may be spaced apart from the first electrode branch portion 21B and face the first electrode branch portion 21B, and may be terminated in a state spaced apart from the first electrode stem portion 21S. The second electrode branch portion 22B may be connected to the second electrode stem portion 22S, and the end portion thereof in the extending direction may be disposed in the sub-pixel PXn while being spaced apart from the first electrode stem portion 21S.

Each of the first electrode 21 and the second electrode 22 may be electrically connected to the circuit element layer PAL of the first display substrate 100 through contact holes, for example, a first electrode contact hole CNTD and a second electrode contact hole CNTS. Although it is shown in the drawings that the first electrode contact hole CNTD is formed for each first electrode stem portion 21S of each sub-pixel PXn, and only one second electrode contact hole CNTS is formed in one second electrode stem portion 22S crossing each of the sub-pixels PXn, but exemplary embodiments are not limited thereto. For instance, in some cases, the second electrode contact hole CNTS may be formed for each sub-pixel PXn.

The plurality of inner banks 41 and 42 may be disposed under the electrodes 21 and 22 adjacent to the center of each sub-pixel PXn, respectively. A first inner bank 41 and a second inner bank 42 may be disposed under the first electrode branch portion 21B and the second electrode branch portion 22B, respectively.

The outer bank 43 may be disposed at a boundary between the respective sub-pixels PXn. The ends of the plurality of first electrode stem portions 21S may be terminated while being spaced apart from each other with respect to the outer banks 43. The outer bank 43 may extend in the second direction DR2 and may be disposed at a boundary between the sub-pixels PXn arranged in the first direction DR1. Exemplary embodiments are not limited thereto. For example, the outer bank 43 may extend in the first direction DR1 and may be disposed at a boundary between the sub-pixels PXn arranged in the second direction DR2. For instance, the outer bank 43 may define the boundary of the sub-pixels PXn. The outer bank 43 may include the same material as the inner banks 41 and 42, and may be formed together with the inner banks 41 and 42 at the same time in one process.

In one exemplary process of manufacturing the first display substrate 100, when ejecting ink in which light emitting elements 30 are dispersed, the outer bank 43 may perform a function of preventing the ink from overflowing the boundary of the sub-pixels PXn. The outer bank 43 may separate the inks in which different light emitting elements 30 are dispersed for each sub-pixel PXn such that the inks are not mixed with each other. However, exemplary embodiments are not limited thereto.

The light emitting element 30 may be disposed between the first electrode 21 and the second electrode 22. One end of the light emitting element 30 may be electrically connected to the first electrode 21, and the other end thereof may be electrically connected to the second electrode 22. The light emitting element 30 may be electrically connected to the first electrode 21 and the second electrode 22 through a contact electrode 26 to be described later.

The plurality of light emitting elements 30 may be spaced apart from each other, and may be aligned substantially in parallel to each other. The distance between the light emitting elements 30 spaced apart from each other is not particularly limited. In some cases, some light emitting elements 30 may be arranged adjacent to each other to form a group, other light emitting elements 30 may be arranged to be spaced apart from each other to form a group, and these light emitting elements 30 may be arranged in one direction in an uneven density. In an exemplary embodiment, the light emitting element 30 has a shape extending in one direction, and the extending direction of each electrode, for example, the extending direction of the first electrode branch portion 21B and the second electrode branch portion 22B, may be substantially perpendicular to the extending direction of the light emitting element 30. However, exemplary embodiments are not limited thereto. For instance, the light emitting element 30 may be disposed at an angle without being perpendicular to the extending direction of the first electrode branch portion 21B and the second electrode branch portion 22B.

According to an embodiment, the plurality of light emitting elements 30 may include an active layer 33 having the same material to emit light of the same wavelength band or light of the same color. The light emitted from the plurality of pixels PX or sub-pixels PXn included in the first display substrate 100 or the light emitted from each light emitting area LA may have the same color. In an exemplary embodiment, the plurality of light emitting elements 30 may emit light L1 of a first color, such as blue light having a center wavelength band in a range of 450 nm to 495 nm. Accordingly, the light L1 of the first color may be emitted from each light emitting area LA of the first display substrate 100. However, exemplary embodiments are not limited thereto. For example, each of the plurality of sub-pixels PXn of the first display substrate 100 may include the light emitting elements 30 having different active layers 33 from each other to emit light of different colors. For instance, the first display substrate 100 may emit light of a different color for each light emitting area LA.

The first display substrate 100 may include a second insulating layer 52 covering at least a portion of the first electrode 21 and at least a portion of the second electrode 22.

The second insulating layer 52 may be disposed for (or in) each sub-pixel PXn. The second insulating layer 52 may be disposed to entirely cover each sub-pixel PXn, and may be disposed to extend to another adjacent sub-pixel PXn. The second insulating layer 52 may be disposed to cover at least a portion of the first electrode 21 and at least a portion of the second electrode 22. The second insulating layer 52 may be disposed to expose a portion of the first electrode 21 and a portion of the second electrode 22, e.g., expose a portion of the first electrode branch portion 21B and a portion of the second electrode branch portion 22B.

Each of the plurality of contact electrodes 26 may have a shape in which a portion thereof extends in one direction. Each of the plurality of contact electrodes 26 may be in contact with the light emitting element 30 and the first and second electrodes 21 and 22. The light emitting elements 30 may receive electrical signals from the first electrode 21 and the second electrode 22 through the contact electrode 26.

The contact electrode 26 may include a first contact electrode 26a and a second contact electrode 26b. The first contact electrode 26a and the second contact electrode 26b may be disposed on the first electrode branch portion 21B and the second electrode branch portion 22B, respectively.

The first contact electrode 26a may be disposed on the first electrode 21 or the first electrode branch portion 21B to extend in the second direction DR2. The first contact electrode 26a may be in contact with one end of the light emitting element 30. Further, the first contact electrode 26a may be in contact with the first electrode 21 exposed without the second insulating layer 52. Accordingly, the light emitting element 30 may be electrically connected to the first electrode 21 through the first contact electrode 26a.

The second contact electrode 26b may be disposed on the second electrode 22 or the second electrode branch portion 22B to extend in the second direction DR2. The second contact electrode 26b may be spaced apart from the first contact electrode 26a in the first direction DR1. The second contact electrode 26b may be in contact with the other end of the light emitting element 30. Further, the second contact electrode 26b may be in contact with the second electrode 22 exposed without the second insulating layer 52. Accordingly, the light emitting element 30 may be electrically connected to the second electrode 22 through the second contact electrode 26b. Although it is shown in the drawings that two first contact electrodes 26a and one second contact electrode 26b are disposed in one sub-pixel PXn, exemplary embodiments are not limited thereto. For example, the number of first contact electrodes 26a and second contact electrode 26b may be changed depending on the number of first electrodes 21 and second electrodes 22 or the number of first electrode branch portions 21B and second electrode branch portions 22B are being utilized.

In some embodiments, the widths of the first contact electrode 26a and the second contact electrode 26b, measured in one direction, may be greater than the widths of the first electrode branch portion 21B and the second electrode branch portion 22B, measured in the one direction, respectively. However, exemplary embodiments are not limited thereto. For example, in some cases, the first contact electrode 26a and the second contact electrode 26b may be disposed to cover only one side of the first electrode branch portion 21B and only one side of the second electrode branch portion 22B, respectively.

The first display substrate 100 may include a circuit element layer PAL located under each of the electrodes 21 and 22, and a third insulating layer 53 (shown in FIG. 6) disposed to cover each of the electrodes 21 and 22 and at least a portion of the light emitting element 30, and a passivation layer 55 (shown in FIG. 6). Hereinafter, a structure of the first display substrate 100 will be described in more detail with reference to FIG. 6.

FIG. 6 is a cross-sectional view taken along sectional line X5-X5' in FIG. 5 according to some exemplary embodiments.

FIG. 6 shows only a cross-section of the light emitting element layer EML of the first sub-pixel PX1, but may be similarly applied to other pixels PX or sub-pixels PXn. FIG. 6 shows a cross-section that crosses one end and the other end of the light emitting element 30 disposed in the first sub-pixel PX1.

The first display substrate 100 may further include a circuit element layer PAL disposed under each of the electrodes 21 and 22. The circuit element layer PAL includes a plurality of semiconductor layers and a plurality of conductive patterns, and may further include one or more switching elements T1, T2, and T3 (shown in FIG. 8), and a power supply line. However, a detailed description thereof will be omitted.

Referring to FIGS. 5 and 6, the first display substrate 100 may include a first insulating layer 51, electrodes 21 and 22 disposed on the first insulating layer 51, and a light emitting element 30. A circuit element layer PAL may further be disposed under the first insulating layer 51. The first insulating layer 51 may include an organic insulating material to perform a surface planarization function.

A plurality of inner banks 41 and 42, an outer bank 43, a plurality of electrodes 21 and 22, and a light emitting element 30 may be arranged on the first insulating layer 51.

The plurality of inner banks 41 and 42 may include a first inner bank 41 and a second inner bank 42 disposed adjacent to the center of each sub-pixel PXn.

The first inner bank 41 and the second inner bank 42 are disposed to be spaced apart from each other and face each other. The first electrode 21 may be disposed on the first inner bank 41, and the second electrode 22 may be disposed on the second inner bank 42. For example, the first electrode branch portion 21B is disposed on the first inner bank 41, and the second electrode branch portion 22B is disposed on the second inner bank 42.

The first inner bank 41 and the second inner bank 42 may extend in each sub-pixel PXn in the second direction DR2. However, exemplary embodiments are not limited thereto. For instance, the first inner bank 41 and the second inner bank 42 may be disposed for each sub-pixel PXn to form a pattern on the entire surface of the first display substrate 100. The plurality of inner banks 41 and 42 and the plurality of the outer banks 43 may include, but are not limited to, polyimide (PI).

The first inner bank 41 and the second inner bank 42 may have a structure in which at least a portion thereof protrudes from the first insulating layer 51. The first inner bank 41 and the second inner bank 42 may protrude upward based on the plane where the light emitting element 30 is disposed, and at least a portion of the protruding portion may have an inclination with respect to the plane and/or a surface of the first insulating layer 51. Since the inner banks 41 and 42 have inclined sides protruding from the first insulating layer 51, light emitted from the light emitting element 30 may be reflected from the inclined sides of the inner banks 41 and 42. As will be described later, when the electrodes 21 and 22 disposed on the inner banks 41 and 42 include a material having high reflectivity, light emitted from the light emitting element 30 may be reflected by the electrodes 21 and 22 to travel in the upward direction of the first insulating layer 51.

As described above, the plurality of inner banks 41 and 42 and the outer banks 43 may include the same material, and may be formed in the same process. However, the outer bank 43 is formed at the boundary of each sub-pixel PXn to form a grid pattern, whereas the inner banks 41 and 42 are disposed in each sub-pixel PXn to have a shape extending in one direction.

The plurality of electrodes 21 and 22 may be disposed on the first insulating layer 51 and the inner banks 41 and 42. As described above, the electrodes 21 and 22 include the electrode stem portions 21S and 22S and the electrode branch portions 21B and 22B, respectively.

Portions of the first electrode 21 and the second electrode 22 may be disposed on the first insulating layer 51, and other portions thereof may be disposed on the first inner bank 41 and the second inner bank 42. As described above, the first electrode stem portion 21S of the first electrode 21 and the second electrode stem portion 22S of the second electrode 22 may extend in the second direction DR2, and the first inner bank 41 and the second inner bank 42 may also extend in the second direction DR2 to be disposed in the sub-pixel PXn neighboring in the second direction DR2.

A first electrode contact hole CNTD penetrating through the first insulating layer 51 to expose a portion of the circuit element layer PAL may be formed in the first electrode stem portion 21S of the first electrode 21. The first electrode 21 may be electrically connected to a switching element of the circuit element layer PAL through the first electrode contact hole CNTD. The first electrode 21 may receive a predetermined electrical signal from the switching element.

The second electrode stem portion 22S of the second electrode 22 may extend in one direction to be disposed in a non-light emitting area where the light emitting elements 30 are not disposed. A second electrode contact hole CNTS penetrating through the first insulating layer 51 to expose a portion of the circuit element layer PAL may be formed in the second electrode stem portion 22S of the second electrode 22. The second electrode 22 may be electrically connected to a power supply electrode through the second electrode contact hole CNTS. The second electrode 22 may receive a predetermined electrical signal from the power supply electrode.

Some regions of the first electrode 21 and the second electrode 22, for example, the first electrode branch portion 21B and the second electrode branch portion 22B may be disposed on the first inner bank 41 and the second inner bank 42, respectively. The plurality of light emitting elements 30 may be disposed in an area between the first electrode 21 and the second electrode 22, e.g., may be disposed in a space where the first electrode branch portion 21B and the second electrode branch portion 22B are spaced apart from each other.

Each of the electrodes 21 and 22 may include a transparent conductive material. For example, each of the electrodes 21 and 22 may include a material, such as indium tin oxide (ITO), indium zinc oxide (IZO), or indium tin-zinc oxide (ITZO), but exemplary embodiments are not limited thereto. In some embodiments, each of the electrodes 21 and 22 may include a high-reflectance conductive material. For example, each of the electrodes 21 and 22 may include a metal, such as silver (Ag), copper (Cu), or aluminum (Al), as the high-reflectance material, but exemplary embodiments are not limited thereto. In this case, light incident on each of the electrodes 21 and 22 may be reflected and emitted in the upper direction of each sub-pixel PXn.

Further, the electrodes 21 and 22 may have a structure in which at least one transparent conductive material layer and at least one high-reflectance metal layer are stacked, or may be formed as a single layer including these layers. In an exemplary embodiment, each of the electrodes 21 and 22 may have a laminate structure of ITO/Ag/ITO/IZO, or may include an alloy containing aluminum (Al), nickel (Ni), or lanthanum (La); however, exemplary embodiments are not limited thereto.

The second insulating layer 52 is disposed on the first insulating layer 51, the first electrode 21, and the second electrode 22. The second insulating layer 52 is disposed to partially cover the first electrode 21 and the second electrode 22. The second insulating layer 52 may be disposed to cover most of the upper surfaces of the first electrode 21 and the second electrode 22, and may expose a portion of the first electrode 21 and a portion of the second electrode 22. The second insulating layer 52 may be disposed to expose a portion of the upper surface of the first electrode 21 and a portion of the upper surface of the second electrode 22, for example, a portion of the upper surface of the first electrode branch portion 21B disposed on the first inner bank 41 and a portion of the upper surface of the second electrode branch portion 22B disposed on the second inner bank 42. For instance, the second insulating layer 52 may be formed on the entire first surface of the first insulating layer 51, and may include an opening partially exposing the first electrode 21 and the second electrode 22.

In an exemplary embodiment, a step may be formed in the second insulating layer 52 such that a portion of the upper surface of the second insulating layer 52 is recessed between the first electrode 21 and the second electrode 22. In some embodiments, the second insulating layer 52 may include an inorganic insulating material, and a portion of the upper surface of the second insulating layer 52 may be recessed by a step of a member disposed under the second insulating layer 52 disposed to cover the first electrode 21 and the second electrode 22. The light emitting element 30 disposed on the second insulating layer 52 between the first electrode 21 and the second electrode 22 may form an empty space between the recessed upper surfaces of the second insulating layer 52. The light emitting element 30 may be disposed to be spaced apart from a portion of the upper surface of the second insulating layer 52, and a material constituting a third insulating layer 53 to be describe later may fill the empty space. However, exemplary embodiments are not limited thereto. The second insulating layer 52 may have a flat upper surface such that the light emitting element 30 is disposed thereon.

The second insulating layer 52 may protect the first electrode 21 and the second electrode 22 and insulate them from each other. Further, the second insulating layer 52 may prevent (or at least mitigate) the light emitting element 30 disposed on the second insulating layer 52 from being in direct contact with other members so as not to be damaged. However, the shape and structure of the second insulating layer 52 is not limited thereto.

The light emitting element 30 may be disposed on the second insulating layer 52 between the electrodes 21 and 22. In some embodiments, at least one light emitting element 30 may be disposed on the second insulating layer 52 disposed between the electrode branch portions 21B and 22B. However, exemplary embodiments are not limited thereto. At least some of the light emitting elements 30 disposed in each sub-pixel PXn may be disposed in an area other than between the electrode branch portions 21B and 22B. The light emitting element 30 may be disposed on each end portion at which the first electrode branch portion 21B and the second electrode branch portion 22B face each other, and may be electrically connected to each of the electrodes 21 and 22 through the contact electrode 26.

In the light emitting element 30, a plurality of layers may be arranged in a direction parallel to the first insulating layer 51. The light emitting element 30 of the first display substrate 100, according to an embodiment, has a shape extending in one direction, and may have a structure in which a plurality of semiconductor layers are sequentially arranged in one direction. As described above, in the light emitting element 30, a first semiconductor layer 31, an active layer 33, a second semiconductor layer 32, and an electrode layer 37 may be sequentially arranged along one direction, and outer surfaces thereof may be surrounded by an insulating film 38. The light emitting element 30 disposed in the first display substrate 100 may be disposed in parallel to the first insulating layer 51 on one direction, and the plurality of semiconductor layers included in the light emitting element 30 may be sequentially disposed along a direction parallel to the upper surface of the first insulating layer 51. However, exemplary embodiments are not limited thereto. In some cases, when the light emitting element 30 has a different structure, the plurality of layers may be arranged in a direction perpendicular to the first insulating layer 51 or another arrangement direction.

One end of the light emitting element 30 may be in contact with the first contact electrode 26a, and the other end thereof may be in contact with the second contact electrode 26b. According to an embodiment, since the extended end of the light emitting element 30 in one direction is exposed without the insulating film 38 formed thereon, the light emitting element 30 may be in contact with the first contact electrode 26a and the second contact electrode 26b, which will be described later, in the exposed area. However, exemplary embodiments are not limited thereto. In some cases, in the light emitting element 30, at least a portion of the insulating film 38 may be removed, and thus, side surfaces of both ends of the light emitting element 30 may be partially exposed.

The third insulating layer 53 may be partially disposed on the light emitting element 30 disposed between the first electrode 21 and the second electrode 22. The third insulating layer 53 may be disposed to partially surround the outer surface of the light emitting element 30. The third insulating layer 53 may function to protect the light emitting element 30 and may also function to fix the light emitting element 30 in the manufacturing process of the first display substrate 100. Further, in an exemplary embodiment, a portion of the material of the third insulating layer 53 may be disposed between the lower surface of the light emitting element 30 and the second insulating layer 52. As described above, the third insulating layer 53 may be formed to fill a space between the second insulating layer 52 and the light emitting element 30 formed during the manufacturing process of the first display substrate 100. Accordingly, the third insulating layer 53 may be formed to surround the outer surface of the light emitting element 30. However, exemplary embodiments are not limited thereto.

The third insulating layer 53 may extend in the second direction DR2 between the first electrode branch portion 21B and the second electrode branch portion 22B in a plan view. For example, the third insulating layer 53 may have an island (or generally island) shape or a linear (or generally linear) shape in a plan view on the first insulating layer 51. According to an embodiment, the third insulating layer 53 may be disposed on the light emitting element 30.

The first contact electrode 26a and the second contact electrode 26b are disposed on the electrodes 21 and 22 and the third insulating layer 53, respectively. The first contact electrode 26a and the second contact electrode 26b may be spaced apart from each other on the third insulating layer 53. The third insulating layer 53 may insulate the first contact electrode 26a and the second contact electrode 26b from each other such that the first contact electrode 26a and the second contact electrode 26b do not directly contact each other.

The first contact electrode 26a may be in contact with the exposed region of the first electrode 21 on the first inner bank 41, and the second contact electrode 26b may be in contact with the exposed region of the second electrode 22 on the second inner bank 42. The first contact electrode 26a and the second contact electrode 26b may transmit electrical signals transmitted from the electrodes 21 and 22 to the light emitting element 30.

The contact electrode 26 may include a conductive material. For example, the contact electrode 26 may include ITO, IZO, ITZO, or aluminum (Al). However, exemplary embodiments are not limited thereto.

The passivation layer 55 may be disposed on the contact electrode 26 and the third insulating layer 53. The passivation layer 55 may function to protect members disposed on the first insulating layer 51 from external environment contaminants and/or conditions.

Each of the second insulating layer 52, the third insulating layer 53, and the passivation layer 55, described above, may include an inorganic insulating material or an organic insulating material. In an exemplary embodiment, each of the second insulating layer 52, the third insulating layer 53, and the passivation layer 55 may include an inorganic insulating material, such as silicon oxide ($SiO_x$), silicon nitride ($SiN_x$), silicon oxynitride ($SiO_xN_y$), aluminum oxide ($Al_2O_3$), aluminum nitride (AlN), etc. Further, each of the second insulating layer 52, the third insulating layer 53, and the passivation layer 55 may include an organic insulating material, such as acrylic resin, epoxy resin, phenol resin, polyamide resin, polyimide resin, unsaturated polyester resin, polyphenylene resin, polyphenylene sulfide resin, benzocyclobutene, cardo resin, siloxane resin, silsesquioxane resin, poly(methyl methacrylate), polycarbonate, poly(methyl methacrylate)-polycarbonate synthetic resin, etc. However, exemplary embodiments are not limited thereto.

Figure 7:
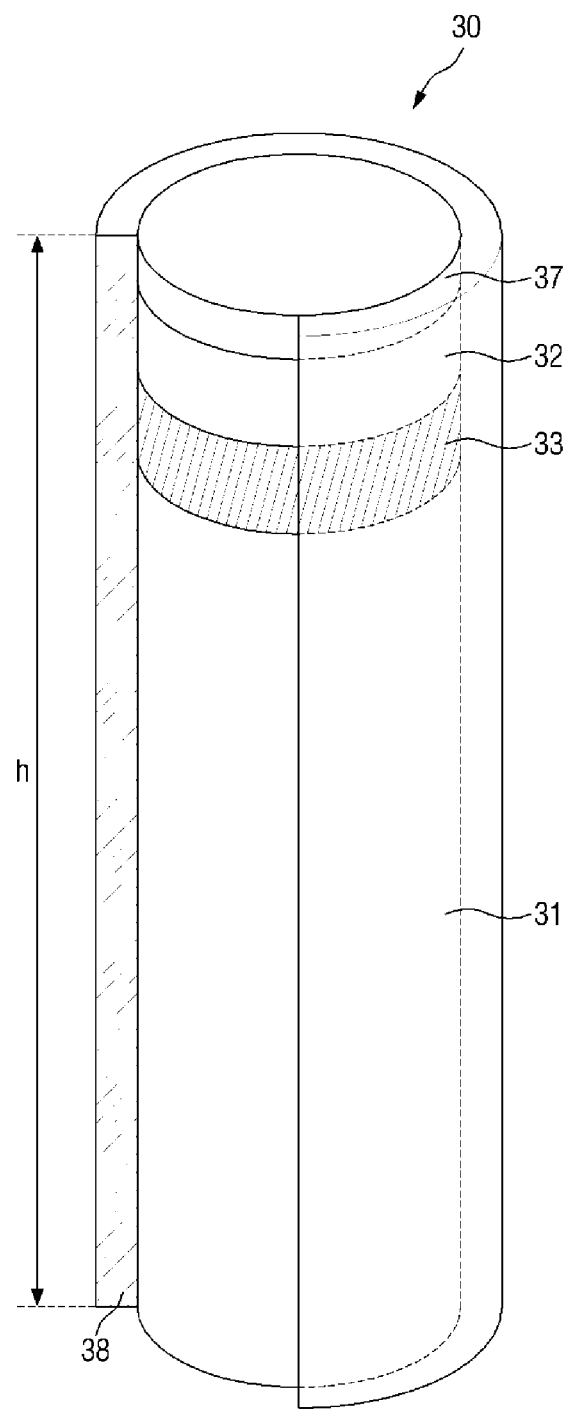
FIG. 7 is a schematic view of a light emitting element according to some exemplary embodiments.

FIG. 7 is a schematic view of a light emitting element according to some exemplary embodiments.

The light emitting element 30 may be a light emitting diode. For example, the light emitting element 30 may be an inorganic light emitting diode having a size of a micrometer or a nanometer and made of an inorganic material. When an electric field is formed between two electrodes facing each other in a specific direction, the inorganic light emitting diode may be aligned between the two electrodes. The light emitting element 30 may be aligned between the electrodes by an electric field formed on (or between) the two electrodes.

The light emitting element 30 according to an embodiment may have a shape extending in one direction. The light emitting element 30 may have a shape of a rod, a wire, a tube, or the like. In an exemplary embodiment, the light emitting element 30 may be cylindrical (or generally cylindrical) or rod (generally rod)-shaped. However, the shape of the light emitting element 30 is not limited thereto. The light emitting element 30 may have a shape of a cube (or generally a cube), a cuboid (or generally a cuboid), a polygonal column, such as a hexagonal (or generally hexagonal) column, or may have a shape extending in one direction and having a partially inclined outer surface. The plurality of semiconductors included in the light emitting element 30 to be described later may have a structure sequentially arranged or stacked in the one direction.

The light emitting element 30 may include a semiconductor layer doped with any conductive type (for example, p-type or n-type) impurities. The semiconductor layer may receive an electrical signal from an external power source, and may transmit (or convert) the electrical signal to light of a specific wavelength band.

Referring to FIG. 7, the light emitting element 30 may include a first semiconductor layer 31, a second semiconductor layer 32, an active layer 33, an electrode layer 37, and an insulating film 38.

The first semiconductor layer 31 may be an n-type semiconductor layer. For example, when the light emitting element 30 emits light of a blue wavelength band, the first semiconductor layer 31 may include a semiconductor material having a chemical formula of $Al_xGa_yIn1-x-yN$ ($0 \leq x \leq 1$, $0 \leq y \leq 1$, $0 \leq x+y \leq 1$). For example, the semiconductor material may be any one of AlGaInN, GaN, AlGaN, InGaN, AlN, and InN, each being doped with an n-type dopant. The first semiconductor layer 31 may be doped with an n-type dopant, and examples of the n-type dopant may include Si, Ge, and Sn. In an exemplary embodiment, the first semiconductor layer 31 may include n-GaN doped with n-type Si. The length of the first semiconductor layer 31 may have a range of 1.5 μm to 5 μm, but is not limited thereto.

The second semiconductor layer 32 is disposed on the active layer 33. The second semiconductor layer 32 may be a p-type semiconductor layer. For example, when the light emitting element 30 emits light of a blue or green wavelength band, the second semiconductor layer 32 may include a semiconductor material having a chemical formula of $Al_xGa_yIn1-x-yN$ ($0 \leq x \leq 1$, $0 \leq y \leq 1$, $0 \leq x+y \leq 1$). For example, the semiconductor material may be any one of AlGaInN, GaN, AlGaN, InGaN, AlN, and InN, each being doped with a p-type dopant. The second semiconductor layer 32 may be doped with a p-type dopant, and examples of the p-type dopant may include Mg, Zn, Ca, Se, and Ba. In an exemplary embodiment, the second semiconductor layer 32 may include p-GaN doped with p-type Mg. The length of the second semiconductor layer 32 may have a range of 0.05 μm to 0.10 μm, but is not limited thereto.

Although it is shown in FIG. 7 that the first semiconductor layer 31 and the second semiconductor layer 32 are formed as one layer, exemplary embodiments are not limited thereto. In some embodiments, depending on the material of the active layer 33, the first semiconductor layer 31 and the second semiconductor layer 32 may further include a greater number of layers, such as a clad layer or a tensile strain barrier reducing (TSBR) layer. Details thereof will be described later with reference to other drawings.

The active layer 33 is disposed between the first semiconductor layer 31 and the second semiconductor layer 32. The active layer 33 may include a material having a single or multiple quantum well structure. When the active layer 33 includes a material having a multiple quantum well structure, the multiple quantum well structure may be a structure in which quantum layers and well layers are alternately stacked. The active layer 33 may emit light by the combination of electron-hole pairs according to an electrical signal applied through the first semiconductor layer 31 and the second semiconductor layer 32. For example, when the active layer 33 emits light of a blue wavelength band, the active layer 33 may include a material, such as AlGaN or AlGaInN. For instance, when the active layer 33 has a multiple quantum well structure in which quantum layers and well layers are alternately stacked with each other, the quantum well layer may include a material, such as AlGaN or AlGaInN, and the well layer may include a material, such as GaN or AlInN. In an exemplary embodiment, since the active layer 33 may include a quantum layer containing AlGaInN and a well layer containing AlInN, as described above, the active layer 33 may emit blue light having a central wavelength band in a range of 450 nm to 495 nm.

However, exemplary embodiments are not limited thereto. The active layer 33 may have a structure in which semiconductor materials having large (or high) band gap energy and semiconductor materials having small (or low) band gap energy are alternately stacked with each other, and may include other group III to group V semiconductor materials depending on the wavelength band of emitted light. The light emitted by the active layer 33 is not limited to light of a blue wavelength band, and in some cases, the active layer 33 may emit light of a red wavelength band or light of a green wavelength band. The length of the active layer 33 may have a range of 0.05 μm to 0.10 μm, but is not limited thereto.

Light emitted from the active layer 33 may be emitted to both side surfaces as well as longitudinal outer surface of the light emitting element 30. Light emitted from the active layer 33 is not limited to one direction in directionality.

The electrode layer 37 may be an ohmic contact electrode. However, exemplary embodiments are not limited thereto, and the electrode layer 37 may be a Schottky contact electrode. The light emitting element 30 may include at least one electrode layer 37. Although it is shown in FIG. 7 that the light emitting element 30 includes one electrode layer 37, exemplary embodiments are not limited thereto. In some cases, the light emitting element 30 may include a greater number of electrode layers 37, or may be omitted. Details of the light emitting element 30 to be described later may be equally applied even if the number of the electrode layers 37 is different or the light emitting element 30 includes or further includes other structures.

When the light emitting element 30 is electrically connected to the electrode or the contact electrode in the first display substrate 100 according to an embodiment, the electrode layer 37 may reduce resistance between the light emitting element 30 and the electrode or the contact electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin-zinc oxide (ITZO). Further, the electrode layer 37 may include a semiconductor material doped with n-type or p-type impurities. The electrode layer 37 may include the same material and may include different materials, but exemplary embodiments are not limited thereto.

The insulating film 38 is disposed to surround the outer surfaces of the plurality of semiconductor layers and the plurality of electrode layers. In an exemplary embodiment, the insulating film 38 may be disposed to surround at least the outer surface of the active layer 33, and may extend in one direction in which the light emitting element 30 extends. The insulating film 38 may function to protect the aforementioned members. For example, the insulating film 38 may be formed to surround side surfaces of the members, but may be formed to expose both ends (e.g., distal ends) of the light emitting element 30 in the length direction.

Although it is shown in FIG. 7 that the insulating film 38 is formed to extend in the length direction of the light emitting element 30 to cover the side surface of the electrode layer 37 from the first semiconductor layer 31, exemplary embodiments are not limited thereto. The insulating film 38 may cover only the outer surfaces of some of the semiconductor layers including the active layer 33, or may cover a portion of the outer surface of the electrode layer 37 to partially expose the outer surface of the electrode layer 37. Further, the insulating film 38 may be formed to have a rounded (or generally rounded) upper surface in a cross-section in an area adjacent to at least one end of the light emitting element 30.

The thickness of the insulating film 38 may be in a range from 10 nm to 1.0 μm, but is not limited thereto. For example, the thickness of the insulating film 38 may be about 40 nm.

The insulating film 38 may include materials having insulating properties, for example, at least one of silicon oxide ($SiO_x$), silicon nitride ($SiN_x$), silicon oxynitride ($SiO_xN_y$), aluminum nitride (AlN), and aluminum oxide ($Al_2O_3$). Thus, the insulating film 38 may prevent an electrical short that may occur when the active layer 33 is in direct contact with the electrode through which the electrical signal is transmitted to the light emitting element 30. Further, the insulating film 38 may prevent the deterioration of light emission efficiency because it can protect the outer surface of the light emitting element 30 including the active layer 33.

In some embodiments, the outer surface of the insulating film 38 may be surface-treated. When manufacturing the first display substrate 100, the light emitting elements 30 may be sprayed or aligned on the electrode in a state where the light emitting elements 30 are dispersed in a predetermined ink (or solution). To maintain a state where the light emitting elements 30 are dispersed in the ink without being aggregated with other adjacent light emitting elements 30, the surface of the insulating film 38 may be hydrophobically or hydrophilically treated.

The light emitting element 30 may have a length h of 1 μm to 10 μm, such as 2 μm to 6 μm, e.g., 3 μm to 5 μm. The light emitting element 30 may have a diameter ranging from 300 nm to 700 nm, and may have an aspect ratio of 1.2 to 100. However, exemplary embodiments are not limited thereto, and the plurality of light emitting elements 30 included in the first display substrate 100 may have different diameters according to the composition difference of the active layer 33. In some embodiments, the diameter of the light emitting element 30 may be about 500 nm.

Hereinafter, the second display substrate 300 will be described with reference to various drawings.

Figure 8:
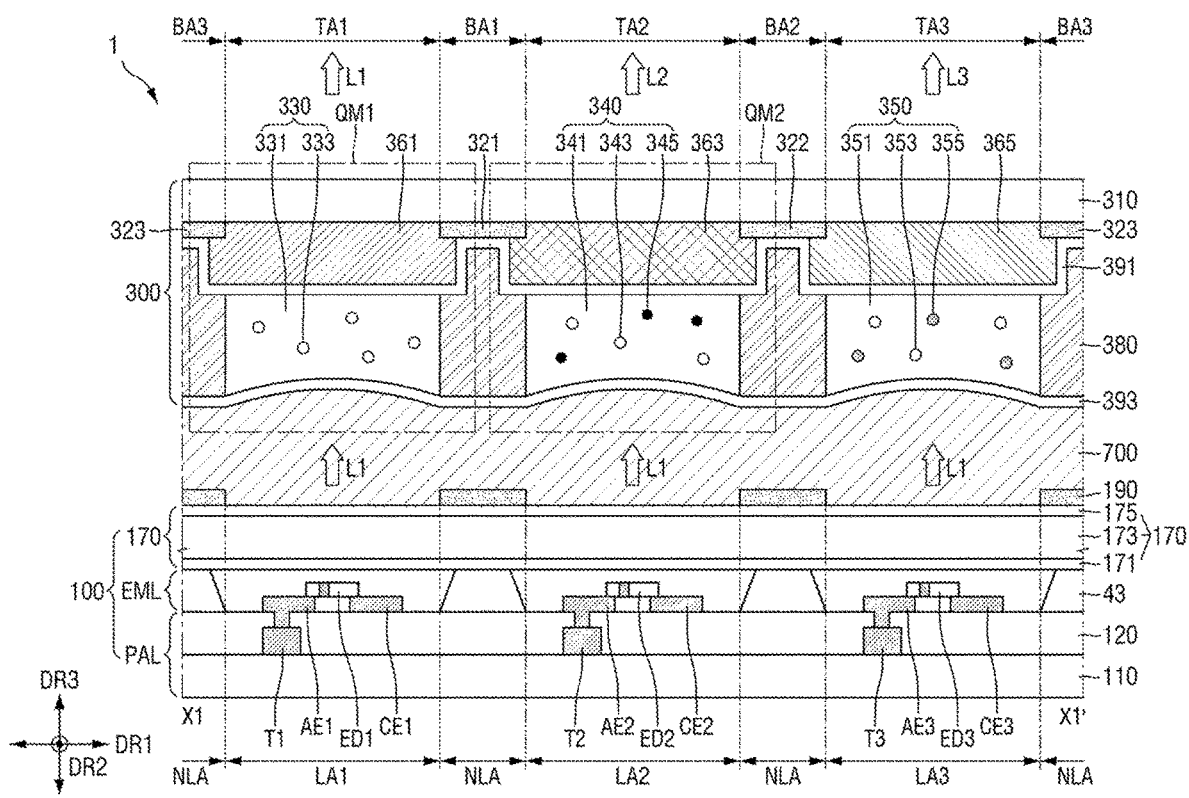
FIG. 8 is a cross-sectional view of the display device taken along sectional line X1-X1' in FIGS. 3 and 4 according to some exemplary embodiments.

FIG. 8 is a cross-sectional view of the display device taken along sectional line X1-X1' in FIGS. 3 and 4 according to some exemplary embodiments.

FIG. 8 shows a cross-section intersecting the first light emitting area LA1, second light emitting area LA2, and third light emitting area LA3 of the first display substrate 100 and the first light transmitting area TA1, second light transmitting area TA2, and third light transmitting area TA3 of the second display substrate 300.

Referring to FIG. 8 in addition to FIGS. 3 and 4, as described above, the display device 1 includes the first display substrate 100 and the second display substrate 300, and may further include the filler 700 located between the first display substrate 100 and the second display substrate 300.

In an embodiment, the first display substrate 100 may include a circuit element layer PAL and a light emitting element layer EML. As described with reference to FIGS. 5 to 7, the light emitting element layer EML may include a plurality of electrodes 21 and 22 and a plurality of light emitting elements 30. Although it is shown in the drawings that one first electrode, one second electrode, and one light emitting element are disposed in each light emitting area LA or sub-pixel PXn, exemplary embodiments are not limited thereto. In addition, the first display substrate 100 is not limited to that described above with reference to FIGS. 5 to 7, and may be modified in various structures. In this regard, in FIG. 8, new reference numerals are given to a first electrode AE, a second electrode CE, and a light emitting element ED, for convenience of explanation. However, descriptions thereof may be the same as those described above with reference to FIGS. 5 to 7 even if not mentioned otherwise. Hereinafter, a detailed description of the light emitting element layer EML will be omitted.

The circuit element layer PAL of the first display substrate 100 may include a first base 110 and a plurality of switching elements T1, T2, and T3 disposed on the first base 110.

The first base 110 may be made of a light transmitting material. In some embodiments, the first base 110 may be a glass substrate or a plastic substrate. When the first base 110 is a plastic substrate, the first base 110 may have flexibility. In some embodiments, the first base 110 may further include a separate layer, for example, a buffer layer or an insulating layer, disposed on the glass substrate or the plastic substrate. In some embodiments, a plurality of light emitting areas LA1, LA2, LA3, LA4, LA5, and LA6 and a non-light emitting area NLA may be defined in, on, or in association with the first base 110.

The switching elements T1, T2, and T3 may be located on the first base 110. In some embodiments, the first switching element T1 may be located in the first light emitting area LA1, the second switching element T2 may be located in the second light emitting area LA2, and the third switching element T3 may be located in the third light emitting area LA3. However, exemplary embodiments are not limited thereto. In some embodiments, at least one of the first switching element T1, the second switching element T2, and the third switching element T3 may be located in the non-light emitting area NLA.

In some embodiments, each of the first switching element T1, the second switching element T2, and the third switching element T3 may be a thin film transistor including polysilicone or a thin film transistor including an oxide semiconductor.

According to some exemplary embodiments, a plurality of signal lines (for example, a gate line, a data line, and a power supply line) for transmitting signals to the respective switching elements may be further disposed on the first base 110.

A buffer layer (see, e.g., FIG. 14) 130 may be located on the first switching element T1, the second switching element T2, and the third switching element T3. In some embodiments, a via layer 120 may be a planarization film. In some embodiments, the via layer 120 may be formed of an organic film. Illustratively, the via layer 120 may include at least one of an acrylic resin, an epoxy resin, an imide resin, and an ester resin. In some embodiments, the via layer 120 may include a positive photosensitive material or a negative photosensitive material.

The light emitting element layer EML may be disposed on the via layer 120. For example, a first electrode AE, a second electrode CE, a light emitting element ED, and an outer bank 43 may be disposed on the via layer 120. The outer bank 43 may be disposed corresponding to the non-light emitting area NLA of the first display substrate 100, and the first electrode AE, the second electrode CE, and the light emitting element ED may be disposed corresponding to the respective light emitting areas LA. The first electrodes AE1, AE2, AE3, the second electrodes CE1, CE2, and CE3, and the light emitting elements ED1, ED2, and ED3 may be disposed in the first light emitting area LA1, the second light emitting area LA2, and the third light emitting area LA3, respectively. Since a detailed description thereof is the same as that described above, it will be omitted.

A thin film encapsulation layer 170 is disposed on the light emitting element layer EML. The thin film encapsulation layer 170 is commonly disposed in the first light emitting area LA1, the second light emitting area LA2, the third light emitting area LA3, and the non-light emitting area NLA. In some embodiments, the thin film encapsulation layer 170 directly covers the passivation layer 55 of the light emitting element layer EML. In some embodiments, the thin film encapsulation layer 170 may be disposed directly on the first electrode AE, the second electrode CE, and the light emitting device ED, where the passivation layer 55 is not disposed.

In some embodiments, the thin film encapsulation layer 170 may include a first inorganic encapsulation layer 171, an organic encapsulation layer 173, and a second inorganic encapsulation layer 175 that are sequentially stacked on the light emitting element layer EML.

In some embodiments, each of the first inorganic encapsulation layer 171 and the second inorganic encapsulation layer 175 may include at least one of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), and lithium fluoride, or the like.

In some embodiments, the organic encapsulation layer 173 may include at least one of acrylic resin, methacrylic resin, polyisoprene, vinyl resin, epoxy resin, urethane resin, cellulose resin, and perylene resin, or the like.

However, the structure of the thin film encapsulation layer 170 is not limited to the above-described example, and the laminate structure of the thin film encapsulation layer 170 may be variously modified.

A panel light blocking member 190 may be located on the thin film encapsulation layer 170. The panel light blocking member 190 may be located on the thin film encapsulation layer 170, and located in the non-light emitting area NLA. The panel light blocking member 190 may prevent light from invading between adjacent light emitting areas to prevent color mixture, thereby further improving color reproducibility.

In some embodiments, the panel light blocking member 190 may be disposed in the non-light emitting area NLA to surround each of the light emitting areas LA1, LA2, LA3, LA4, LA5, and LA6 on the plane.

The panel light blocking member 190 may include an organic light blocking material, and may be formed by coating and exposure processes of the organic light blocking material.

The filler 700 may be disposed on the panel light blocking member 190, and the second display substrate 300 is disposed on the filler 700. Hereinafter, the second display substrate 300 according to some exemplary embodiments will be described in more detail with reference to various drawings.

Figure 9:
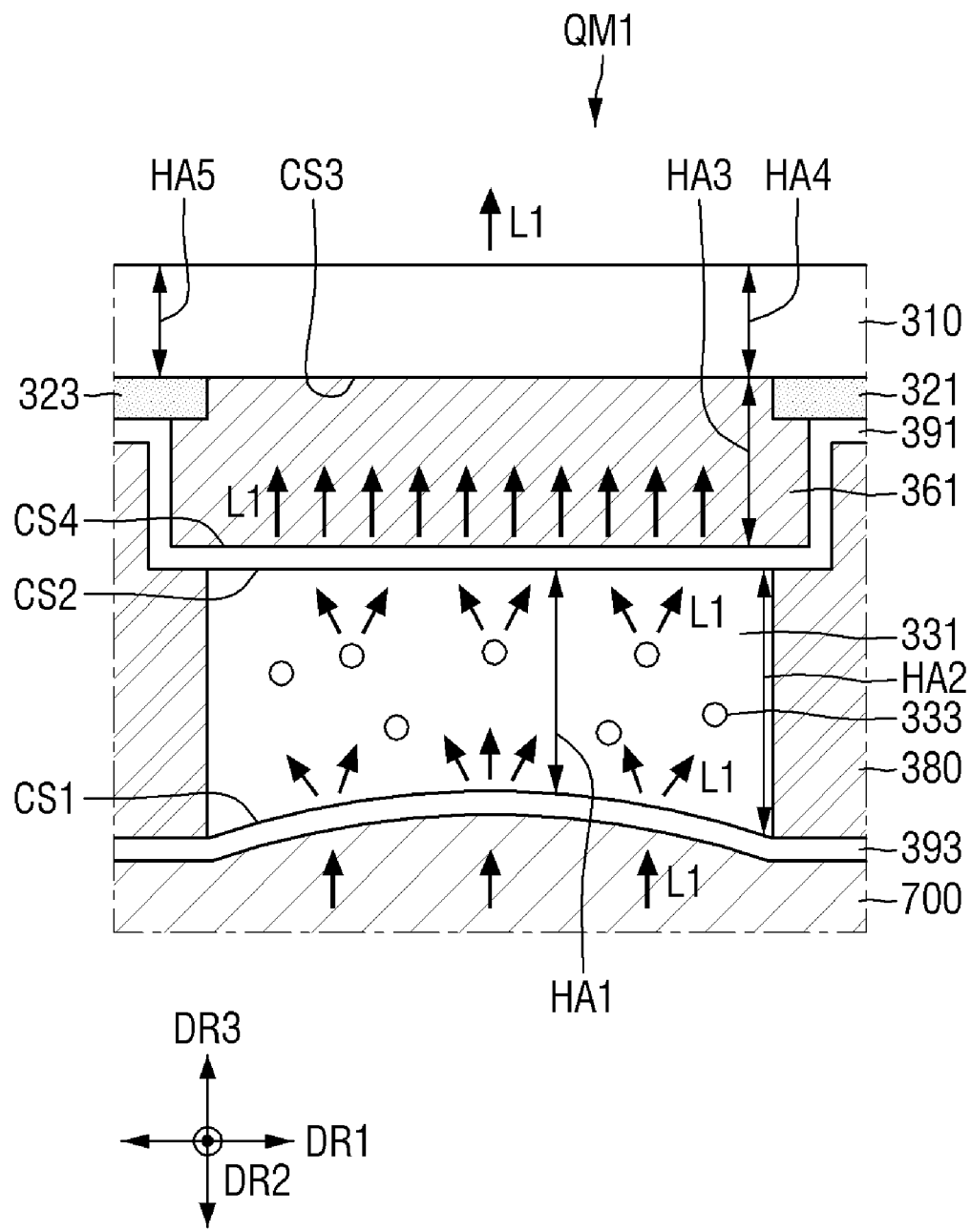
FIG. 9 is an enlarged cross-sectional view of portion QM1 in FIG. 8 according to some exemplary embodiments.
Figure 10:
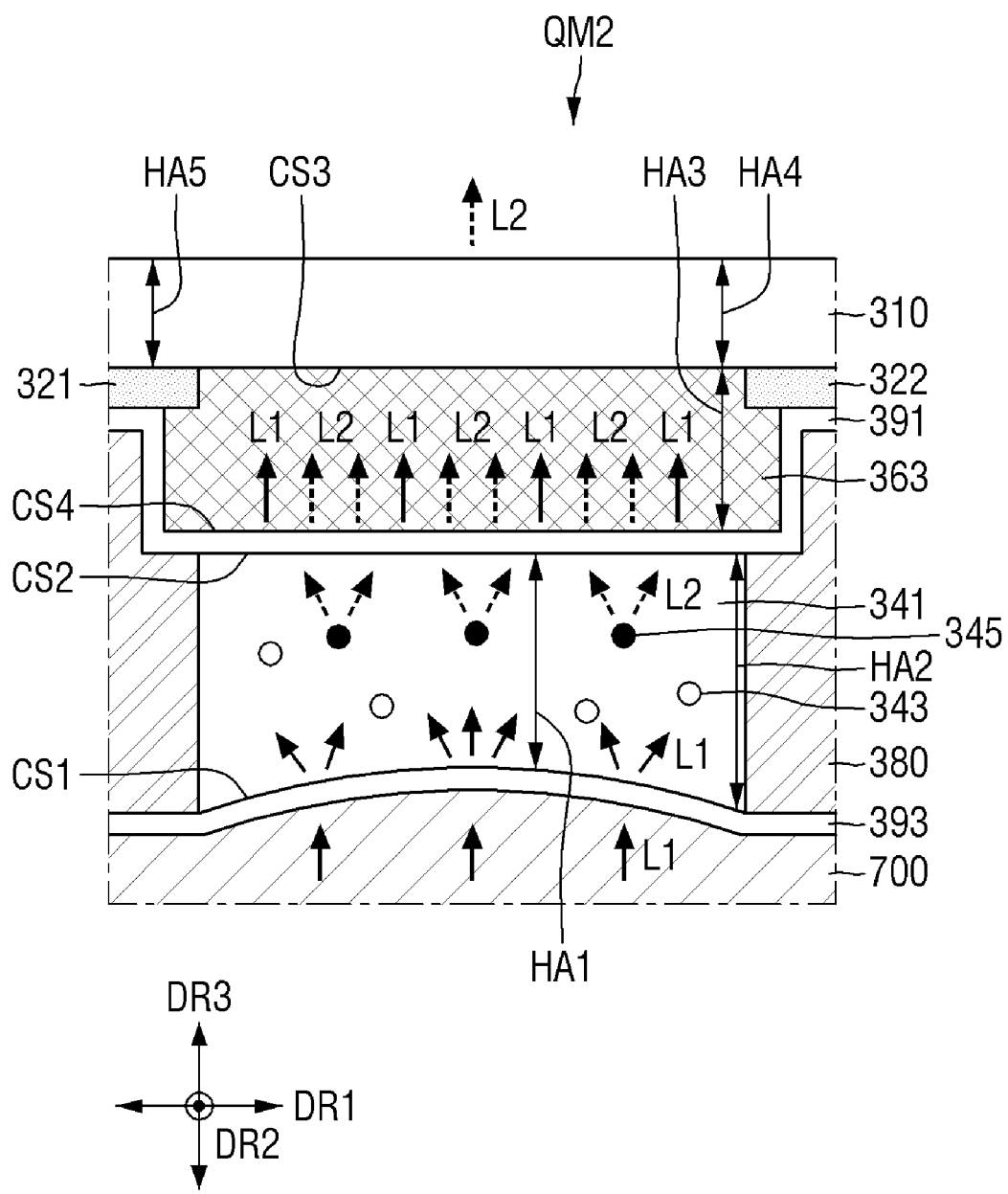
FIG. 10 is an enlarged cross-sectional view of portion QM2 in FIG. 8 according to some exemplary embodiments.
Figure 11:
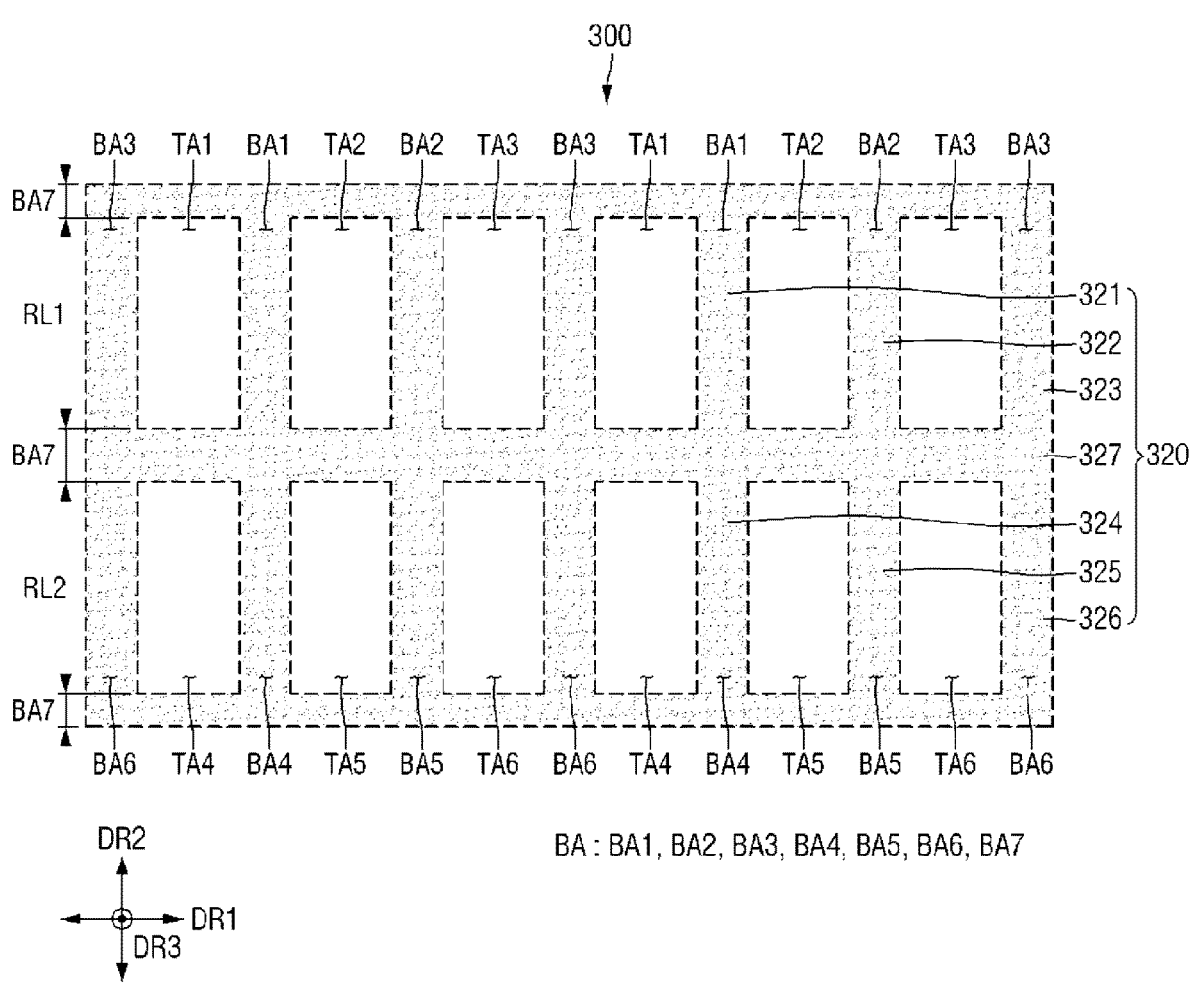
FIG. 11 is a schematic plan view showing an arrangement structure of partition walls in a second display substrate according to some exemplary embodiments.
Figure 12:
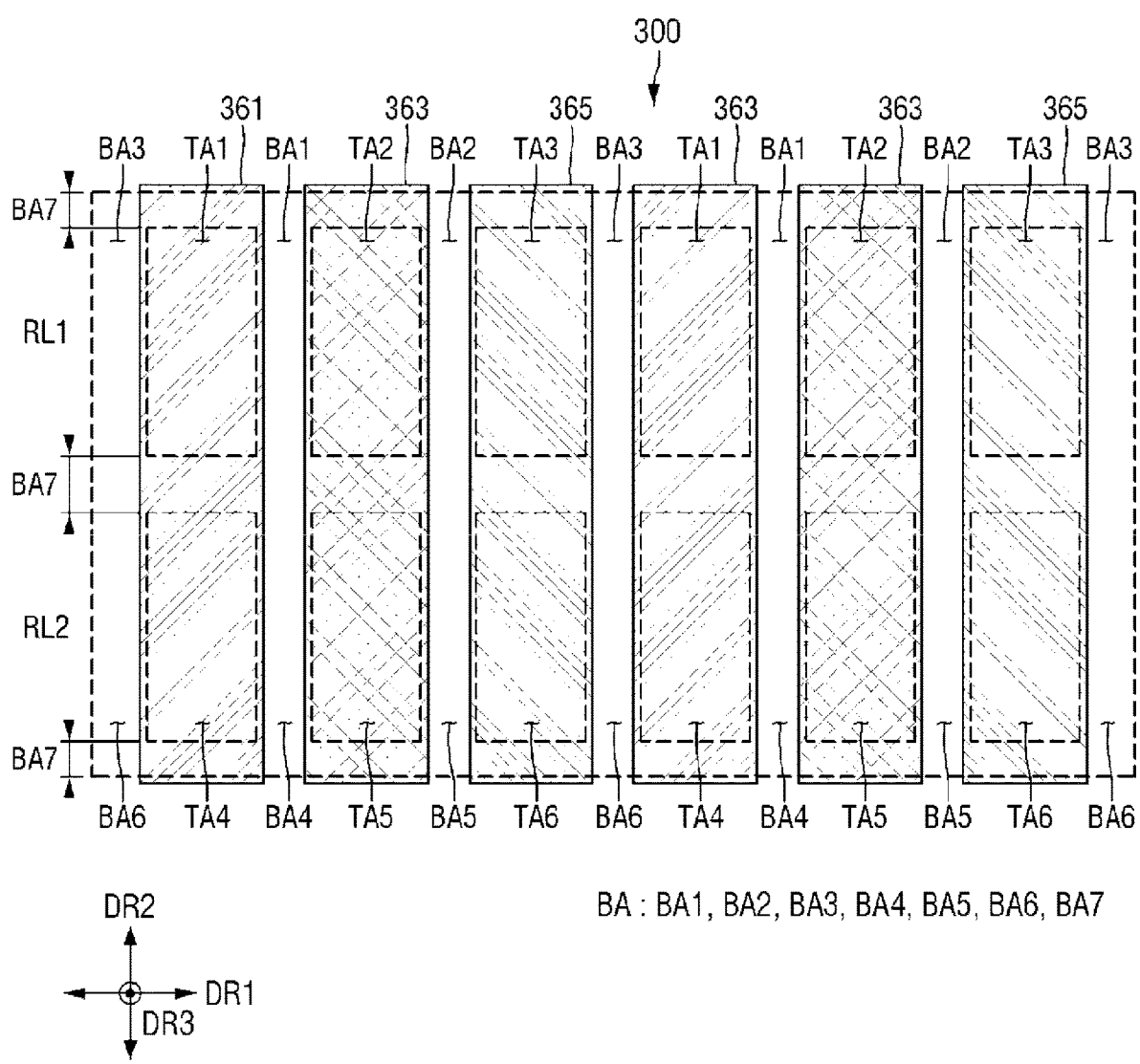
FIG. 12 is a schematic plan view showing an arrangement structure of a first color filter, a second color filter, and a third color filter in a second display substrate according to some exemplary embodiments.
Figure 13:
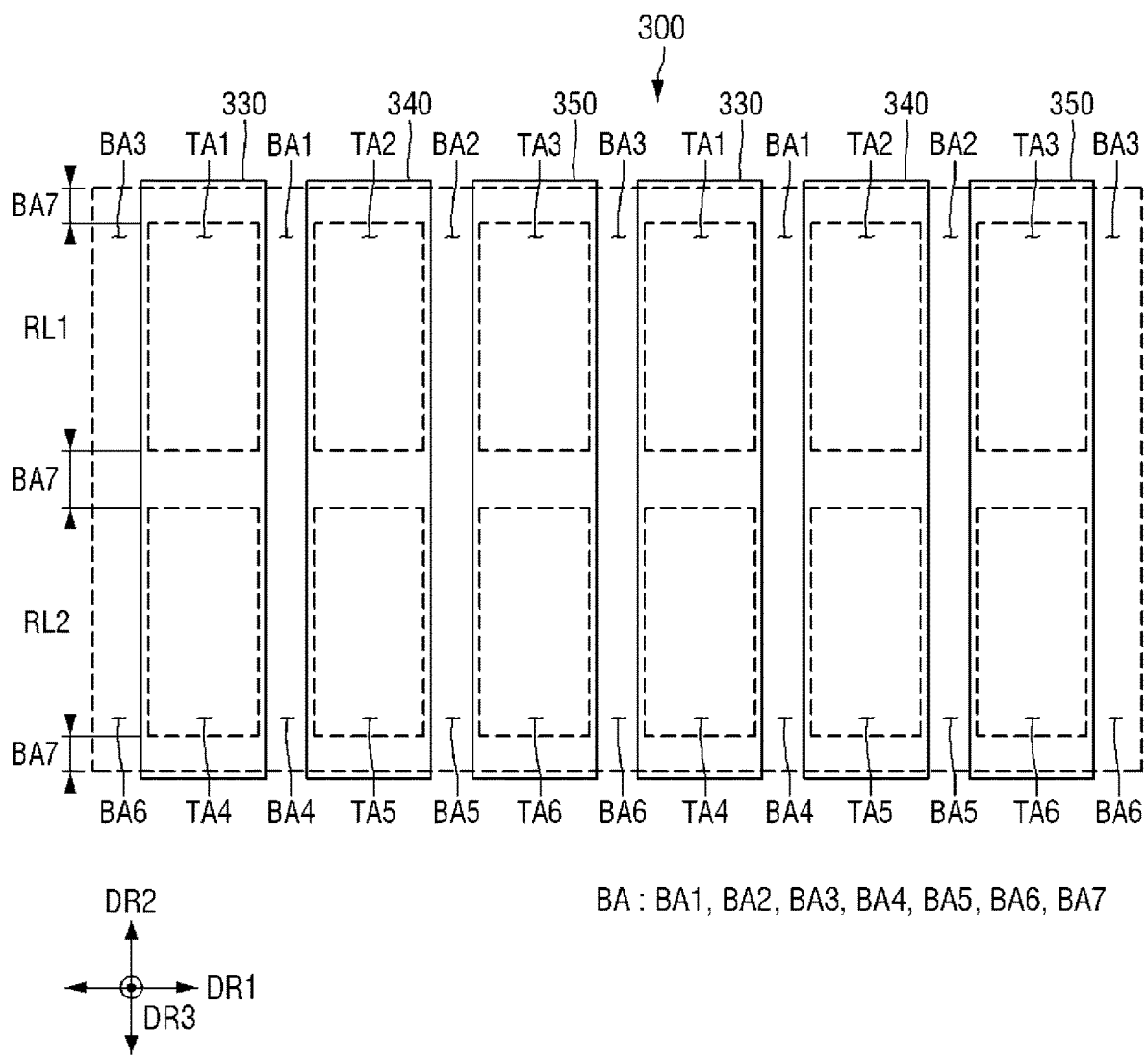
FIG. 13 is a schematic plan view showing an arrangement structure of a first wavelength conversion pattern, a second wavelength conversion pattern, and a light transmission pattern in a second display substrate according to some exemplary embodiments.
Figure 14:
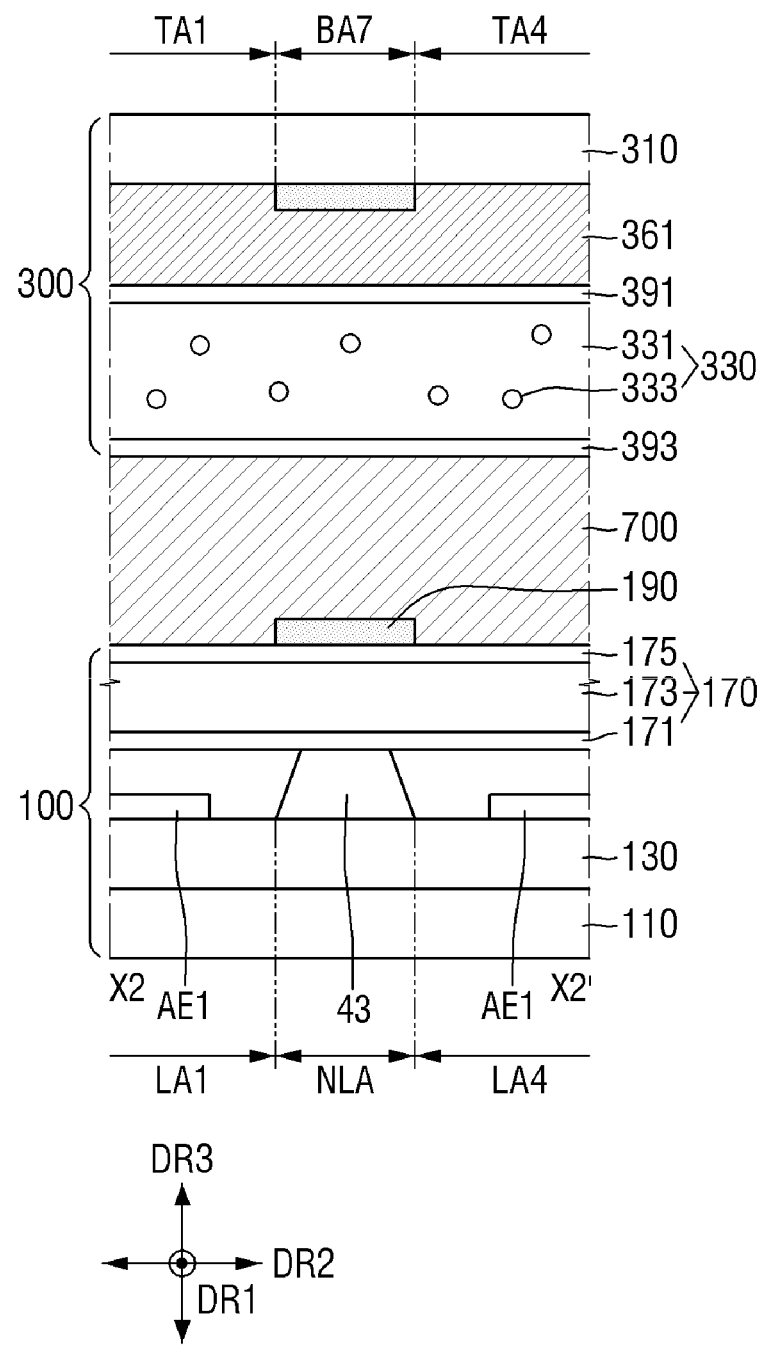
FIG. 14 is a cross-sectional view of the display device taken along sectional line X2-X2' in FIGS. 3 and 4 according to some exemplary embodiments.
Figure 15:
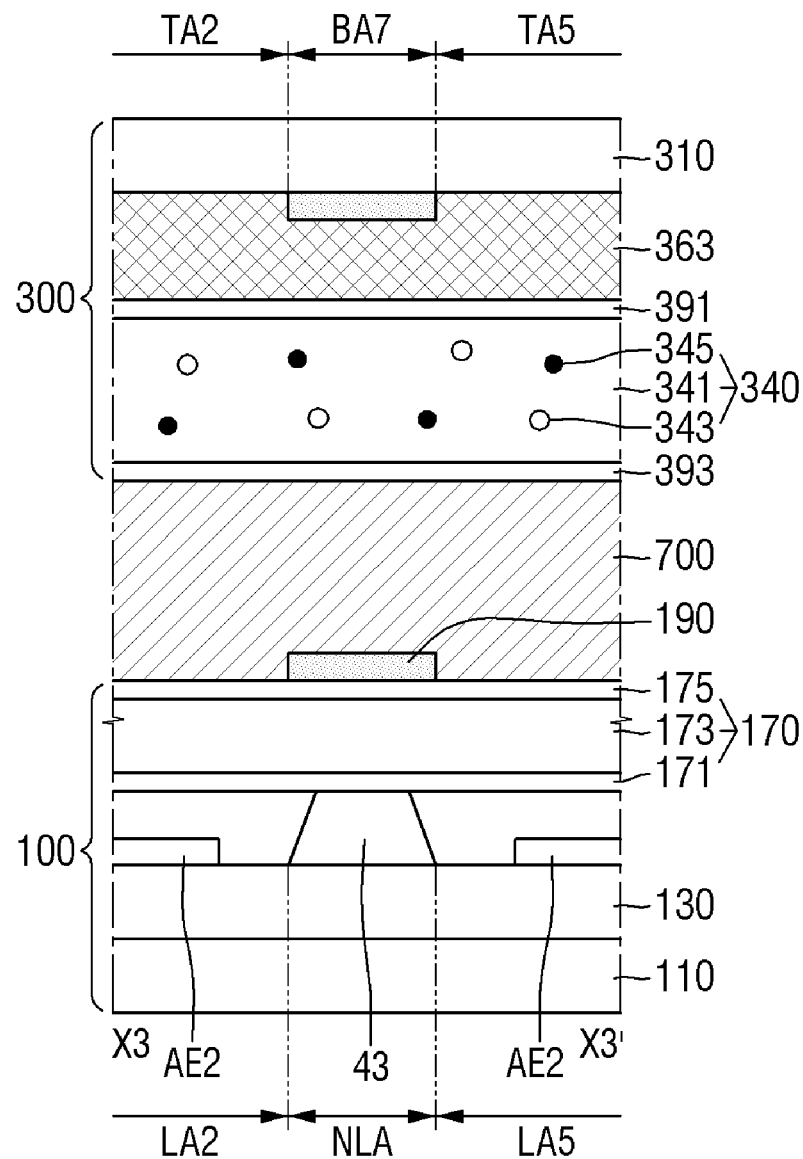
FIG. 15 is a cross-sectional view of the display device taken along sectional line X3-X3' in FIGS. 3 and 4 according to some exemplary embodiments.
Figure 16:
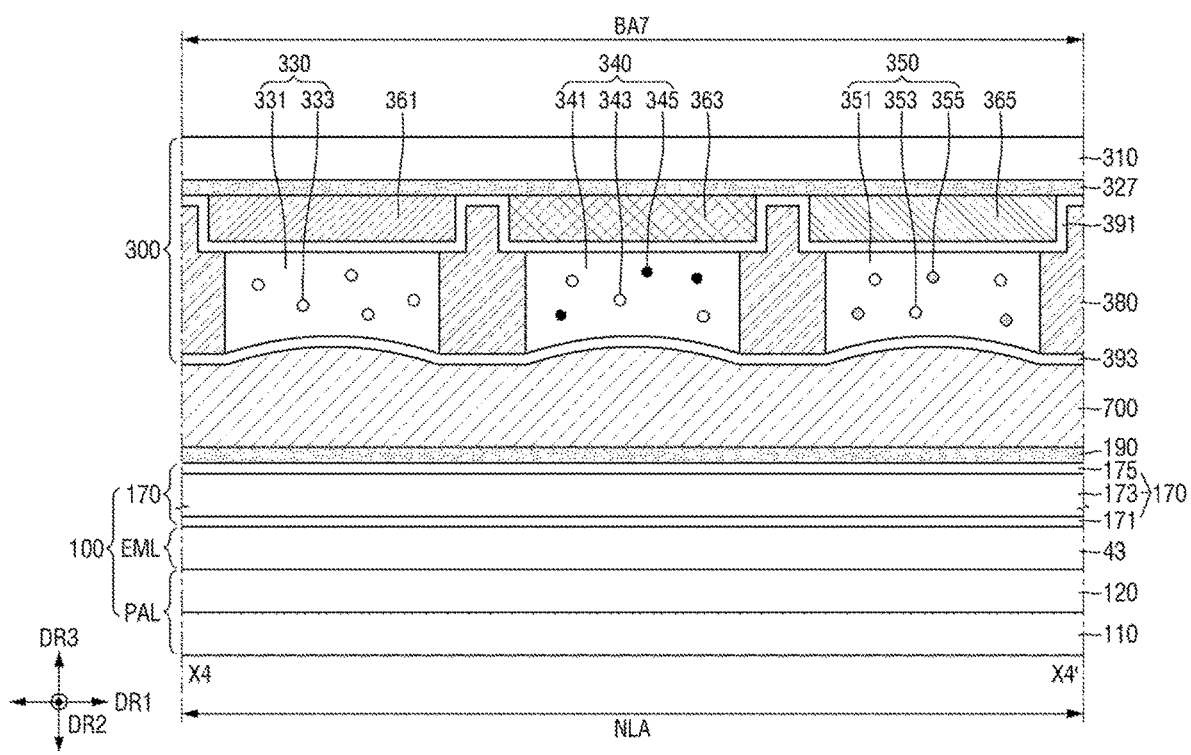
FIG. 16 is a cross-sectional view of the display device taken along sectional line X4-X4' in FIGS. 3 and 4 according to some exemplary embodiments.

FIG. 9 is an enlarged cross-sectional view of portion QM1 in FIG. 8 according to some exemplary embodiments. FIG. 10 is an enlarged cross-sectional view of portion QM2 in FIG. 8 according to some exemplary embodiments. FIG. 11 is a schematic plan view showing an arrangement structure of partition walls in a second display substrate according to some exemplary embodiments. FIG. 12 is a schematic plan view showing an arrangement structure of a first color filter, a second color filter, and a third color filter in a second display substrate according to some exemplary embodiments. FIG. 13 is a schematic plan view showing an arrangement structure of a first wavelength conversion pattern, a second wavelength conversion pattern, and a light transmission pattern in a second display substrate according to some exemplary embodiments. FIG. 14 is a cross-sectional view of the display device taken along sectional line X2-X2' in FIGS. 3 and 4 according to some exemplary embodiments. FIG. 15 is a cross-sectional view of the display device taken along sectional line X3-X3' in FIGS. 3 and 4 according to some exemplary embodiments. FIG. 16 is a cross-sectional view of the display device taken along sectional line X4-X4' in FIGS. 3 and 4 according to some exemplary embodiments.

Referring to FIGS. 9 to 16 in addition to FIG. 8, the second display substrate 300 may include a second base 310, a plurality of color filters 361, 363 and 365, a partition wall 380, a plurality of wavelength conversion patterns 350 and 340, and a light transmission pattern 330.

The second base 310 may be made of a light transmitting material. In some embodiments, the second base 310 may include a glass substrate or a plastic substrate. In some embodiments, the second base 310 may further include a separate layer, for example, an insulating layer, such as an inorganic film. As shown in FIG. 4, a plurality of light transmitting areas TA1, TA2, TA3, TA4, TA5, and TA6 and a light blocking area BA may be defined in, on, or in association with the second base 310. A detailed description thereof will be omitted.

Color filters 361, 363, and 365 and a light blocking member 320 may be disposed on one surface of the second base 310 facing the first display substrate 100.

The color filters 361, 363, and 365 may include a first color filter 361, a second color filter 363, and a third color filter 365.

The first color filter 361 may be located on one surface of the second base 310, and may be located in the first light transmitting area TA1 and the fourth light transmitting area TA4. In some embodiments, the first color filter 361 located in the first light transmitting area TA1 and the first color filter 361 located in the fourth light transmitting area TA4 may be connected to each other along the second direction DR2. For instance, as shown in FIG. 12, the first color filter 361 located in the first row RT1 may extend in the second direction DR2 to be connected to the first color filter 361 located in the second row RT2. A seventh light blocking member 327 and a partition wall 380, which will be described later, may be disposed in an area where the first color filter 361 extends in the second direction DR2 to overlap the seventh light blocking area BA7. The seventh light blocking member 327 and the partition wall 380 may extend from the seventh light blocking area BA7 in the first direction DR1 to form the first light transmitting area TA1 and the fourth light transmitting area TA4 in the second direction DR2.

However, exemplary embodiments are not limited thereto. In some embodiments, the first color filter 361 located in the first light transmitting area TA1 and the first color filter 361 located in the fourth light transmitting area TA4 may be spaced apart from each other. For example, the first color filter 361 may be disposed in a stripe shape extending in the second direction DR2 or in island shapes spaced apart in the second direction DR2.

The first color filter 361 may selectively transmit light of the first color (for example, blue light), and may block or absorb light of the second color (for example, green light) and light of the third color (for example, red light). In some embodiments, the first color filter 361 may be a blue color filter, and may include a blue colorant, such as a blue dye or a blue pigment. It is also contemplated that a colorant may be understood as a concept including both a dye and a pigment.

Similarly to the first color filter 361, the second color filter 363 and the third color filter 365 may also be located on one surface of the second base 310. The second color filter 363 may be located in the second light transmitting area TA2 and the fifth light transmitting area TA5, and the third color filter 365 may be located in the third light transmitting area TA3 and the sixth light transmitting area TA6. In some embodiments, since the second color filter 363 and the third color filter 365 extend in the second direction DR2, the second color filter 363 and third color filter 365 located in the first row RT1 may be connected to the second color filter 363 and third color filter 365 located in the second row RT2. The seventh light blocking member 327 and the partition wall 380, which will be described later, may be located in an area where the second color filter 363 and the third color filter 365 overlap the seventh light blocking area BA7. However, exemplary embodiments are not limited thereto. In some embodiments, the second color filter 363 and the third color filter 365 may be spaced apart from each other between the first row RT1 and the second row RT2. For instance, the second color filter 363 and the third color filter 365 may be disposed in a stripe shape extending in the second direction DR2 or in island shapes spaced in the second direction DR2.

The second color filter 363 may selectively transmit light of the second color (for example, green light), and may block or absorb light of the first color (for example, blue light) and the light of the third color (for example, red light). In some embodiments, the second color filter 363 may be a green color filter, and may include a green colorant, such as at least one of a green dye and a green pigment.

The third color filter 365 may selectively transmit light of the third color (for example, red light), and may block or absorb light of the second color (for example, green light) and light of the first color (for example, blue light). In some embodiments, the third color filter 365 may be a red color filter, and may include a red colorant, such as at least one of a red dye and a red pigment.

According to an embodiment, the first color filter 361, the second color filter 363, and the third color filter 365 may be spaced apart from each other. Referring to FIGS. 8 and 12, the first color filter 361, the second color filter 363, and the third color filter 365 may extend in the second direction DR2, but may be arranged to be spaced apart from each other in the first direction DR1. The first color filter 361, the second color filter 363, and the third color filter 365 may extend in the second direction DR2 in the first light transmitting area TA1, the second light transmitting area TA2, and the third light transmitting area TA3, respectively. In some embodiments, each of the first color filter 361, the second color filter 363, and the third color filter 365 may be formed in a stripe shape extending along the second direction DR2, and may cross the seventh light blocking area BA7 between the first row RT1 and the second row RT2.

However, exemplary embodiments are not limited thereto. In some embodiments, at least one of the first color filter 361, the second color filter 363, and the third color filter 365 may be respectively disposed to be spaced apart from the seventh light blocking area BA7 between the first row RT1 and the second row RT2 along the second direction DR2. For example, at least one of the first color filter 361, the second color filter 363, and the third color filter 365 may be formed in an island shape. In some embodiments, the first color filter 361, the second color filter 363, and the third color filter 365 may be disposed to overlap each other. In this case, the lower surface of any one color filter may be in contact with the upper surface of another color filter. A description of such a configuration will be described later.

As described above, since the first light transmitting area TA1, the second light transmitting area TA2, and the third light transmitting area TA3 may have the same width as each other, in some embodiments, the first color filter 361, the second color filter 363, and the third color filter 365 may also have the same width as each other. Since the description thereof has been described above with respect to the light transmitting area TA, a detailed description thereof will be omitted. The first light blocking area BA1, the second light blocking area BA2, and the third light blocking area BA3 may be disposed in an area between the first color filter 361, the second color filter 363, and the third color filter 365, which are spaced apart from each other. The light blocking member 320 and the partition wall 380, which will be described later, may be disposed in the light blocking area BA.

The light blocking member 320 may be disposed on one surface of the second base 310 facing the first display substrate 100. The light blocking member 320 may be disposed in the light blocking area BA to block the transmission of light. The light blocking member 320 may include an organic light blocking material, and may be formed by coating and exposure processes of the organic light blocking material. In some embodiments, the light blocking member 320 may be disposed in a planar lattice pattern as shown in FIG. 11. The light blocking member 320 may be disposed in the light blocking area BA to overlap the non-light emitting area NLA. However, exemplary embodiments are not limited thereto.

As described above, external light may cause a problem of distorting the color reproducibility of the color conversion panel. However, when the light blocking member 320 is located on the second base 310 according to some embodiments, at least a portion of external light is absorbed by the light blocking member 320. Therefore, color distortion by external light reflection may be reduced. In some embodiments, the light blocking member 320 may prevent light from invading between adjacent light transmitting areas to prevent color mixture, thereby further improving color reproducibility.

The light blocking member 320 may be disposed to overlap the light blocking area BA. As shown in FIGS. 8 and 11, the light blocking member 320 may extend in the first direction DR1 and the second direction DR2 on the light blocking area BA. The light blocking member 320 may include a first light blocking member 321 disposed in the first light blocking area BA1, a second light blocking member 322 disposed in the second light blocking area BA2, a third light blocking member 323 disposed in the third light blocking area BA3, a fourth light blocking member 324 disposed in the fourth light blocking area BA4, a fifth light blocking member 325 disposed in the fifth light blocking area BA5, a sixth light blocking member 326 disposed in the sixth light blocking area BA6, and a seventh light blocking member 327 disposed in the seventh light blocking area BA7. In some embodiments, the first light blocking member 321, the second light blocking member 322, and the third light blocking member 323 may extend in the second direction DR2 to be connected to the seventh light blocking member 327, and the fourth light blocking member 324, the fifth light blocking member 325, and the sixth light blocking member 326 may also extend in the second direction DR2 to be connected to the seventh light blocking member 327.

The light blocking member 320 may be disposed to surround the first light transmitting area TA1, the second light transmitting area TA2, the third light transmitting area TA3, the fourth light transmitting area TA4, the fifth light transmitting area TA5, and the sixth transmitting area TA6. Accordingly, the light blocking member 320 may be disposed between the color filters 361, 363, and 365 such that both sides thereof may be in contact with the color filters 361, 363, and 365, respectively. In a process of manufacturing the second display substrate 300, the light blocking member 320 may be formed on the second base 310 before the color filters 361, 363, and 365 are formed. Accordingly, as shown in FIG. 8, the first color filter 361 may be disposed on one side of the first light blocking member 321, and the second color filter 363 may be disposed on the other side thereof. Similarly, the second color filter 363 may disposed on one side of the second light blocking member 322, and the third color filter 365 may be disposed on the other side thereof. Further, the third color filter 365 may be disposed on one side of the third light blocking member 323, and the first color filter 361 may be disposed on the other side thereof. The plurality of color filters 361, 363, and 365 may be disposed to be spaced apart from each other on the light blocking member 320 disposed between other neighboring color filters 361, 363, and 365. However, exemplary embodiments are not limited thereto.

A first capping layer 391 covering the first color filter 361, the second color filter 363, the third color filter 365, and the light blocking member 320 may be disposed on one surface of the second base 310. In some embodiments, the first capping layer 391 may be in direct contact with the first color filter 361, the second color filter 363, and the third color filter 365. Further, the first capping layer 391 may be partially in direct contact with the light blocking member 320. For example, the first capping layer 391 may be partially in contact with one surface of the first light blocking member 321 exposed by being spaced apart from the first color filter 361 and the second color filter 363.

The first capping layer 391 may prevent damage and/or contamination of the first color filter 361, the second color filter 363, the third color filter 365, and the like due to infiltration of impurities, such as moisture, or air from the outside. Further, the first capping layer 391 may prevent the color material included in the first color filter 361, the second color filter 363, and the third color filter 365 from diffusing into different components from the first color filter 361, the second color filter 363, and the third color filter 365; for example, from diffusing into the light transmission pattern 330, the first wavelength conversion pattern 340, and/or the second wavelength conversion pattern 350. In some embodiments, the first capping layer 391 may include an inorganic material. For example, the first capping layer 391 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first capping layer 391 may also be in contact with the partition wall 380 to be described later. In some embodiments, the first capping layer 391 may be in contact with the partition wall 380 at least in the light blocking area BA. As will be described later, the partition wall 380 may be disposed among the first color filter 361, the second color filter 363, and the third color filter 365, and the first capping layer 391 may be in contact with the partition wall 380 among the first color filter 361, the second color filter 363, and the third color filter 365.

The light transmission pattern 330, the first wavelength conversion pattern 340, and the second wavelength conversion pattern 350 may be disposed on one surface of the first capping layer 391. In some embodiments, the light transmission pattern 330, the first wavelength conversion pattern 340, and the second wavelength conversion pattern 350 may be formed by an inkjet method. However, exemplary embodiments are not limited thereto. For example, the light transmission pattern 330, the first wavelength conversion pattern 340, and the second wavelength conversion pattern 350 may be formed by applying a photosensitive material and exposing and developing the photosensitive material. Hereinafter, a case where the light transmission pattern 330, the first wavelength conversion pattern 340, and the second wavelength conversion pattern 350 are formed by an inkjet method will be exemplified and described.

The light transmission pattern 330 may be located on one surface of the first capping layer 391, and may be located in the first light transmitting area TA1 and the fourth light transmitting area TA4. In some embodiments, the light transmission pattern 330 may have a structure in which a portion located in the first light transmitting area TA1 and a portion located in the fourth light transmitting area TA4 are spaced apart from each other, that is, may be formed in the form of an island pattern.

The light transmission pattern 330 may transmit incident light. As described above, the first display substrate 100 may include a light emitting element (such as light emitting element 30 in FIG. 5 or light emitting elements ED1 to ED3 in FIG. 8) emitting the light L1 of the same color as one another. For example, the light emitting element may provide the light L1 of the first color to the light transmission pattern 330 and the wavelength conversion patterns 340 and 350 of the second display substrate 300. Among the light emitting elements of the first display substrate 100, the emission light of the first color L1 provided from the first light emitting element ED1 of the first light emitting area LA1 may be transmitted through the light transmission pattern 330 and the first color filter 361 and may be emitted to the outside of the display device 1. For instance, the light emitted from the first light transmitting area TA1 may be light L1 of the first color, e.g., blue light.

In some embodiments, the light transmission pattern 330 may include a first base resin 331, and may further include first scatterers 333 dispersed in the first base resin 331.

The first base resin 331 may be made of a material having high light transmittance. In some embodiments, the first base resin 331 may be made of an organic material. For example, the first base resin 331 may include an organic material, such as at least one of an epoxy resin, an acrylic resin, a cardo resin, and an imide resin. However, exemplary embodiments are not limited thereto.

The first scatterers 333 may have a different refractive index from the first base resin 331 and may form an optical interface together with the first base resin 331. For example, the first scatterers 333 may be light scattering particles. The first scatterers 333 are not particularly limited as long as they are materials capable of scattering at least a portion of the transmitted light, but may be, for example, at least one of metal oxide particles and organic particles. The metal oxide particles may include at least one of titanium oxide ($TiO_2$), zirconium oxide ($ZrO_2$), aluminum oxide ($Al_2O_3$), indium oxide ($In_2O_3$), zinc oxide (ZnO), and tin oxide ($SnO_2$). The organic particles may include at least one of acrylic resins and urethane resins. The first scatterers 333 may scatter light in a random direction irrespective of the incident direction of incident light without substantially converting the wavelength of the light passing through the light transmission pattern 330.

The first wavelength conversion pattern 340 may be located on one surface of the first capping layer 391, and may be located in the second light transmitting area TA2 and the fifth light transmitting area TA5. In some embodiments, the first wavelength conversion pattern 340 may have a structure in which a portion located in the second light transmitting area TA2 and a portion located in the fifth light transmitting area TA5 are spaced apart from each other. For instance, the first wavelength conversion pattern 340 may be formed in the form of an island pattern.

The first wavelength conversion pattern 340 may convert or shift the peak wavelength of incident light into the light of another specific peak wavelength, and then may emit the converted or shifted light. The first display substrate 100 may include a light emitting element (such as light emitting element 30 in FIG. 5 or light emitting elements ED1 to ED3 in FIG. 8) emitting the light L1 of the same color as one another. For example, the light emitting element may provide the light L1 of the first color to the light transmission pattern 330 and the wavelength conversion patterns 340 and 350 of the second display substrate 300. In some embodiments, the first wavelength conversion pattern 340 may convert the light L1 of the first color provided from the second light emitting element ED2 of the second light emitting area LA2 of the first display substrate 100 into green light L2 having a peak wavelength ranging from about 510 nm to about 550 nm, and then emit the green light L2.

In some embodiments, the first wavelength conversion pattern 340 may include a second base resin 341 and a first wavelength conversion material 345 dispersed in the second base resin 341, and may further include second scatterers 343 dispersed in the second base resin 341. In some embodiments, the second base resin 341 may be made of an organic material. For example, the second base resin 341 may be made of the same material as the first base resin 331, or may include at least one of the materials exemplified as being a constituent material of the first base resin 331. However, exemplary embodiments are not limited thereto.

The first wavelength conversion material 345 may convert or shift the peak wavelength of incident light to another specific peak wavelength. In some embodiments, the first wavelength conversion material 345 may convert blue light L1 of the first color emitted from the second light emitting element ED2 into green light L2 having a peak wavelength ranging from about 510 nm to about 550 nm, and may emit the green light L2.

Examples of the first wavelength conversion material 345 may include at least one of a quantum dot, a quantum rod, and a phosphor. For example, the quantum dot may be particulate matter that emits light of a specific color in response to electrons being shifted from a conduction band to a valence band.

The quantum dot may be a semiconductor nanocrystalline material. The quantum dot may have a specific band gap according to its composition and size to absorb light and then emit light having an inherent (or determined) wavelength. Examples of the semiconductor nanocrystals of the quantum dot may include at least one of group IV nanocrystals, group II-VI compound nanocrystals, group III-V compound nanocrystals, and group IV-VI nanocrystals.

The group II-VI compound may include at least one of two-element compounds, such as at least one of CdSe, CdTe, ZnS, ZnSe, ZnTe, ZnO, HgS, HgSe, HgTe, MgSe, and MgS; three-element compounds, such as at least one of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS; and four-element compounds, such as at least one of HgZnTeS, CdZnSeS, CdZnSeTe, CdZnSTe, CdHgSeS, CdHgSeTe, CdHgSTe, HgZnSeS, HgZnSeTe, and HgZnSTe.

The group III-V compound may be at least one of two-element compounds, such as at least one of GaN, GaP, GaAs, GaSb, AlN, AlP, AlAs, AlSb, InN, InP, InAs, and InSb; three-element compounds, such as at least one of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and GaAlNP; and four-element compounds, such as at least one of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb.

The group IV-VI compound may be at least one of two-element compounds, such as at least one of SnS, SnSe, SnTe, PbS, PbSe, and PbTe; three-element compounds, such as at least one of SnSeS, SnSeTe, SnSTe, PbSeS, PbSeTe, PbSTe, SnPbS, SnPbSe, and SnPbTe; and four-element compounds, such as at least one of SnPbSSe, SnPbSeTe, and SnPbSTe. The group IV element may be at least one of Si and Ge. The group IV compound may be a two-element compound, such as at least one of SiC and SiGe.

According to some embodiments, the two-element compound, the three-element compound, and/or the four-element compound may be present in the particles at a uniform concentration, or may be present in the same particles in a state where a concentration distribution is partially different. Further, the two-element compound, the three-element compound, and/or the four-element compound may have a core-shell structure in which one quantum dot surrounds another quantum dot. An interface between the core and the shell may have a concentration gradient where the concentration of elements in the shell decreases in a determined direction, e.g., decreased toward the center.

In some embodiments, the quantum dot may have a core-shell structure including a core including at least one of the aforementioned nanocrystals and a shell surrounding the core. The shell of the quantum dot may serve as a protective layer for maintaining semiconductor characteristics by preventing the chemical denaturation of the core and/or as a charging layer for imparting electrophoretic characteristics to the quantum dot. The shell may be monolayer or multilayer structure. The interface between the core and the shell may have a concentration gradient where the concentration of elements in the shell decreases in a determined direction, e.g., decreases toward the center. Examples of the shell of the quantum dot may include at least one of oxides of metals, oxides of nonmetals, and semiconductor compounds.

Examples of the oxides of metals or nonmetals may include, but are not limited to, at least one of two-element compounds, such as at least one of $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, and three-element compounds, such as at least one of $MgAl_2O_4$, $CoFe_2O_4$, $NiFe_2O_4$, and $CoMn_2O_4$.

Examples of the semiconductor compounds may include, but are not limited to, at least one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb.

Light emitted from the first wavelength conversion material 345 may have a full width at half maximum (FWHM) of about 45 nm or less, such as about 40 nm or less, e.g., about 30 nm or less, and thus, the color purity and color reproducibility of the color displayed by the display device 1 may be further improved. Further, light emitted from the first wavelength conversion material 345 may be emitted in various directions regardless of the incident direction of incident light. As a result, side visibility of green light L2 displayed in the second light transmitting area TA2 may be improved.

A portion of the light provided from the first display substrate 100 may be emitted by passing through the first wavelength conversion pattern 340 without being converted into green light by the first wavelength conversion material 345. Of the light emitted from the first display substrate 100, a component that is not converted by the first wavelength conversion pattern 340 and is incident on the second color filter 363 may be blocked by the second color filter 363. In contrast, of the light emitted from the first display substrate 100, green light L2 converted by the first wavelength conversion pattern 340 is transmitted through the second color filter 363 and is emitted to the outside. For example, light emitted from the second light transmitting area TA2 may be green light L2.

The second scatterers 343 may have a different refractive index from the second base resin 341 and form an optical interface together with the second base resin 341. For example, the second scatterers 343 may be light scattering particles. A detailed description of the second scatterers 343 is substantially the same as or similar to that of the first scatterers 333, and thus, a description thereof will be omitted.

The second wavelength conversion pattern 350 may be located on one surface of the first capping layer 391, and may be located in the third light transmitting area TA3 and the sixth light transmitting area TA6. In some embodiments, the second wavelength conversion pattern 350 may have a structure in which a portion located in the third light transmitting area TA3 and a portion located in the sixth light transmitting area TA6 are spaced apart from each other, e.g., may be formed in the form of an island pattern.

The second wavelength conversion pattern 350 may convert or shift the peak wavelength of incident light into light of a different peak wavelength, and then may emit the converted or shifted light. In some embodiments, the second wavelength conversion pattern 350 may convert the light L1 of the first color provided from the third light emitting element ED3 of the third light emitting area LA3 of the first display substrate 100 into red light L3 having a peak wavelength ranging from about 610 nm to about 650 nm, and then emit the red light L3.

In some embodiments, the second wavelength conversion pattern 350 may include a third base resin 351 and a second wavelength conversion material 355 dispersed in the third base resin 351, and may further include third scatterers 353 dispersed in the third base resin 351.

The third base resin 351 may be made of a material having high light transmittance. In some embodiments, the third base resin 351 may be made of an organic material. In some embodiments, the third base resin 351 may be made of the same material as the first base resin 331, or may include at least one of the materials exemplified as being a constituent material of the first base resin 331. However, exemplary embodiments are not limited thereto.

The second wavelength conversion material 355 may convert or shift the peak wavelength of incident light to another specific peak wavelength. In some embodiments, the second wavelength conversion material 355 may convert the light L1 of the first color having a peak wavelength of 440 nm to 480 nm into red light L3 having a peak wavelength ranging from about 610 nm to about 550 nm.

Examples of the second wavelength conversion material 355 may include at least one of a quantum dot, a quantum rod, and a phosphor. A description of the second wavelength conversion material 355 is substantially the same as or similar to that of the first wavelength conversion material 345, and thus, the description thereof will be omitted.

In some embodiments, both the first wavelength conversion material 345 and the second wavelength conversion material 355 may be made of quantum dots. In this case, the particle size of the quantum dot constituting the first wavelength conversion material 345 may be different from the particle size of the quantum dot constituting the second wavelength conversion material 355.

The third scatterers 353 may have a different refractive index from the third base resin 351 and form an optical interface together with the third base resin 351. For example, the third scatterers 353 may be light scattering particles. A detailed description of the third scatterers 353 is substantially the same as or similar to that of the first scatterers 333, and thus, the description thereof will be omitted.

The second wavelength conversion pattern 350 may be provided with the light L1 of the first color emitted from the third light emitting element ED3, and the second wavelength conversion material 355 may convert the light L1 provided from the third light emitting element ED3 into red light L3 having a peak wavelength ranging from about 610 nm to about 650 nm and emit the red light L3.

According to various embodiments, the light L1 emitted from the first display substrate 100 may be incident on the light transmission pattern 330, the first wavelength conversion pattern 340, and the second wavelength conversion pattern 350. As described above with reference to FIG. 6, the light emitting element 30 of the first display substrate 100 may be disposed between the first electrode 21 and the second electrode 22, and the light emitted from the light emitting element 30 may be reflected by the first electrode 21 and the second electrode 22 and transferred upward, for example, toward the second display substrate 300. However, since the light provided from the first display substrate 100 to the second display substrate 300 is reflected or scattered from the first electrode 21 and the second electrode 22 without being provided directly from the light emitting element 30, a decrease in luminance of light and an optical path distribution may occur.

To solve or address the above-noted problem, the light transmission pattern 330, the first wavelength conversion pattern 340, and the second wavelength conversion pattern 350 of the second display substrate 300 may have a structure in which light provided from the first display substrate 100 can be collected. According to an embodiment, at least a portion of the light transmission pattern 330, the first wavelength conversion pattern 340, and the second wavelength conversion pattern 350 may include a curved surface. A more detailed description thereof will be provided in association with at least FIGS. 9 and 10.

FIG. 9 is an enlarged view showing that light emitted from the first display substrate 100 is incident on the light transmission pattern 330, and FIG. 10 is an enlarged view showing that light emitted from the first display substrate 100 is incident on the first wavelength conversion pattern 340. Although FIG. 10 shows only the first wavelength conversion pattern 340, a description thereof may be equally applied to the second wavelength conversion pattern 350.

Referring to FIGS. 9 and 10, the light transmission pattern 330 and the wavelength conversion patterns 340 and 350 of the second display substrate 300 may include a first surface CS1 facing the first display substrate 100, and a second surface CS2 facing the first surface CS1 and facing the color filters 361, 363, and 365. The color filters 361, 363, and 365 may include a third surface CS3 contacting the second base 310 and a fourth surface CS4 facing the third surface CS3. The second surface CS2 of the light transmission pattern 330 and the wavelength conversion patterns 340 and 350 and the fourth surface CS4 of the color filters 361, 363, and 365 may face each other with the first capping layer 391 interposed therebetween. Further, the first surface CS1 of the light transmission pattern 330 and the wavelength conversion patterns 340 and 350, e.g., a surface facing the first display substrate 100, may be a surface on which light emitted from the first display substrate 100 is incident.

The light transmission pattern 330 and the wavelength conversion patterns 340 and 350 may include one surface at least partially curved. According to an embodiment, the light transmission pattern 330 and the wavelength conversion patterns 340 and 350 may have a shape in which one surface facing the first display substrate 100, e.g., the first surface CS1, is partially curved. As shown in FIGS. 9 and 10, in the light transmission pattern 330 and the first wavelength conversion pattern 340, the first surface CS1 facing the first display substrate 100 may include a curved surface. The first surface CS1 may have a shape in which a central portion of the first surface CS1 is recessed toward the second base 310 or the second surface CS2 as compared with both sides thereof contacting the partition wall 380. The curved surface of the first surface CS1 may have a central curvature located on a side of the first display substrate 100. Such a shape may be formed to include a surface on which the first surface CS1 is recessed by adjusting process conditions of a process of drying ink in the process of forming the light transmission pattern 330 and the wavelength conversion patterns 340 and 350. However, exemplary embodiments are not limited thereto.

The light of the first color L1 emitted from the first display substrate 100 may travel toward the second display substrate 300, and may be provided to the first surface CS1, which is one surface of the light transmission pattern 330 and the first wavelength conversion pattern 340. As shown in at least FIGS. 9 and 10, when the first surface CS1, which is one surface of the light transmission pattern 330 and the first wavelength conversion pattern 340, has a curved surface such that the central portion has a shape recessed toward the second base 310 or the second surface CS2, e.g., when the central portion of the first surface CS1 has a shape recessed toward a direction in which light L1 of the first color emitted from the first display substrate 100 travels, the absorption area of emission light provided from the first display substrate 100 may increase. Further, the diffuse reflection of the emission light incident on the light transmission pattern 330 and the wavelength conversion patterns 340 and 350 may increase with the first surface CS1 as a boundary, and the amount of light incident on the light transmission pattern 330 and the wavelength conversion patterns 340 and 350 again may increase as compared with the amount of light traveling toward the first display substrate 100. In the display device 1 according to an embodiment, the light transmission pattern 330 and the wavelength conversion patterns 340 and 350 of the second display substrate 300 may include a curved surface, and thus, the luminance of light emitted from the first display substrate 100 and emitted through the second display substrate 300 may be improved.

In an exemplary embodiment, among the distances between the first surface CS1 and the second surface CS2 of the light transmission pattern 330 and the wavelength conversion patterns 340 and 350, the first distance HA1 between the first surface CS1 and the second surface CS2, measured in the central portion spaced apart from the partition wall 380, may be smaller than the second distance HA2 between the first surface CS1 and the second surface CS2, measured on the side surface where the light transmission pattern 330 and the wavelength conversion patterns 340 and 350 are in contact with the partition wall 380.

To absorb incident light in a large area, the first surface CS1 of the light transmission pattern 330 and the wavelength conversion patterns 340 and 350 may include a surface whose central portion is recessed toward the second base 310 or the second surface CS2. In contrast, the second surface CS2 faces the fourth surface CS4 of the color filters 361, 363, and 365, and may, thus, be formed corresponding to the fourth surface CS4. The color filters 361, 363, and 365 are directly disposed on the second base 310, and thus, the third surface CS3 and the fourth surface CS4 may form a surface parallel to the second base 310. As shown in at least FIGS. 9 and 10, in the second base 310 according to an embodiment, the forth distance HA4 of a portion where the color filters 361, 363, and 365 are arranged may be equal to the fifth distance HA5 where portions of the light blocking member 320 are arranged. For instance, the second base 310 may form a flat surface on which the color filters 361, 363, and 365 are disposed. Since the second base 310 may form a flat surface, the third surface CS3 and the fourth surface CS4 of the color filters 361, 363, and 365 may form a substantially flat surface. For example, in the color filters 361, 363, and 365, the third distance HA3 between the third surface CS3 and the fourth surface CS4 may be constant regardless of position. It is noted, however, that portions of the color filters 361, 363, and 365 overlapping portions of the light blocking member 320 may not be as thick as the third distance HA3.

In contrast, in the light transmission pattern 330 and the wavelength conversion patterns 340 and 350, the second surface CS2 forms a flat surface along the fourth surface CS4 of the color filters 361, 363, and 365, and the first surface CS1 includes a curved surface so that the distance between the first surface CS1 and the second surface CS2 of the light transmission pattern 330 and the wavelength conversion patterns 340 and 350 may vary depending on the position. In some embodiments, among the distances between the first surface CS1 and the second surface CS2, the first distance HA1 between the first surface CS1 and the second surface CS2, measured in the central portion thereof, may be smaller than the second distance HA2 between the first surface CS1 and the second surface CS2, measured on both sides thereof or an edge thereof.

However, exemplary embodiments are not limited thereto. In some embodiments, one surface of the second base 310 on which the color filters 361, 363, and 365 are disposed may include a partially recessed portion, and the third surface CS3 and the fourth surface CS4 of the color filters 361, 363, and 365, and the second surface CS2 of the light transmission pattern 330 and the wavelength conversion patterns 340 and 350 may include a curved surface. In this case, in the light transmission pattern 330 and the wavelength conversion patterns 340 and 350, the distance between the first surface CS1 and the second surface CS2 may be constant regardless of the position. A more detailed description thereof will be described later.

As seen in at least FIGS. 9 and 10, a portion of the light L1 of the first color emitted from the first display substrate 100 may be incident on the first wavelength conversion pattern 340, may be scattered by the second scatterers 343, or may be converted into light of another color, for example, light L2 of the second color, by the first wavelength conversion material 345. A portion of the light L1 of the first color incident on the first wavelength conversion pattern 340 may be incident on the second color filter 363 with the first color, and another portion thereof may be converted into light of the second color L2 and incident on the second color filter 363. The second color filter 363 may block the transmission of light other than the light L2 of the second color, and may emit the light L2 of the second color through the second base 310. Accordingly, the second light transmitting area TA2 of the second display substrate 300 may display the light L2 of the second color.

Further, a portion of the light L1 of the first color emitted from the first display substrate 100 may be incident on the second wavelength conversion pattern 350, and a portion of the incident light may be converted into light L3 of the third color by the second wavelength conversion material 355. Further, the third color filter 365 may block the transmission of light other than the light L3 of the third color, and may emit the light L3 of the third color through the second base 310. Accordingly, the third light transmitting area TA3 of the second display substrate 300 may display the light L3 of the third color.

Referring again to FIG. 8, the partition wall 380 may be disposed on one surface of the second base 310. The partition wall 380 may be disposed on the light blocking member 320 and located in the light blocking area BA, and may overlap the non-light emitting area NLA of the first display substrate 100. The partition wall 380 may be disposed to surround the first light transmitting area TA1, the second light transmitting area TA2, the third light transmitting area TA3, the fourth light transmitting area TA4, the fifth light transmitting area TA5, and the sixth light transmitting area TA6, and the planar shape thereof may form a lattice pattern.

In some embodiments, the first wavelength conversion pattern 340, the second wavelength conversion pattern 350, and the light transmission pattern 330 may be formed by an inkjet method using an ink composition. The partition wall 380 may serve as a guide for stably placing the ink composition for forming the first wavelength conversion pattern 340, the second wavelength conversion pattern 350, and the light transmission pattern 330 at a desired position.

For example, the partition wall 380 may not only be located between the first wavelength conversion pattern 340 and the second wavelength conversion pattern 350, but may also be located between the second wavelength conversion pattern 350 and the light transmission pattern 330. The partition wall 380 may prevent color mixing between different light transmitting areas located adjacent to each other. In other words, the partition wall 380 may overlap the light blocking area BA to prevent the color mixing between neighboring light transmitting areas, and may prevent the ink from overflowing into the neighboring light transmitting area in the process of forming the first wavelength conversion pattern 340, the second wavelength conversion pattern 350, and the light transmission pattern 330.

As described above, when the light transmission pattern 330, the first wavelength conversion pattern 340, and the second wavelength conversion pattern 350 extend from the second display substrate 300 in the second direction DR2 and are arranged in a stripe shape, the partition wall 380 may not be disposed in (or on) a portion of the seventh light blocking area BA7 located between the first row RT1 and the second row RT2 of the second display substrate 300, such as shown in FIGS. 14 and 15. However, exemplary embodiments are not limited thereto. When the light transmission pattern 330, the first wavelength conversion pattern 340, and the second wavelength conversion pattern 350 are arranged in an island form, the partition wall 380 may be disposed even in (or on) the seventh light blocking area BA7.

In some embodiments, the partition wall 380 may be formed of an organic material, and may also be formed of a photosensitive organic material. The photosensitive organic material may be, but is not limited to, a negative photosensitive material, which is cured at a portion to which light is applied. In some embodiments, the partition wall 380 may further include a light blocking material and may be located in the light blocking area BA to block the transmission of light.

A second capping layer 393 may be disposed on the light transmission pattern 330, the first wavelength conversion pattern 340, the second wavelength conversion pattern 350, and the partition wall 380. The second capping layer 393 may cover and encapsulate the light transmission pattern 330, the first wavelength conversion pattern 340, the second wavelength conversion pattern 350, and the partition wall 380. Accordingly, it is possible to prevent the light transmission pattern 330, the first wavelength conversion pattern 340, and the second wavelength conversion pattern 350 from being damaged and/or contaminated by the penetration of external impurities, such as moisture and air. In some embodiments, the second capping layer 393 may be made of an inorganic material. In some embodiments, the second capping layer 393 may be made of the same material as the first capping layer 391, or may include at least one of the materials mentioned in the description of the first capping layer 391. However, exemplary embodiments are not limited thereto.

As described above, the filler 700 may be located in the space between the second display substrate 300 and the first display substrate 100. In some embodiments, the filler 700 may be located between the second capping layer 393 and the thin film encapsulation layer 170. In some embodiments, filler 700 may be in direct contact with second capping layer 393.

Hereinafter, a method of manufacturing the display device 1, and, in particular, a method of manufacturing the second display substrate 300 will be described with reference to various drawings.

FIGS. 17 to 22 are cross-sectional views showing a display device at various stages of manufacture according to various exemplary embodiments.

FIGS. 17 to 22 schematically show stages of a process of manufacturing the second display substrate 300 of the display device 1. Hereinafter, only the first light transmitting area TA1, the second light emitting area TA2, and the third light transmitting area TA3 will be shown and described; however, the following description may be equally applied to other light transmitting areas TA, for example, the fourth light transmitting area TA4, the fifth light emitting area TA5, and the sixth light transmitting area TA6.

Figure 17:
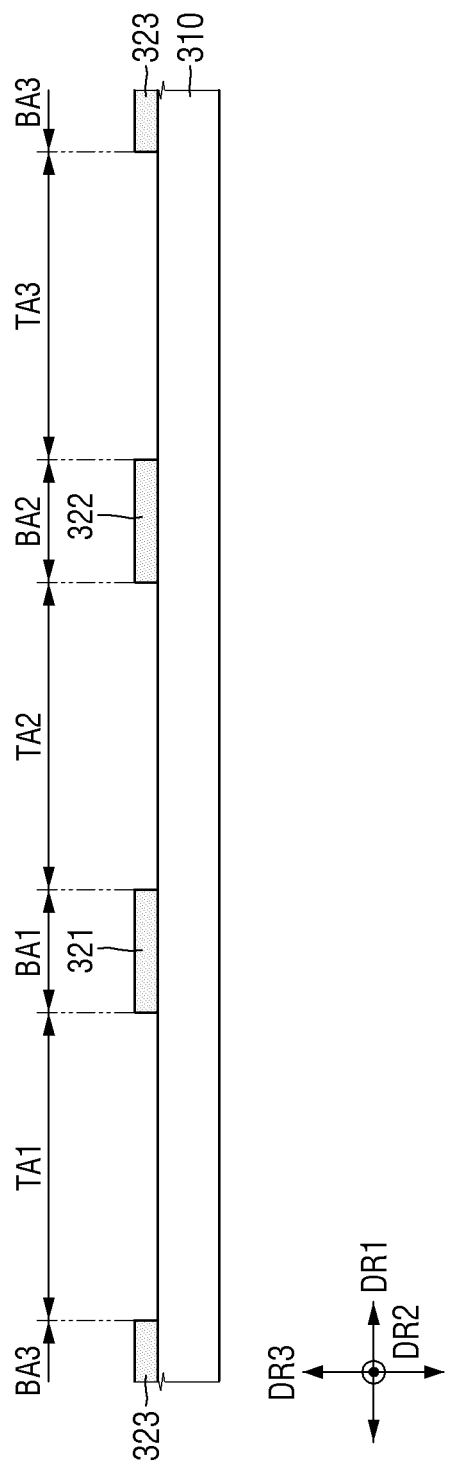
FIGS. 17 to 22 are cross-sectional views showing a display device at various stages of manufacture according to various exemplary embodiments.

Referring to FIG. 17, the light blocking member 320 is formed on one surface of a second base 310. The light blocking member 320 may be formed in an area overlapping each light blocking area BA. Since the description of the arrangement of the various portions of light blocking member 320 is the same as that described above, a detailed description thereof will be omitted. The light blocking member 320 may be formed by applying a photosensitive organic material, and exposing and developing the photosensitive organic material. However, exemplary embodiments are not limited thereto.

Figure 18:
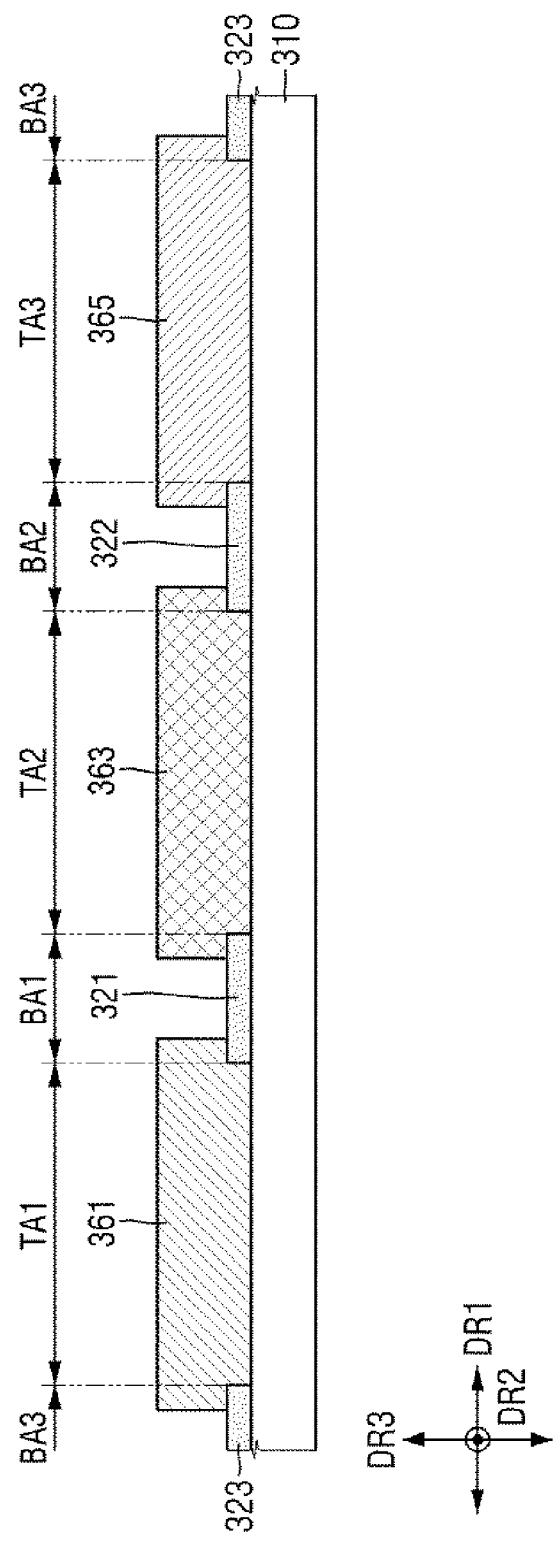

Referring to FIG. 18, the color filters 361, 363, and 365 are formed on one surface of the second base 310. The color filters 361, 363, and 365 may be formed in an area overlapping each light transmitting area TA between portions of the light blocking member 320. The color filters 361, 363, and 365 may be formed by applying a photosensitive organic material including a color material of a specific color, and exposing and developing the photosensitive organic material. Illustratively, the first color filter 361 may be formed by applying a photosensitive organic material including a color material of a blue color, and exposing and developing the photosensitive organic material; the second color filter 363 may be formed by applying a photosensitive organic material including a color material of a green color, and exposing and developing the photosensitive organic material; and the third color filter 365 may be formed by applying a photosensitive organic material including a color material of a red color, and exposing and developing the photosensitive organic material.

Figure 19:
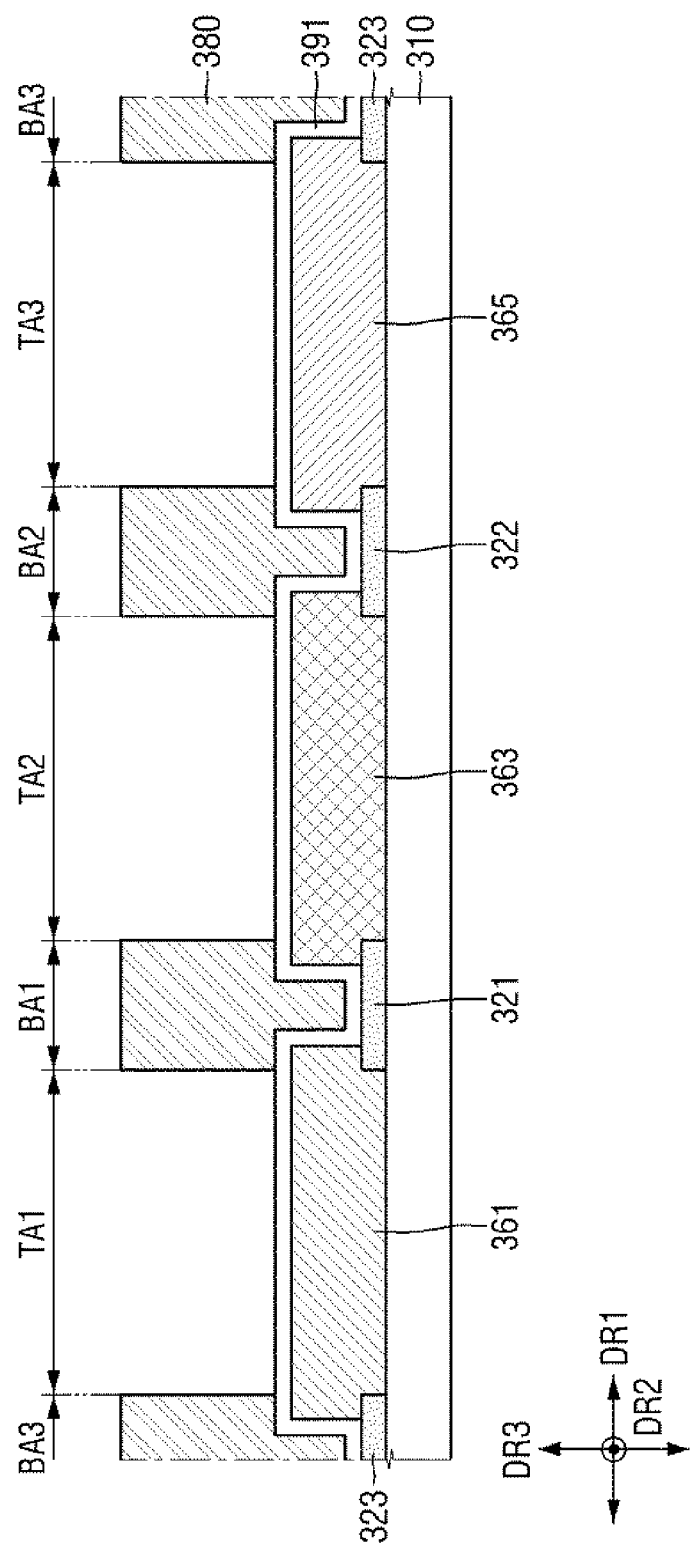

Referring to FIG. 19, a first capping layer 391 may be formed to cover the first color filter 361, the second color filter 363, and the third color filter 365, and a partition wall 380 may formed between the plurality of color filters 361, 363, and 365. The arrangement or shape of the partition wall 380 and the first capping layer 391 are the same as those described above.

Figure 20:
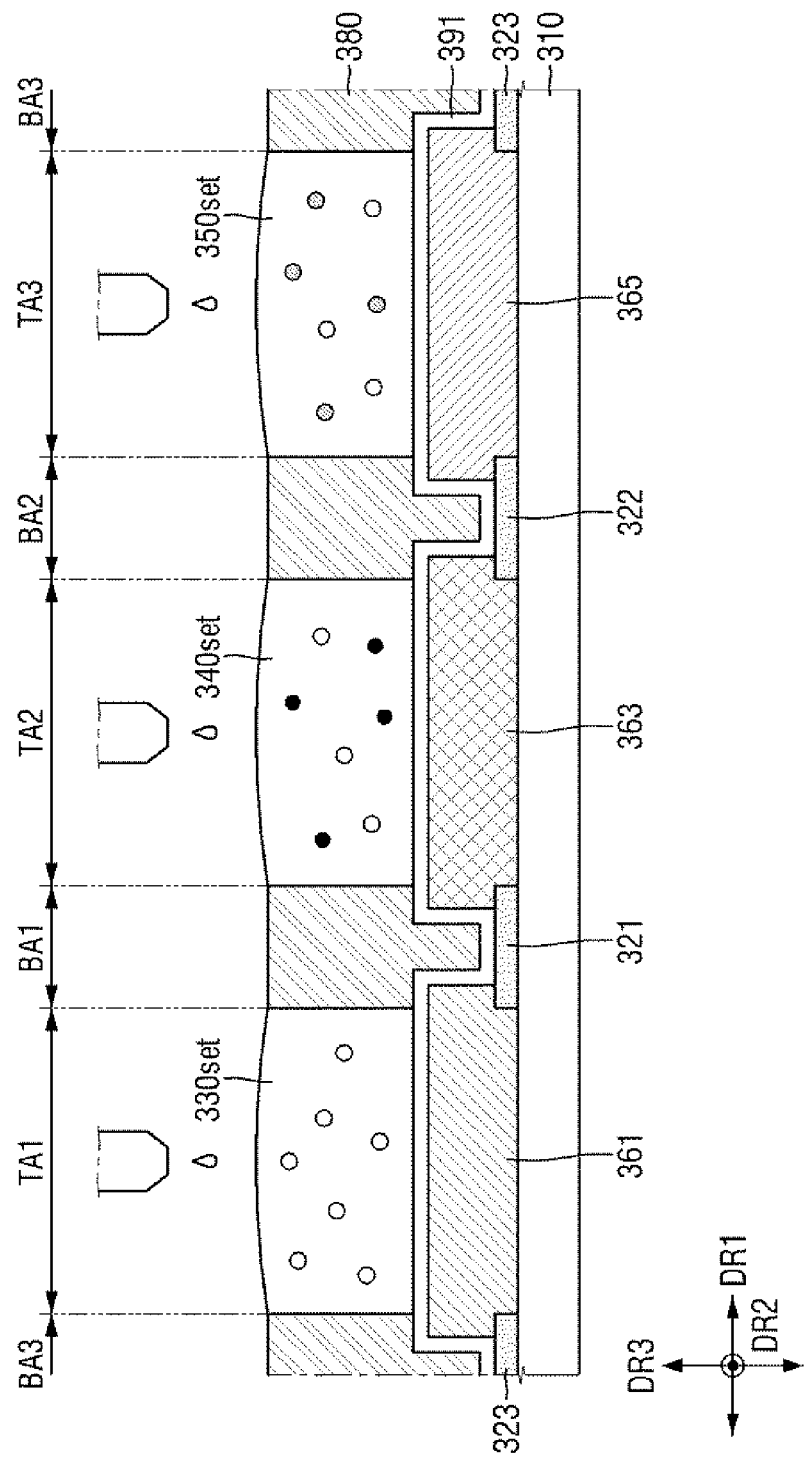
Figure 21:
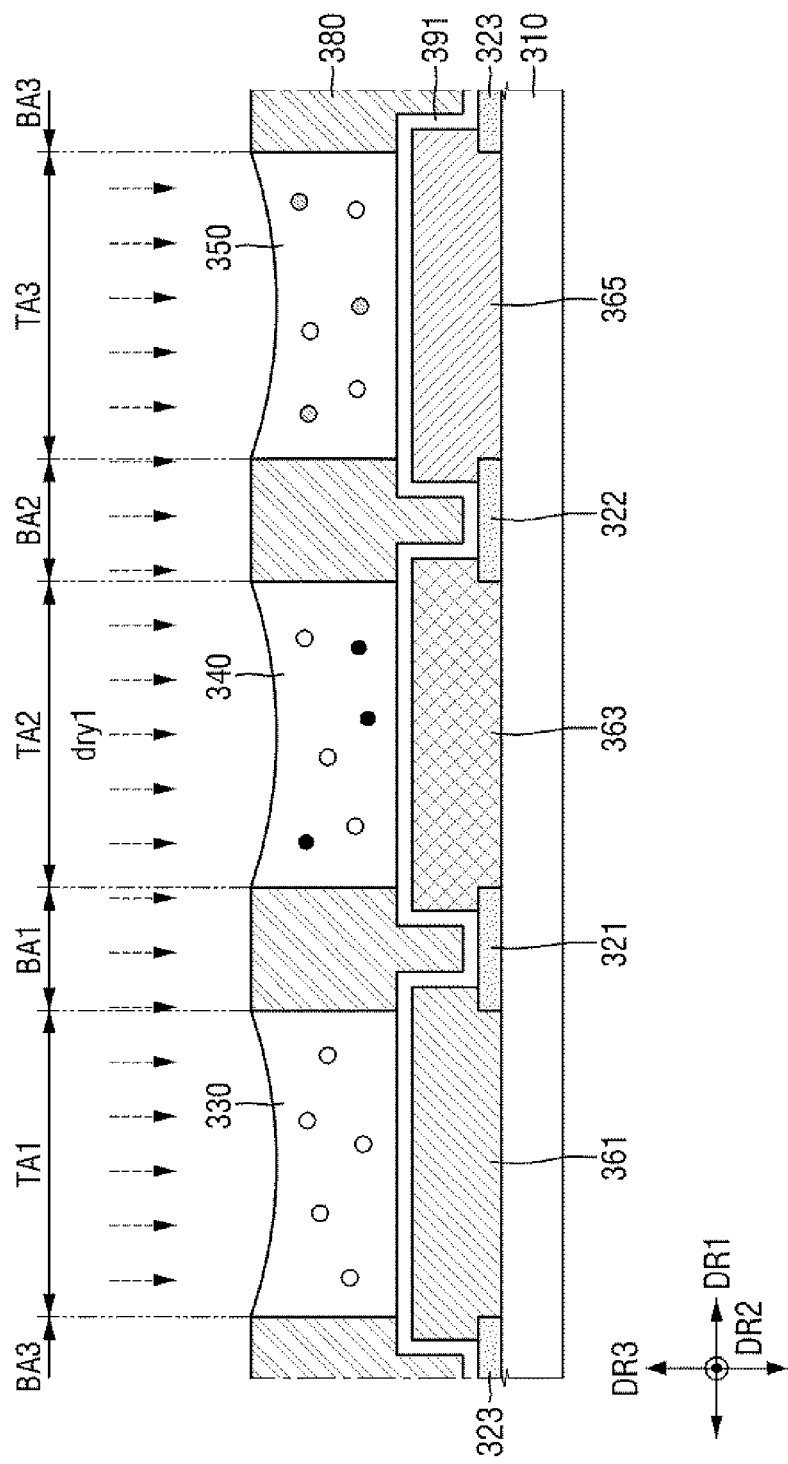

Referring to FIGS. 20 and 21, a light transmission pattern 330, a first wavelength conversion pattern 340, and a second wavelength conversion pattern 350 are formed through a first drying process dry1 of spraying ink onto the first light transmitting area TA1, the second light transmitting area TA2, and the third light transmitting area TA3, respectively, and drying the ink. The light transmission pattern 330, the first wavelength conversion pattern 340, and the second wavelength conversion pattern 350 may be formed in an area surrounded by the partition wall 380, respectively.

As described above, in the light transmission pattern 330 and the wavelength conversion patterns 340 and 350, the first surface CS1, which is one surface facing the first display substrate 100, may include a curved surface. The shape of the first surface CS1 may be formed by changing the process conditions of the first drying process dry1 of drying the ink sprayed between the partition walls 380.

For example, as described above, the partition wall 380 may be made of an organic material, and may be made of, for example, a hydrophobic organic material, such as polyimide (PI). Here, when the surface material of the partition wall 380 is modified to be hydrophilic by ultraviolet (UV) radiation or the like, the attraction force between the ink sprayed between the partition walls 380 and the partition wall 380 increases. Then, when performing the process of drying ink, as shown in at least FIG. 21, the first surface CS1 of the light transmission pattern 330 and the wavelength conversion patterns 340 and 350 may be formed to have a shape in which some regions are recessed toward the second surface CS2. Further, when drying the ink, if the drying process dry1 proceeds slowly at a relatively low temperature, interaction between the surface-modified partition 380 and the ink may occur more strongly, and the first surface CS1 of the light transmission pattern 330 and the wavelength conversion patterns 340 and 350 may have a recessed shape having a larger curvature. However, exemplary embodiments are not limited thereto.

Figure 22:
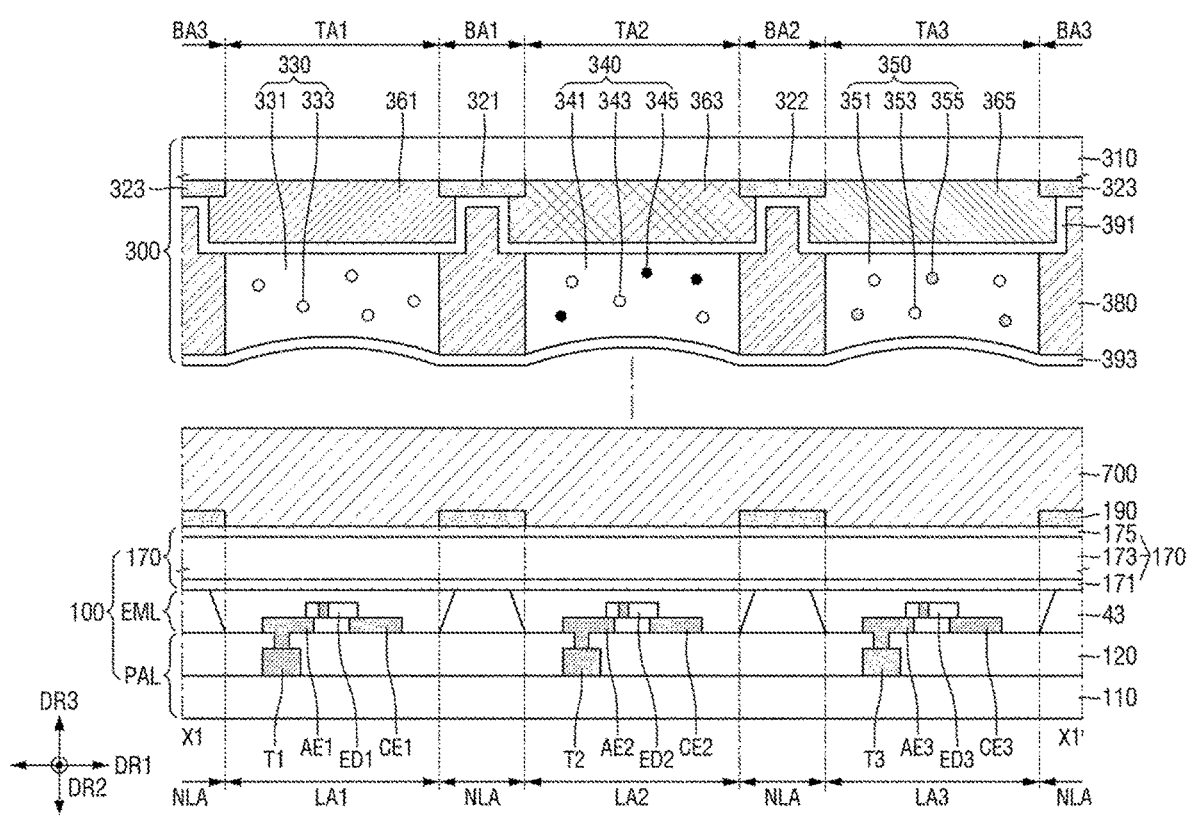

As shown in FIG. 22, a second capping layer 393 may be formed to cover the light transmission pattern 330, the first wavelength conversion pattern 340, the second wavelength conversion pattern 350, and the partition wall 380. The first display substrate 100 may be attached to the second display substrate 300 with the filler 700 formed therebetween to, thereby, form the display device 1.

Hereinafter, a second display substrate of a display device according to some exemplary embodiments will be described.

Figure 23:
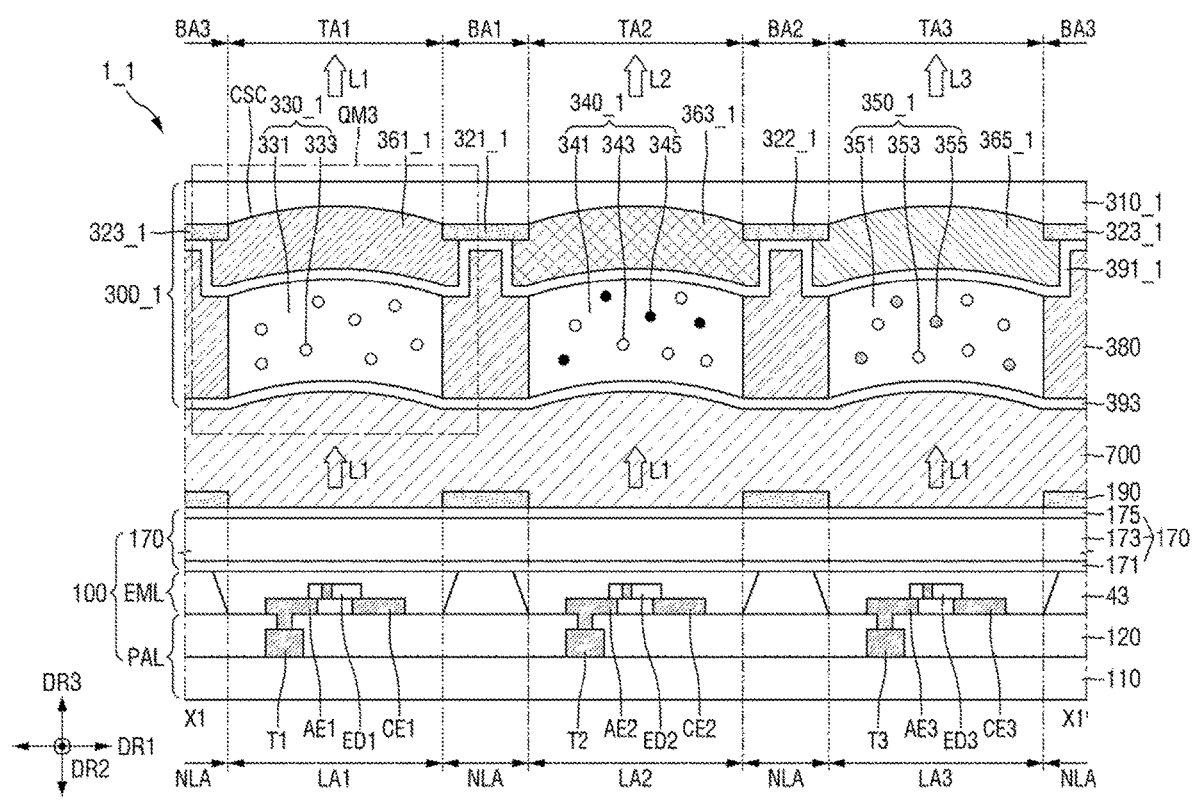
FIG. 23 is a schematic cross-sectional view of a display device according to some exemplary embodiments.
Figure 24:
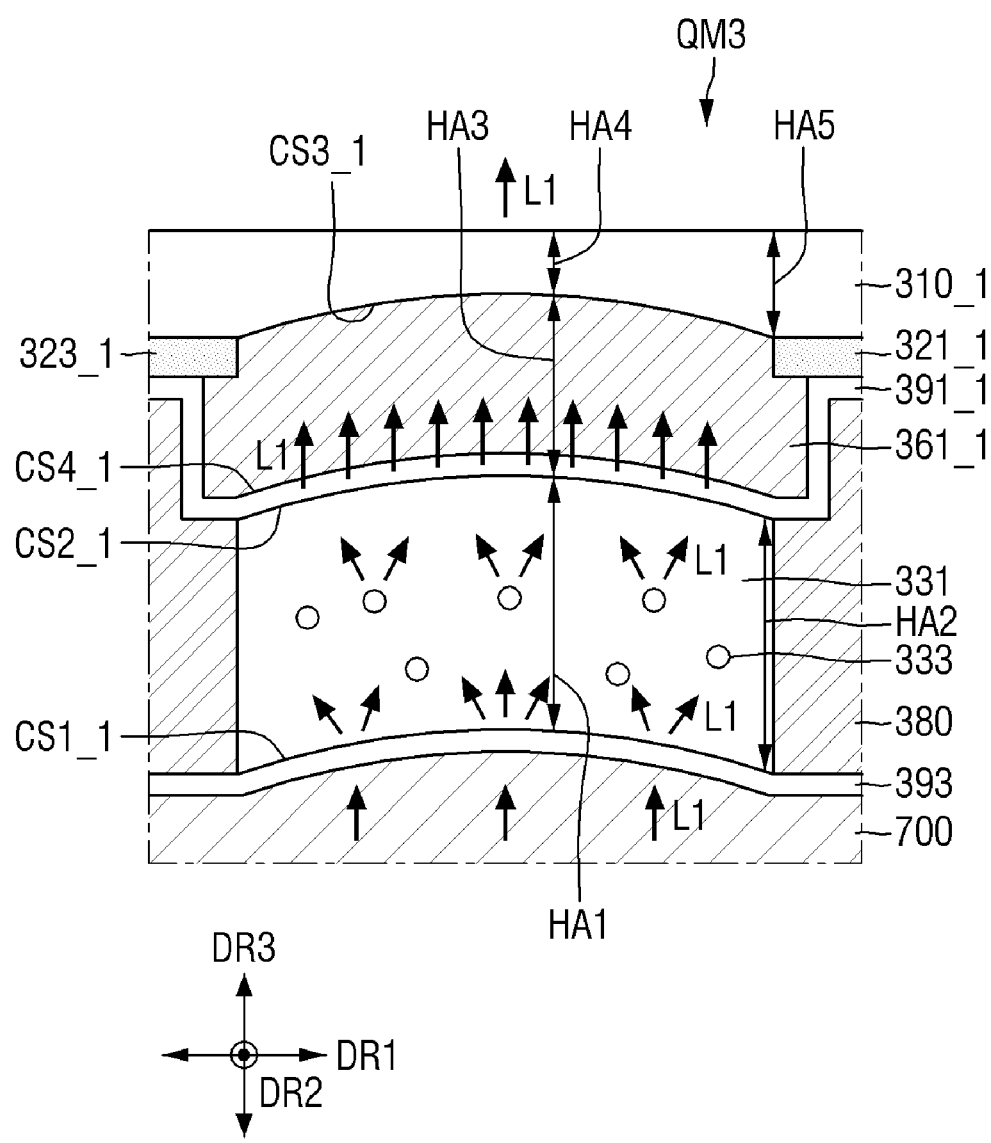
FIG. 24 is an enlarged cross-sectional view of portion QM3 in FIG. 23 according to some exemplary embodiments.

FIG. 23 is a schematic cross-sectional view of a display device according to some exemplary embodiments. FIG. 24 is an enlarged cross-sectional view of portion QM3 in FIG. 23 according to some exemplary embodiments.

Referring to FIGS. 23 and 24, in a second display substrate 300_1 of a display device 1_1 according to an embodiment, a first surface CS1_1 and a second surface CS2_1 of a light transmission pattern 330_1 and wavelength conversion patterns 340_1 and 350_1 may include partially curved surfaces, respectively. In the second display substrate 300_1, an area corresponding to the light transmitting area TA of one surface of the second base 310_1 is partially recessed, and color filters 361_1, 363_1, and 365_1, a light transmission pattern 330_1, and wavelength conversion patterns 340_1 and 350_1 may be disposed on the recessed area. Thus, the light transmission pattern 330_1, the wavelength conversion patterns 340_1 and 350_1, and the color filters 361_1, 363_1, and 365_1 may include curved surfaces corresponding to the recessed area of the second base 310_1. In this manner, display device 1_1 is different from display device 1 in that the light transmission pattern 330_1, the wavelength conversion patterns 340_1 and 350_1, and the color filters 361_1, 363_1, and 365_1 may further include curved surfaces according to the shape of the second base 310_1 of the second display substrate 300_1. In the following description, redundant descriptions will be omitted, and differences will be mainly described.

In the second display substrate 300_1 of FIG. 23, the second base 310_1 may include a surface recessed corresponding to the light transmitting area TA. On one surface of the second base 310_1, the light blocking area BA in which the light blocking member 320 is disposed may form a flat surface, and the light transmitting area TA in which the color filters 361_1, 363_1, and 365_1 are arranged may be partially recessed to form a curved surface. Such a shape of the second base 310_1 may be formed through a process of partially etching (or otherwise patterning) one surface of the second base 310_1 in a process of manufacturing the display device 1_1. The second base 310_1, according to an embodiment, may have the fourth distance HA4 measured in association with the light transmitting area TA that may be smaller than the fifth distance HA5 measured in association with the light blocking area BA. However, exemplary embodiments are not limited thereto.

The color filters 361_1, 363_1, and 365_1 are disposed corresponding to the light transmitting area TA of one surface of the second base 310_1. As described above, the color filters 361_1, 363_1, and 365_1 may include a third surface CS3_1, which is one surface in contact with the second base 310_1, and a fourth surface CS4_1, which faces the third surface CS3_1. The third surface CS3_1 may have a curved surface formed along the recessed area of the second base 310_1, and the fourth surface CS4_1 facing the third surface CS3_1 may also have curved surface formed along the recessed area of the second base 310_1. Unlike the second display substrate 300, an embodiment of which is shown in FIG. 8, in the second display substrate 300_1, an embodiment of which is shown in FIGS. 23 and 24, at least one surface of the color filters 361_1, 363_1, and 365_1 may include a curved surface.

However, as similarly described above with reference to FIG. 8 and color filters 361, 363, and 365, the color filters 361_1, 363_1, and 365_1 may be substantially the same as each other regardless of the position of the third distance HA3 between the third surface CS3_1 and the fourth surface CS4_1. The shapes of the third surface CS3_1 and fourth surface CS4_1 of the color filters 361_1, 363_1, and 365_1 may be changed depending on the shape of a surface of the second base 310_1 on which they are disposed, and the third distance HA3 between the third surface CS3_1 and the fourth surface CS4_1 may be maintained constant regardless of the shapes of the third surface CS3_1 and the fourth surface CS4_1. Although FIG. 24 shows only the light transmission pattern 330_1, the description thereof may be equally applied even to the first wavelength conversion pattern 340_1 and the second wavelength conversion pattern 350_1.

The light transmission pattern 330_1 and the wavelength conversion patterns 340_1 and 350_1 may be disposed on the color filters 361_1, 363_1 and 365_1, respectively. As described above, the light transmission pattern 330_1 and the wavelength conversion patterns 340_1 and 350_1 may include a first surface CS1_1, which is one surface facing the first display substrate 100, and a second surface CS2_1 facing the first surface CS1_1 and facing the fourth surface CS4_1 of the color filters 361_1, 363_1, and 365_1. According to an embodiment, the second surface CS2_1 may have a curved surface formed along the shape of the fourth surface CS4_1 of the color filters 361_1, 363_1, and 365_1, and the first surface CS1_1 facing the second surface CS2_1 may also have a curved surface formed along the shape of the fourth surface CS4_1 thereof. As such, at least a portion of the second surface CS2_1 may protrude toward the color filters 361_1, 363_1, and 365_1 to form a curved surface. Unlike the second display substrate 300, in the second display substrate 300_1, at least one surface of the second surface CS2_1 of the light transmission patterns 330_1 and the wavelength conversion patterns 340_1 and 350_1 may include a curved surface.

The curved surfaces of the first surface CS1_1 and the second surface CS2_1 may have substantially the same curvature. In the second display substrate 300, in the case of the light transmission patterns 330 and the wavelength conversion patterns 340 and 350, the curvature of the curved surface of the first surface CS1 may be changed according to the process conditions of the first drying process dry1 performed in the process of manufacturing the second display substrate 300. In contrast, in the second display substrate 300_1, the first surface CS1_1 of the light transmission pattern 330_1 and the wavelength conversion patterns 340_1 and 350_1 may be formed to be partially recessed toward the second base 310_1 or the second surface CS2_1 according to the shape of the curved surface of the second surface CS2_1. Accordingly, the curvatures of the curved surfaces of the first surface CS1_1 and the second surface CS2_1 of the light transmission pattern 330_1 and the wavelength conversion patterns 340_1 and 350_1 may be substantially the same as each other. Moreover, among the distances between the first surface CS1_1 and the second surface CS2_1, the first distance HA1 which is a distance measured in a central portion of a light transmitting area TA, may be substantially the same as the second distance HA2, which is a distance measured on both sides of the light transmitting area TA or an edge thereof. Even in the case of the second display substrate 300_1, in the light transmission patterns 330_1 and the wavelength conversion patterns 340_1 and 350_1, the first surface CS1_1 on which the light provided from the first display substrate 100 is incident may include a curved surface, and thus, the absorption area of the incident light may be increased. A description thereof is the same as that described above with reference to at least FIGS. 8 and 9.

Hereinafter, a process of manufacturing the display device 1_1 (an embodiment of which is shown in FIG. 23), and particularly, a process of manufacturing the second display substrate 300_1 will be described with reference to various drawings.

FIGS. 25 to 28 are cross-sectional views showing the display device of FIG. 23 at various stages of manufacture according to various exemplary embodiments.

Figure 25:
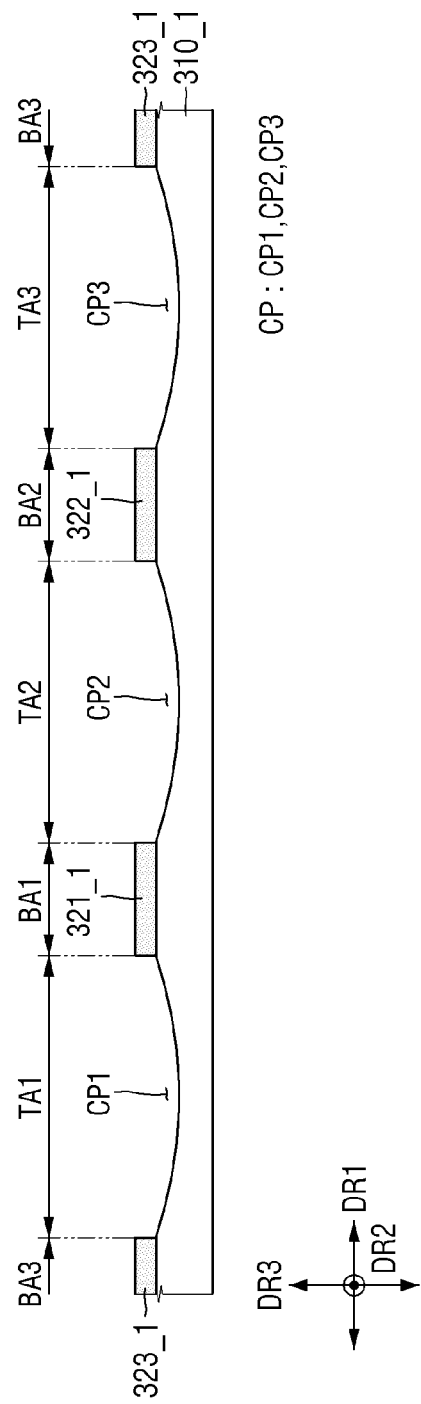
FIGS. 25 to 28 are cross-sectional views showing the display device of FIG. 23 at various stages of manufacture according to various exemplary embodiments.

Referring to FIG. 25, a portion of one surface of the second base 310_1 is etched to form a depression portion CP, and a light blocking member 320 is formed on the one surface of the second base 310_1. In one surface of the second base 310_1, an area corresponding to the light transmitting area TA may have a partially recessed shape. As shown in FIG. 25, the depression portion CP in which one surface of the second base 310_1 is recessed may be formed in the light transmitting area TA. In one surface of the second base 310_1, a first depression portion CP1 may be formed corresponding to the first light transmitting area TA1, a second depression portion CP2 may be formed corresponding to the second light transmitting area TA2, and a third depression portion CP3 may be formed corresponding to the third light transmitting area TA3. In contrast, on the second base 310_1, the light blocking areas BA located among the light transmitting areas TA, for example, a first light blocking area BA1, a second light blocking area BA2, and a third light blocking area BA3 may form flat surfaces on one surface of the second base 310_1 that is not recessed. The plurality of portions of light blocking member 320 may be formed on the flat surface of the light blocking area BA.

Figure 26:
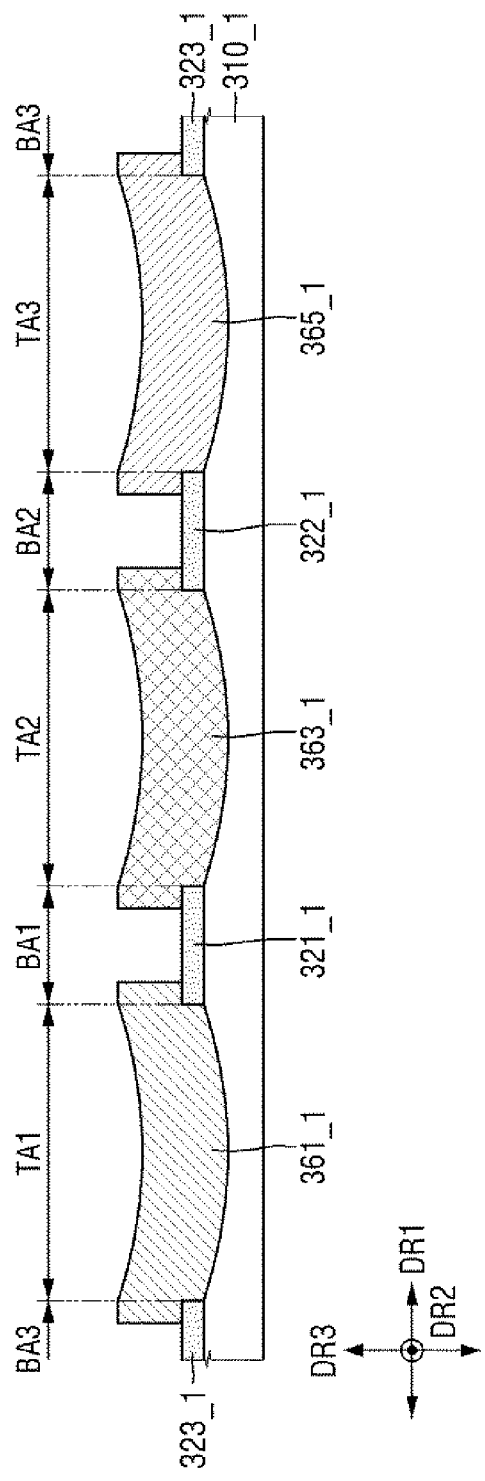

Referring to FIG. 26, color filters 361_1, 363_1, and 365_1 are formed on the depression portions CP of one surface of the second base 310_1. The color filters 361_1, 363_1, and 365_1 may be disposed in the respective light transmitting areas TA, and may be formed corresponding to the depression portions CP formed on one surface of the second base 310_1. Accordingly, as described above, the third surface CS3_1 and the fourth surface CS4_1 of the color filters 361_1, 363_1, and 365_1 may include curved surfaces.

A first capping layer 391_1 is formed to cover the first color filter 361_1, the second color filter 363_1, and the third color filter 365_1, and a partition wall 380 (see FIG. 27) is formed between the plurality of color filters 361_1, 363_1, and 365_1. The arrangement or shape of the partition wall 380 and the first capping layer 391_1 are the same as those described above in association with, for instance, FIGS. 23 and 24.

Figure 27:
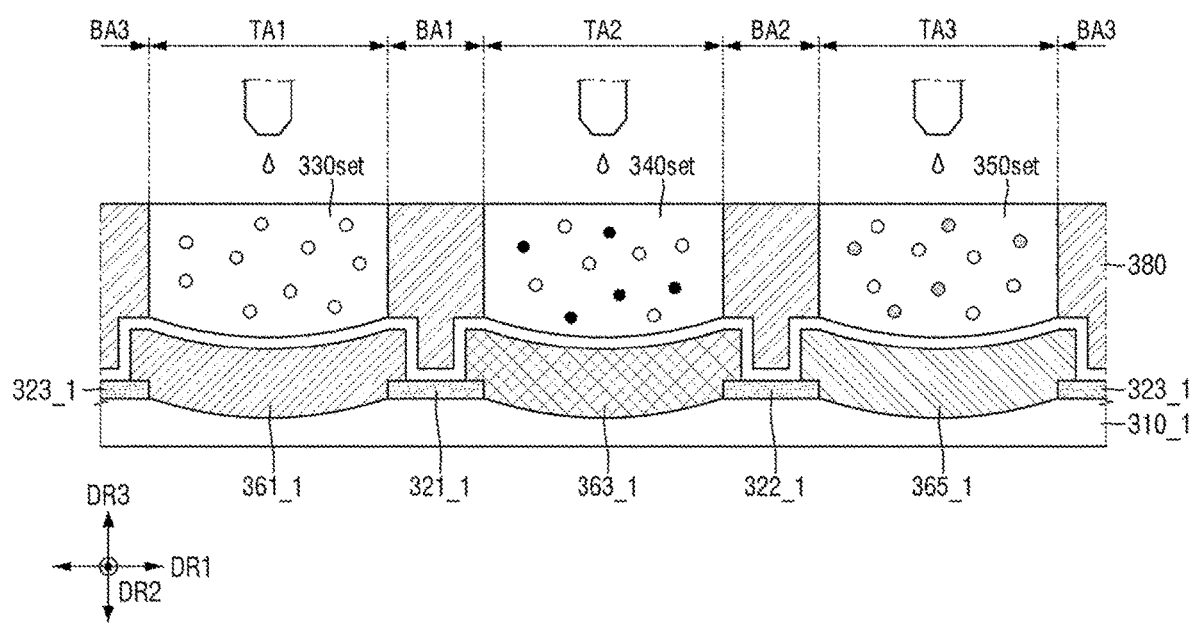
Figure 28:
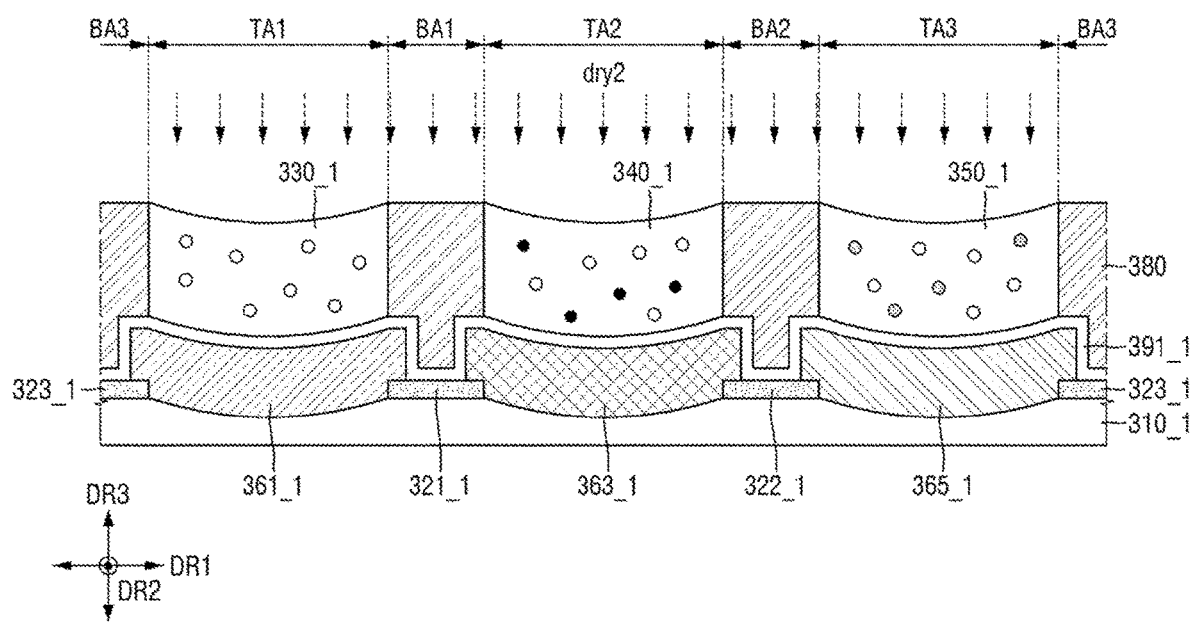

Referring to FIGS. 27 and 28, a light transmission pattern 330_1, a first wavelength conversion pattern 340_1, and a second wavelength conversion pattern 350_1 are formed through a second drying process dry2 of spraying ink onto the first light transmitting area TA1, the second light transmitting area TA2, and the third light transmitting area TA3, respectively, and drying the ink. The light transmission pattern 330_1, the first wavelength conversion pattern 340_1, and the second wavelength conversion pattern 350_1 may be formed in an area surrounded by the partition wall 380, respectively.

As described above, the light transmission pattern 330_1 and the wavelength conversion patterns 340_1 and 350_1 may include a first surface CS1_1 and a second surface CS2_1, each including a curved surface according to the shape of the color filters 361_1, 363_1, and 365_1. The second drying process dry2 for forming the light transmission pattern 330_1 and the wavelength conversion patterns 340_1 and 350_1 may be performed under different process conditions from the first drying process dry1.

As described in association with FIG. 21, since the ink for forming the light transmission pattern 330 and the wavelength conversion patterns 340 and 350 is sprayed onto the fourth surface CS4 of the color filters 361, 363, and 365 that is flat, a process of drying the ink may be used to form a curved surface on the first surface CS1 of the light transmission pattern 330 and the wavelength conversion patterns 340 and 350. In contrast, as described in association with FIG. 28, since the ink for forming the light transmission pattern 330_1 and the wavelength conversion patterns 340_1 and 350_1 is sprayed onto the fourth surface CS4_1 of the color filters 361_1, 363_1, and 365_1 that is curved, the first surface CS1_1 of the light transmission pattern 330_1 and the wavelength conversion patterns 340_1 and 350_1 may have a curved surface formed thereon even when the second drying process dry2 is performed under normal process conditions. In an exemplary embodiment, the process conditions of the second drying process dry2 may be different from the process conditions of the first drying process dry1.

A second capping layer 393 may be formed to cover the light transmission pattern 330_1, the first wavelength conversion pattern 340_1, the second wavelength conversion pattern 350_1, and the partition wall 380. To this end, the first display substrate 100 may be attached to the second display substrate 300_1 with the filler disposed therebetween to, thereby, form the display device 1_1.

In some exemplary embodiments, a second display substrate, such as second display substrate 300 of the display device 1, may further include a color pattern disposed on the light blocking area BA to improve color reproducibility.

Figure 29:
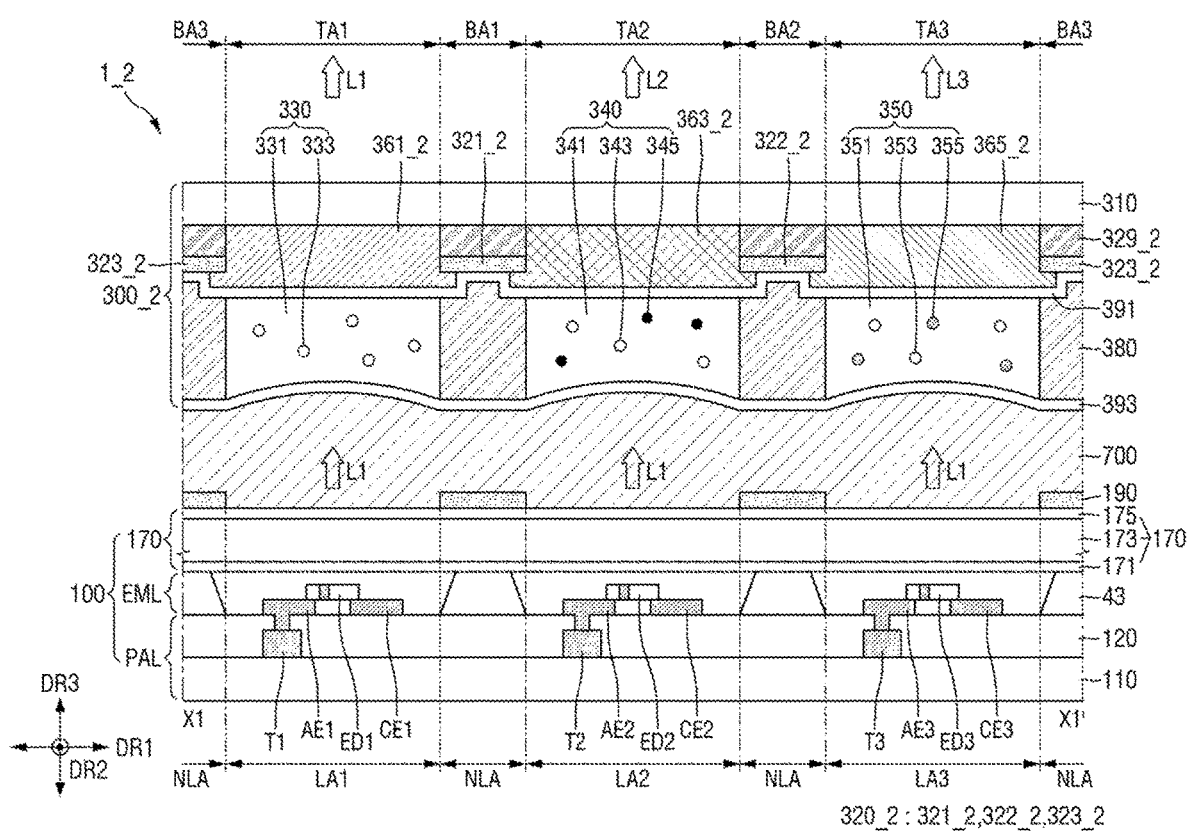
FIGS. 29 and 30 are schematic cross-sectional views of display devices according to various exemplary embodiments.
Figure 30:
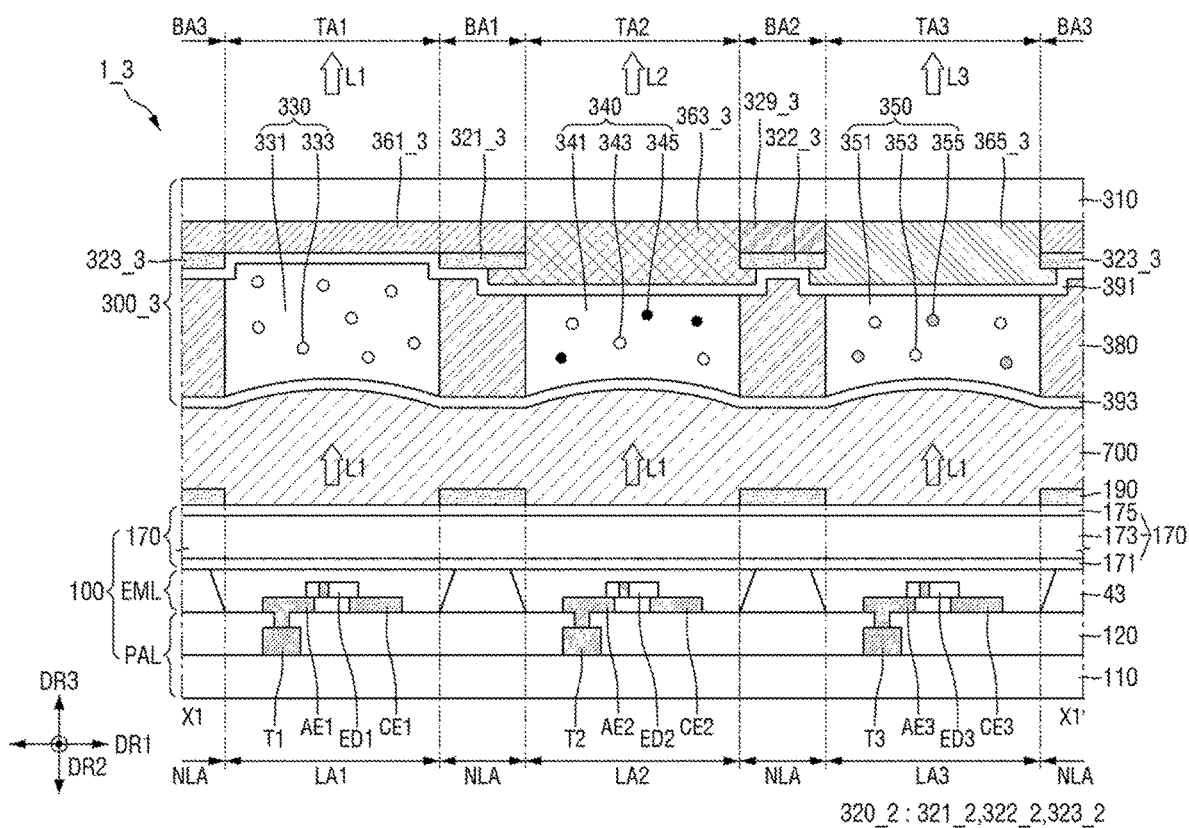

FIGS. 29 and 30 are schematic cross-sectional views of display devices according to various exemplary embodiments.

Referring to FIG. 29, a second display substrate 300_2 of a display device 1_2 according to some embodiments may further include color patterns 329_2 disposed in (or on) the light blocking area BA and disposed between the second base 310 and a light blocking member 320_2. The second display substrate 300_2 is different from the second display substrate 300 in that it further includes the color patterns 329_2. Hereinafter, a redundant description will be omitted, and differences will be mainly described.

The second display substrate 300_2 may include color patterns 329_2 disposed in the light blocking area BA on one surface of the second base 310. The color patterns 329_2 may be formed in substantially the same pattern as the portions of the light blocking member 320_2, and may be disposed between the portion of the light blocking member 320_2 and the second base 310. For instance, in some embodiments, the color patterns 329_2 may be disposed in the first light blocking area BA1, the second light blocking area BA2, the third light blocking area BA3, the fourth light blocking area BA4, the fifth light blocking area BA5, the sixth light blocking area BA6, and the seventh light blocking area BA7. The thicknesses of the color patterns 329_2 may be greater than the thicknesses of the various portions of the light blocking member 320_2, but exemplary embodiments are not limited thereto.

The color pattern 329_2 may absorb a portion of light flowing into the second display substrate 300_2 from the outside of the display device 1_2 to reduce reflected light due to external light. Accordingly, the display device 1_2 may reduce the distortion of color due to external light. In some embodiments, the color pattern 329_2 may include a blue colorant, such as a blue dye and/or a blue pigment. For instance, the color pattern 329_2 may be made of the same material as the first color filter 361.

Since the color pattern 329_2 may include the same material as the first color filter 361, in some embodiments, the first color filter 361 may be integrated with the color pattern 329_2.

Referring to FIG. 30, in a second display substrate 300_3 according to an embodiment, a first color filter 361_3 may be integrated with a color pattern 329_3. As such, both sides of the first color filter 361_3 may be located in the light blocking area BA. The second display substrate 300_3 is different from the second display substrate 300_2 in that the first color filter 361_3 is integrated with a portion of the color pattern 329_3. Hereinafter, a description overlapping that described with reference to FIG. 29 will be omitted, and differences will be mainly described.

In the second display substrate 300_3 according to an embodiment, since the color pattern 329_3 includes the same material as the first color filter 361_3, the color pattern 329_3 may absorb a portion of light introduced from the outside to reduce reflected light due to external light. In this case, the thickness of the first color filter 361_3 may be substantially the same as the thickness of the color pattern 329_3. In some embodiments, the first color filter 361_3 may be formed simultaneously with the color pattern 329_3. Accordingly, one process step may be omitted in the process of manufacturing the second display substrate 300_3, thereby improving production efficiency.

The first color filter 361_3 may be disposed in the first light transmitting area TA1 and may also be disposed in the light blocking areas BA, for example, the first light blocking area BA1 and the third light blocking area BA3, located at both sides of the first color filter 361_3. Further, the first color filter 361_3 may be in direct contact with color filters disposed in the neighboring light transmitting areas TA, for example, a second color filter 363_3 disposed in the second light transmitting area TA2 and a third color filter 365_3 disposed in the third light transmitting area TA3. Unlike the second display substrate 300, the first color filter 361_3 may be in contact with the second color filter 363_3 and the third color filter 365_3 at a boundary between the light blocking area BA and the light transmitting area TA without being spaced apart from the second color filter 363_3 and the third color filter 365_3.

Further, since the first color filter 361_3 is integrated with the color pattern 329_3, some of the portions of the light blocking member 320_3 disposed on the color pattern 329_3 may be disposed on the first color filter 361_3. For example, in the case of the second light blocking member 322_3 disposed in the second light blocking area BA2, the second light blocking member 322_3 may be disposed between the second color filter 363_3 and the color pattern 329_3 and between the third color filter 365_3 and the color pattern 329_3. For instance, in the second light blocking area BA2, the color pattern 329_3, the second light blocking member 322_3, and the second color filter 363_3 or the third color filter 365_3 may be sequentially disposed based on one surface of the second base 310.

In contrast, in the first light blocking area BA1 and the third light blocking area BA3 in which a portion of the first color filter 361_3 is disposed, the first light blocking member 321_3 or the third light blocking member 323_3 may be disposed between the first color filter 361_3 and the second color filter 363_3 or between the first color filter 361_3 and the third color filter 365_3. For example, in the first light blocking area BA1, the first color filter 361_3, the first light blocking member 321_3, and the second color filter 363_3 may be sequentially disposed based on one surface of the second base 310, and in the third light blocking area BA3, the first color filter 361_3, the third light blocking member 323_3, and the third color filter 365_3 may be sequentially disposed based on one surface of the second base 310. In this configuration, since the first color filter 361_3 is integrated with the color pattern 329_3, the first color filter 361_3 and the color pattern 329_3 may be formed in the same process, and the light blocking members 320_3 may be formed in a subsequent process.

As described above, in some embodiments, the first color filter 361, the second color filter 363, and the third color filter 365 may not be disposed in the seventh light blocking area BA7. For example, the first color filter 361, the second color filter 363, and the third color filter 365 disposed in the first row RT1 may be spaced apart from the first color filter 361, the second color filter 363, and the third color filter 365 disposed in the second row RT2. In this case, the partition wall 380 disposed in the seventh light blocking area BA7 may not overlap the first color filter 361, the second color filter 363, and the third color filter 365.

Figure 31:
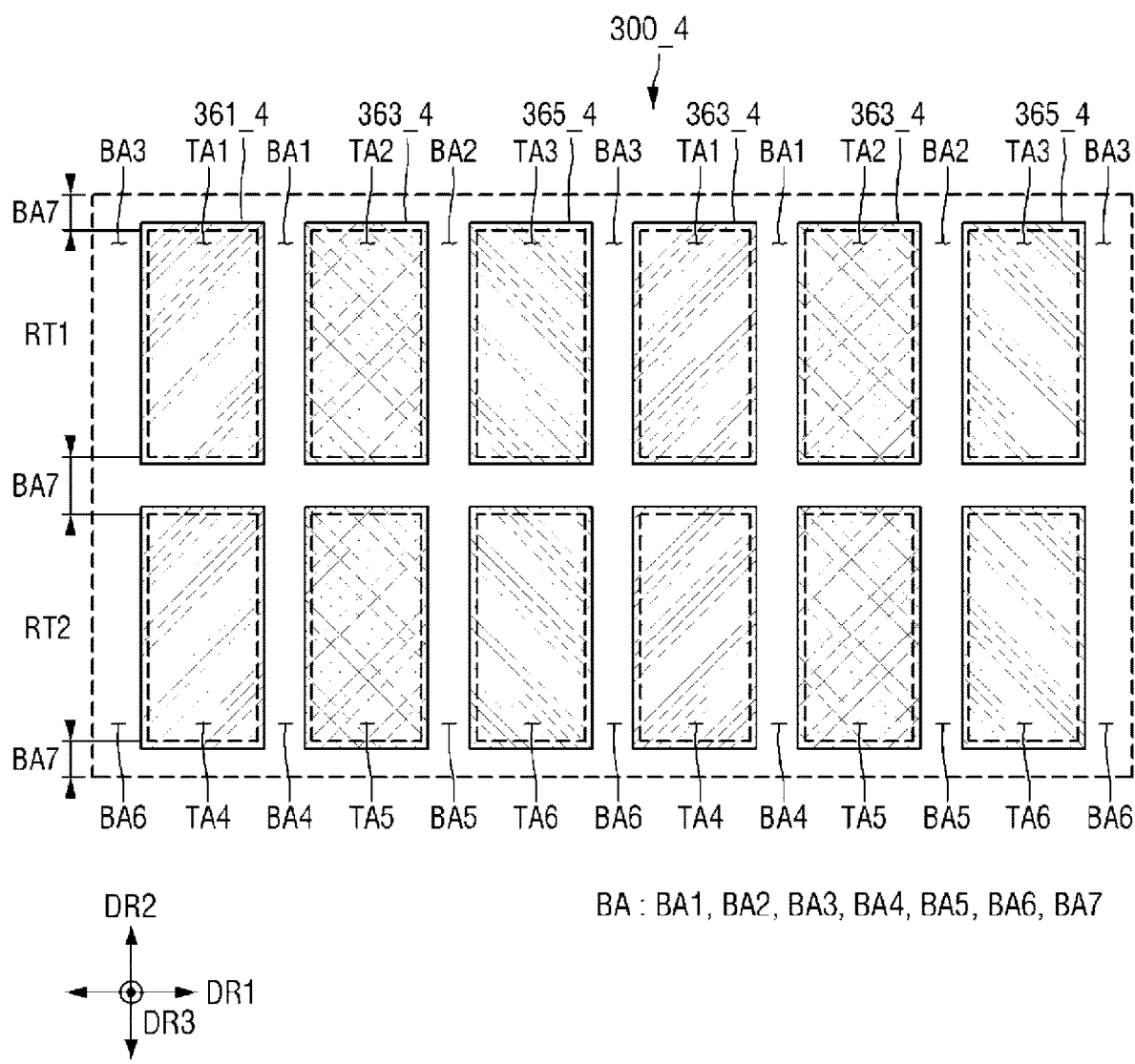
FIG. 31 is a schematic plan view showing an arrangement structure of a first color filter, a second color filter, and a third color filter in a second display substrate according to some exemplary embodiments.

FIG. 31 is a schematic plan view showing an arrangement structure of a first color filter, a second color filter, and a third color filter in a second display substrate according to some exemplary embodiments.

Referring to FIG. 31, according to an embodiment, a first color filter 361_4, a second color filter 363_4, and a third color filter 365_4 may be disposed corresponding to each light transmitting area TA without extending in the second direction DR2 to an adjacent light transmitting area TA. For instance, the first color filter 361_4, the second color filter 363_4, and the third color filter 365_4 may be arranged in an island shape. Accordingly, the color filters 361_4, 363_4, and 365_4 may be partially removed on the seventh light blocking area BA7 of the second base 310, and may be spaced apart from the color filters 361_4, 363_4, and 365_4 disposed in the light-transmitting area TA neighboring in the second direction DR2. The second display substrate 300_4 according to some embodiments is different from the second display substrate 300 in that the first color filter 361_4, the second color filter 363_4, and the third color filter 365_4 are arranged in an island shape. In the following description, a redundant description will be omitted, and differences will be mainly described.

According to an embodiment, the first color filter 361_4, the second color filter 363_4, and the third color filter 365_4 may be disposed corresponding to the first light transmitting area TA1 or the fourth light transmitting area TA4, the second light transmitting area TA2 or the fifth light transmitting area TA5, and the third light transmitting area TA3 or the sixth light transmitting area TA6, respectively. However, since the first color filter 361_4, the second color filter 363_4, and the third color filter 365_4 may have a larger area than each light transmitting area TA in which they are disposed, some areas may be disposed in the light blocking area BA. An area in which the color filters 361_4, 363_4, and 365_4 are not disposed may be formed in the seventh light blocking area BA7, and the partition wall 380 disposed in the seventh light blocking area BA7 may extend in the first direction DR1.

In some embodiments, the light transmission pattern 330, the first wavelength conversion pattern 340, and the second wavelength conversion pattern 350 corresponding to each light transmitting area TA may also be arranged in an island shape similarly to the color filters 361_4, 363_4, and 365_4.

Figure 32:
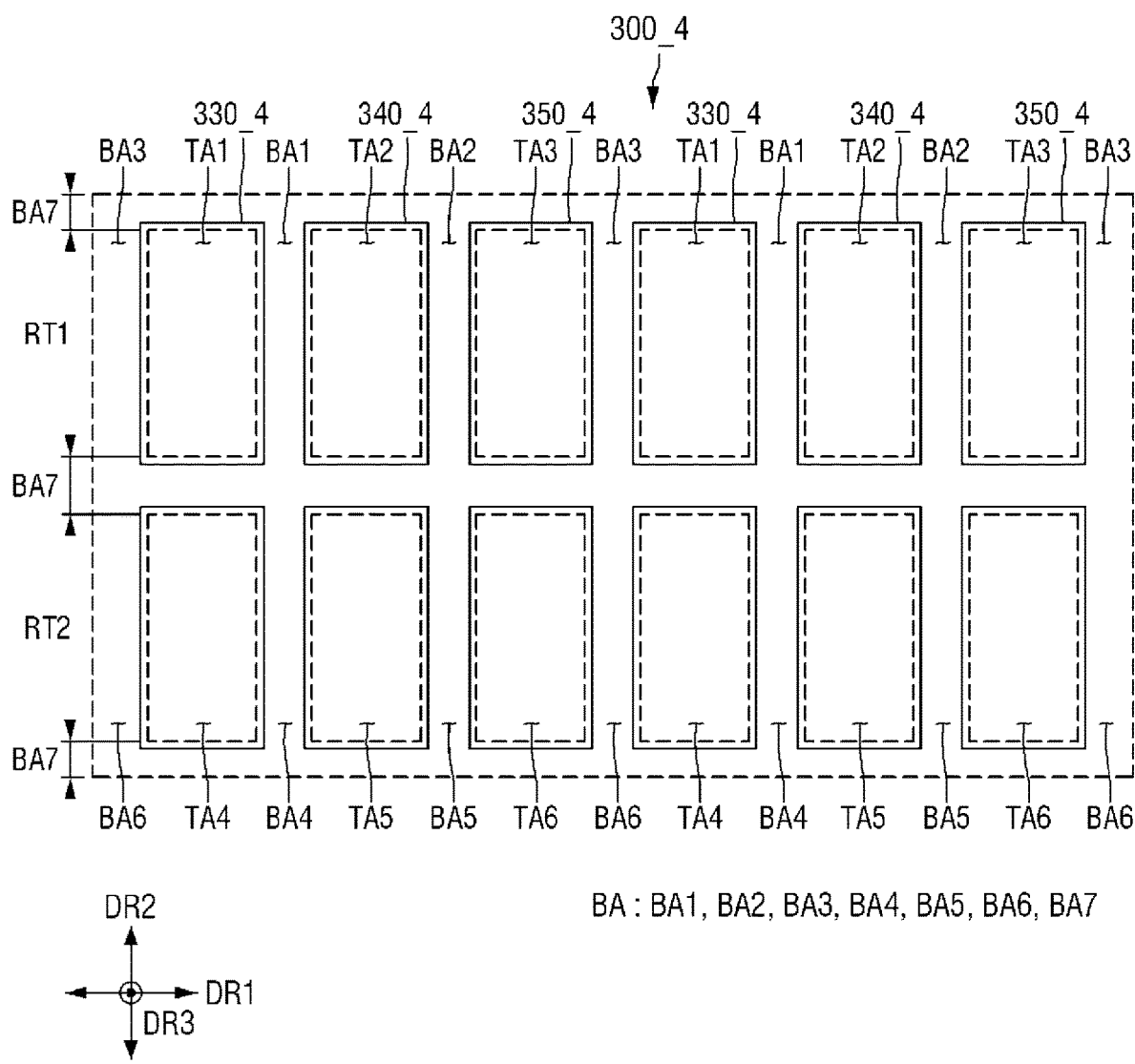
FIG. 32 is a schematic plan view showing an arrangement structure of a first wavelength conversion pattern, a second wavelength conversion pattern, and a light transmission pattern in a second display substrate according to some exemplary embodiments.

FIG. 32 is a schematic plan view showing an arrangement structure of a first wavelength conversion pattern, a second wavelength conversion pattern, and a light transmission pattern in a second display substrate according to some exemplary embodiments.

Referring to FIG. 32, in the second display substrate 300_4 according to an embodiment, a light transmission pattern 330_4, a first wavelength conversion pattern 340_4, and a second wavelength conversion pattern 350_4 may also be disposed corresponding to each light transmitting area TA without extending in the second direction DR2. For instance, the light transmission pattern 330_4, the first wavelength conversion pattern 340_4, and the second wavelength conversion pattern 350_4 may also be arranged in an island shape. Since the arrangement of the light transmission pattern 330_4, the first wavelength conversion pattern 340_4, and the second wavelength conversion pattern 350_4 described with reference to FIG. 32 is substantially similar to the structure of the color filters 361_4, 363_4, and 365_4 described with reference to FIG. 31, a detailed description thereof will be omitted.

In some embodiments, the plurality of color filters 361, 363, and 365 may be disposed to be in contact with each other without being spaced apart from each other.

Figure 33:
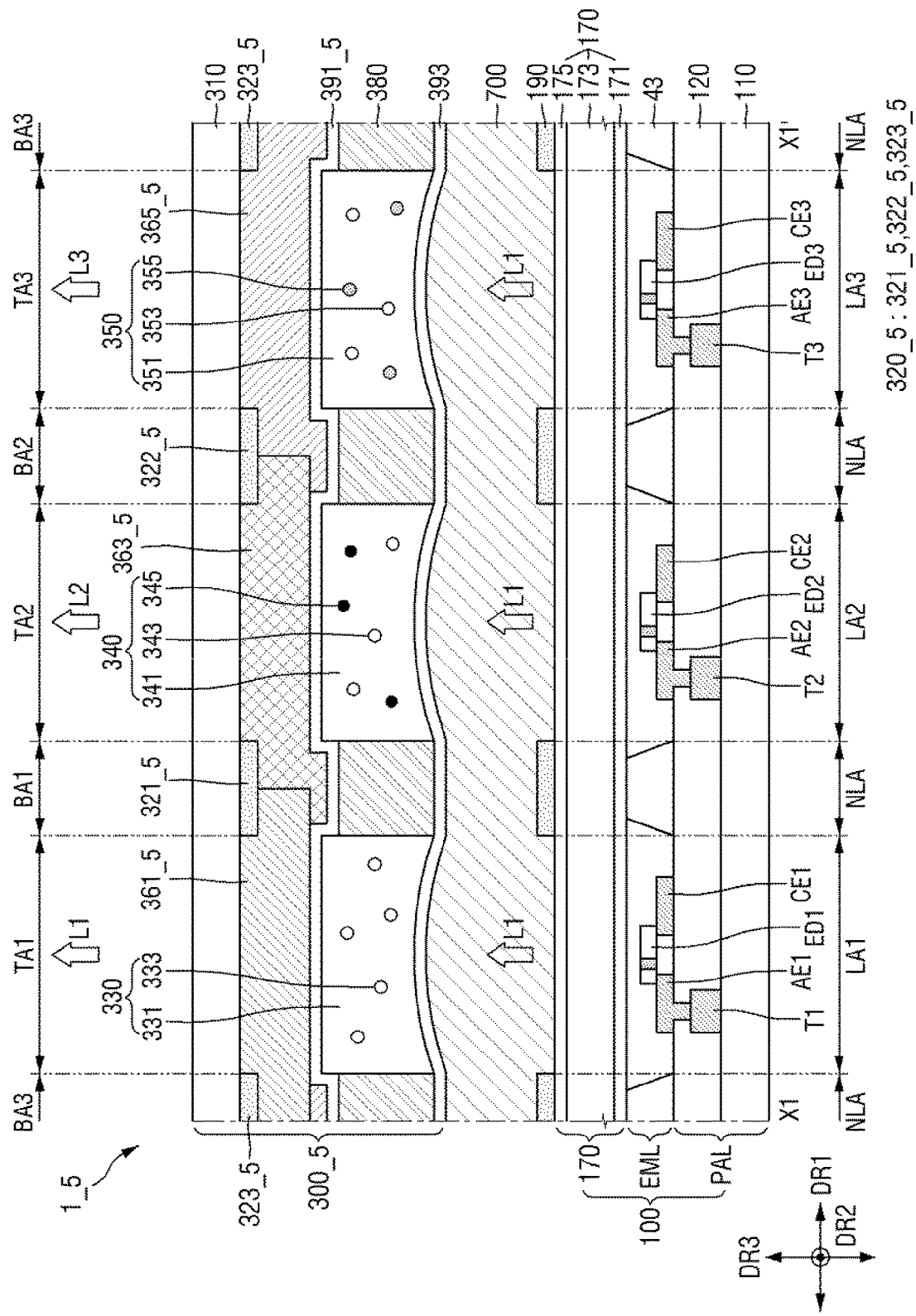
FIG. 33 is a schematic cross-sectional view of a display device according to some exemplary embodiments.

FIG. 33 is a schematic cross-sectional view of a display device according to some exemplary embodiments.

Referring to FIG. 33, in a second display substrate 300_5 according to an embodiment, a plurality of color filters 361_5, 363_5, and 365_5 may overlap each other without being spaced apart from each other. Accordingly, any one color filter may have some areas located on another color filter. The second display substrate 300_5 is different from the second display substrate 300 in that a plurality of color filters 361_5, 363_5, and 365_5 are in contact with each other. In the following description, a redundant description will be omitted, and differences will be mainly described.

As shown in FIG. 33, any one color filter, for example, a first color filter 361_5 may be formed to partially overlap other color filters, e.g., a second color filter 363_5 and a third color filter 365_5. The third color filter 365_5 is disposed on one side of the first color filter 361_5, and the second color filter 363_5 is disposed on the other side of the first color filter 361_5. One side of the second color filter 363_5 is disposed on the first color filter 361_5, and the third color filter 365_5 is disposed on the other side of the second color filter 363_5. One side of the third color filter 365_5 is disposed on the second color filter 363_5, and the other side of the third color filter 365_5 is disposed on the first color filter 361_5.

The plurality of color filters 361_5, 363_5, and 365_5 may be in contact with each other in an area where they overlap each other without being spaced apart from each other, such as in a portion of a light blocking area BA. Accordingly, the first capping layer 391_5 may be disposed to cover the upper surfaces of the first color filter 361_5, the second color filter 363_5, and the third color filter 365_5 without being in contact with the various portions of the light blocking member 320_5. Such a structure may be implemented by forming the color filters 361_5, 363_5, and 365_5 so as not to be spaced apart from each other while sequentially forming the respective color filters during a process of manufacturing the second display substrate 300_5.

Figure 34:
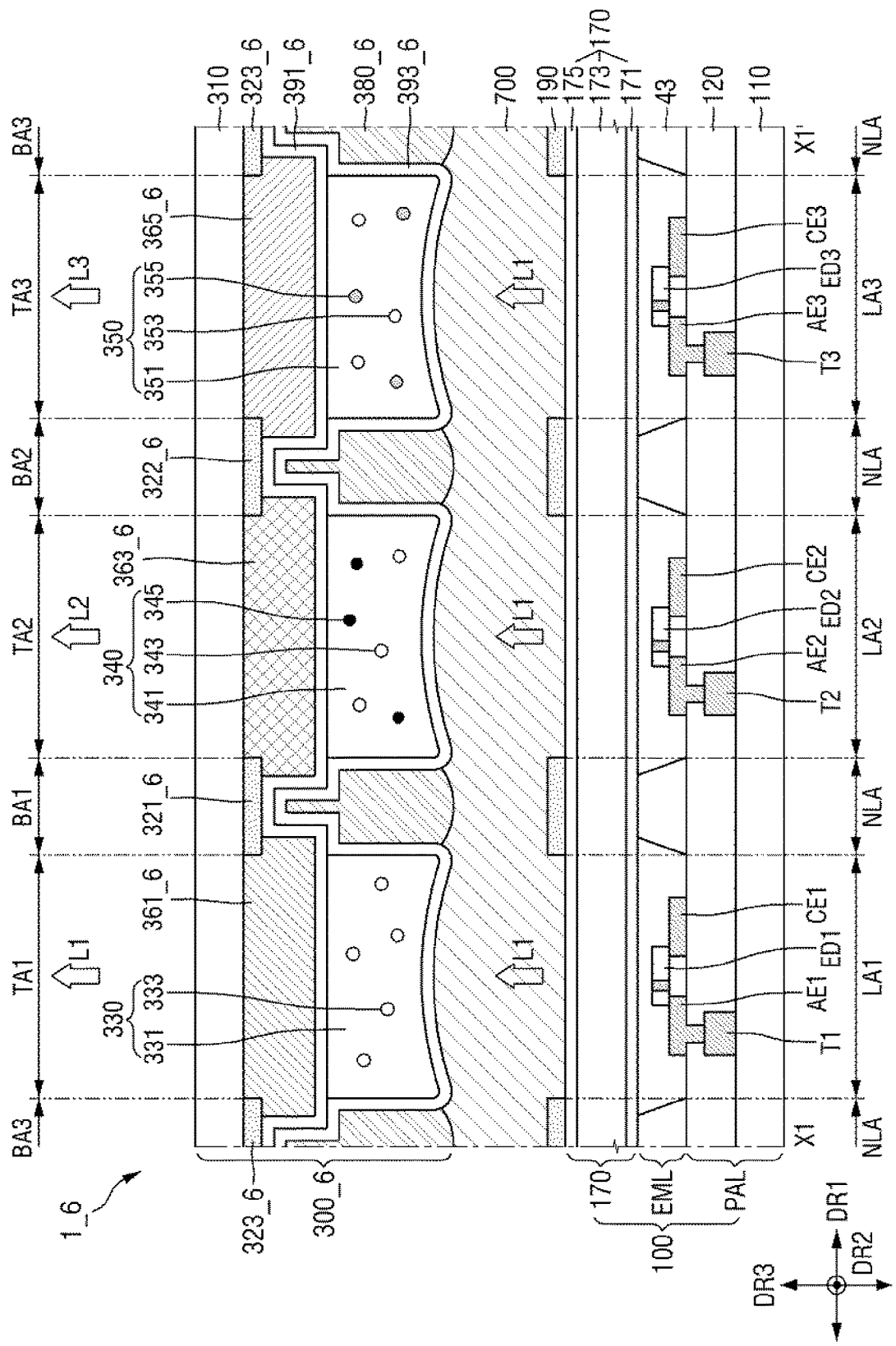
FIG. 34 is a schematic cross-sectional view of a display device according to some exemplary embodiments.

FIG. 34 is a schematic cross-sectional view of a display device according to some exemplary embodiments.

Referring to FIG. 34, in a second display substrate 300_6 of a display device 1_6 according to an embodiment, a light transmission pattern 330_6 and wavelength conversion patterns 340_6 and 350_6 may be formed through a photoresist process, not an inkjet process. Accordingly, in the second display substrate 300_6, a second capping layer 393_6 may be disposed under a partition wall 380_6. When the light transmission patterns 330_6 and the wavelength conversion patterns 340_6 and 350_6 are formed by a photoresist process, the second capping layer 393_6 may be formed before the process of forming the partition wall 380_6.

The second capping layer 393_6 may be disposed to cover the light transmission pattern 330_6 and the wavelength conversion patterns 340_6 and 350_6. The second capping layer 393_6 may be in direct contact with the light transmission patterns 330_6, the wavelength conversion patterns 340_6 and 350_6, and the partition walls 380_6. In the process of manufacturing the second display substrate 300_6, the light transmission patterns 330_6 and the wavelength conversion patterns 340_6 and 350_6 are formed, and then the second capping layer 393_6 is formed to cover them. Since the light transmission patterns 330_6 and the wavelength conversion patterns 340_6 and 350_6 may be disposed to be spaced apart from each other based on the light blocking area BA, as shown FIG. 34, the partition wall 380_6 may be disposed in an area overlapping the light blocking area BA. Unlike as described in association with FIG. 8, in the second display substrate 300_6, the partition wall 380_6 may be disposed on the second capping layer 393_6, which may also directly contact the first capping layer 391_6.

Even when the light transmission pattern 330_6 and the wavelength conversion patterns 340_6 and 350_6 are formed by a photoresist process, at least one surface, for example, one surface facing the first display substrate 100 may include a curved surface. Accordingly, the second capping layer 393_6 may have a curved shape along the curved surface of the light transmission pattern 330_6 and the wavelength conversion patterns 340_6 and 350_6. Since the other members are the same (or substantially the same) as those described above with reference to at least FIG. 8, a detailed description thereof will be omitted.

According to an embodiment, the first display substrate 100 of the display device 1 does not necessarily emit only the light L1 of the first color, but may be configured to emit the light L2 of the second color and/or the light L3 of the third color.

Figure 35:
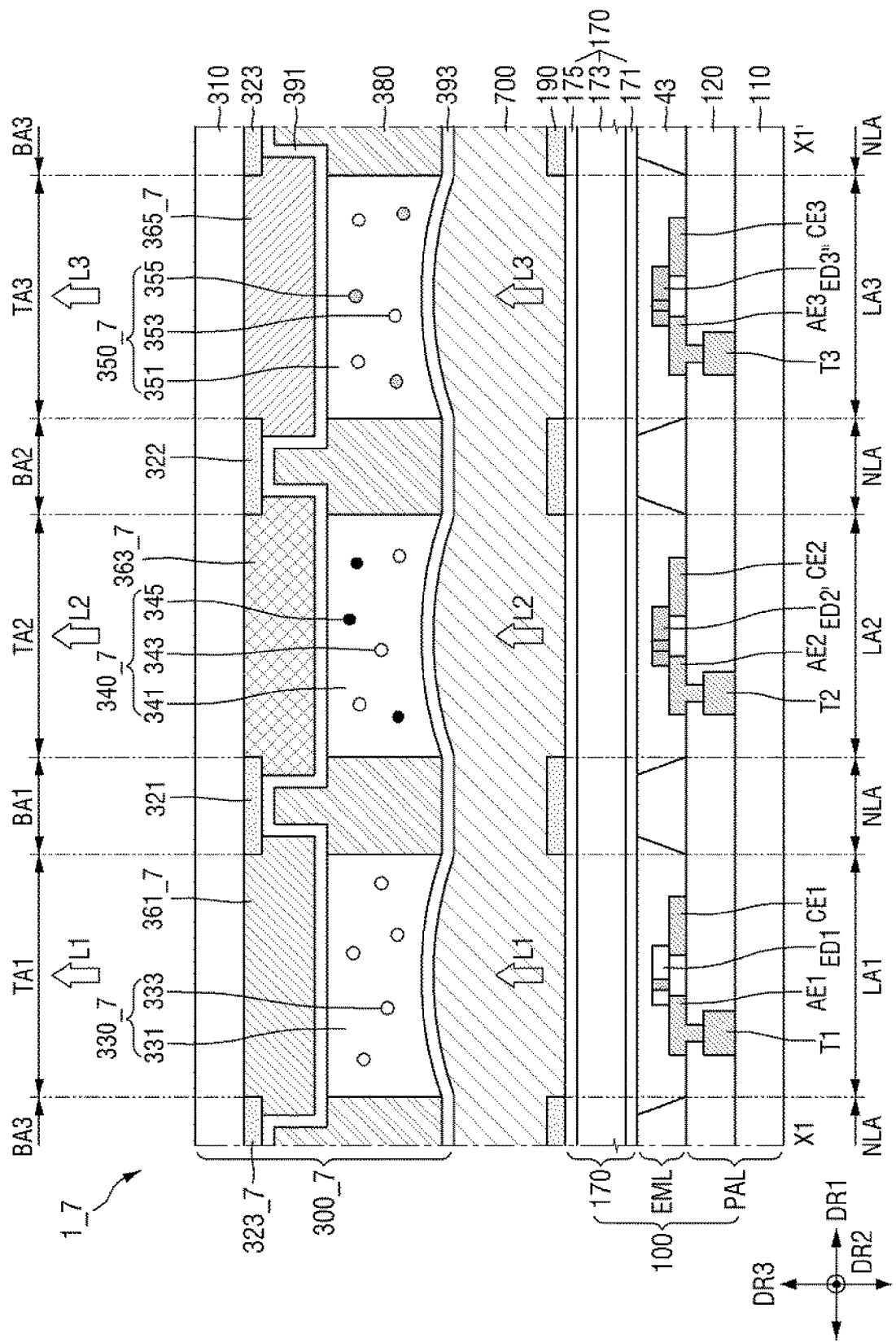
FIGS. 35 and 36 are schematic cross-sectional views of display devices according to various exemplary embodiments.
Figure 36:
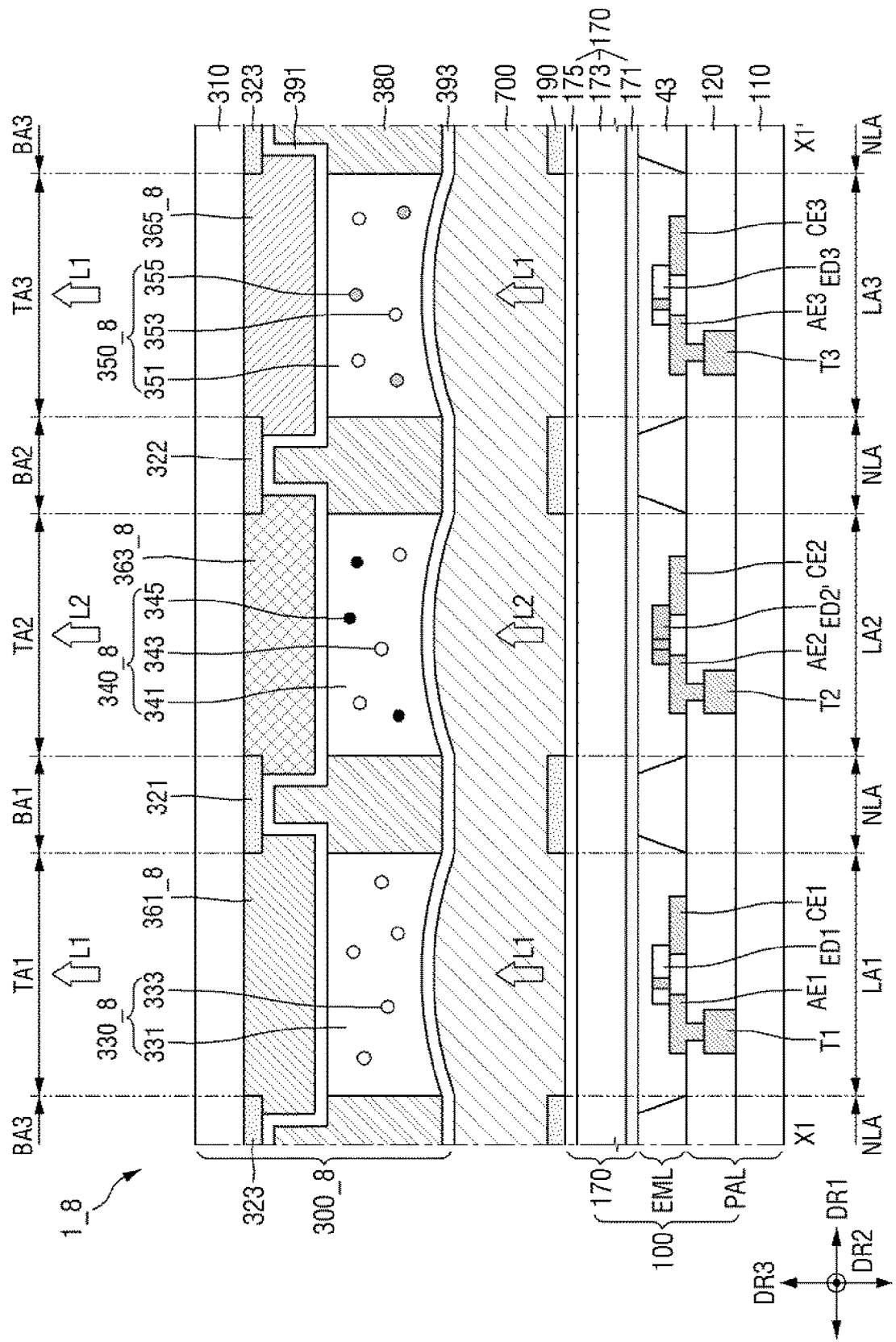

FIGS. 35 and 36 are schematic cross-sectional views of display devices according to various exemplary embodiments.

Referring to FIG. 35, a first display substrate 100_7 of a display device 1_7 according to an embodiment may emit light having a different color for each light emitting area LA. For instance, in the first display substrate 100_7, the first light emitting element ED1 disposed in the first light emitting area LA1 may emit the light L1 of the first color, the second light emitting element ED2' disposed in the second light emitting area LA2 may emit the light L2 of the second color, and the third light emitting element ED3' disposed in the third light emitting area LA3 may emit the light L3 of the third color. Accordingly, the light transmission pattern 330_7 and the wavelength conversion patterns 340_7 and 350_7 disposed in the respective light transmitting areas TA may be provided with light of different colors. The light L1 of the first color may be incident on the light transmission pattern 330_7 disposed in the first light transmitting area TA1, the light L2 of the second color may be incident on the first wavelength conversion pattern 340_7 disposed in the second light transmitting area TA2, and the light L3 of the third color may be incident on the second wavelength conversion pattern 350_7 disposed in the third light transmitting area TA3.

As described above, each of the sub-pixels PXn of the first display substrate 100_7 may include different light emitting elements 30 from each other. The light emitting element 30 may emit light of different colors according to the kind of its active layer 33. According to an exemplary embodiment, in the first display substrate 100_7, the light emitting element 30 of the first sub-pixel PX1 may emit light L1 of the first color having a center wavelength band of 450 nm to 495 nm, the light emitting element 30 of the second sub-pixel PX2 may emit light L2 of the second color having a center wavelength band of 495 nm to 570 nm, and the light emitting element 30 of the third sub-pixel PX3 may emit light L3 of the third color having a center wavelength band of 620 nm to 750 nm. Accordingly, the light L1 of the first color, the light L2 of the second color, and the light L3 of the third color may emitted from the first light emitting area LA1, the second light emitting area LA2, and the third light emitting area LA3 of the first display substrate 100_7, respectively.

In this case, in the first wavelength conversion pattern 340_7 and the second wavelength conversion pattern 350_7 disposed in the second light emission area TA2 and the third light emission area TA3, optical shifts due to the wavelength conversion materials 345_7 and 355_7 may not occur. Only light of a color transmitted by the color filters 361_7, 363_7, and 365_7, may be incident on the color filters 361_7, 363_7, and 365_7 disposed in the respective light transmitting areas TA, and the color purity of the display device 1_7 may be further improved.

According to some exemplary embodiments, the display device 1 may not necessarily emit light of a different color for each light emitting area LA. In some embodiments, some light emitting areas LA may emit light of the same color.

Referring to FIG. 36, in a first display substrate 100_8 of a display device 1_8, the first light emitting element ED1 disposed in the first light emitting area LA1 may emit the light L1 of the first color, the second light emitting element ED2' disposed in the second light emitting area LA2 may emit the light L2 of the second color, and the third light emitting element ED3 disposed in the third light emitting area LA3 may emit the light L1 of the first color. As such, the light transmission pattern 330_8 and the wavelength conversion patterns 340_8 and 350_8 disposed in the respective light transmitting areas TA may be provided with light of at least two different colors. The light L1 of the first color may be incident on the light transmission pattern 330_8 disposed in the first light transmitting area TA1, the light L2 of the second color may incident on the first wavelength conversion pattern 340_8 disposed in the second light transmitting area TA2, and the light L1 of the first color may be incident on the second wavelength conversion pattern 350_8 disposed in the third light transmitting area TA3. In this case, only the light L1 of the first color incident on the second wavelength conversion pattern 350_8 may cause optical shifts by the second wavelength conversion material 355. Since the other members are the same as those described above, a detailed description thereof will be omitted.

As described above, the first display substrate 100 does not necessarily include an inorganic light emitting diode, and may include a different kind of self-light emitting element. In some embodiments, the first display substrate 100 may be an organic light emitting diode (OLED) or a liquid crystal display (LCD).

Hereinafter, a case where the first display substrate 100 is an organic light emitting diode (OLED) or a liquid crystal display (LCD) will be described with reference to various drawings.

Figure 37:
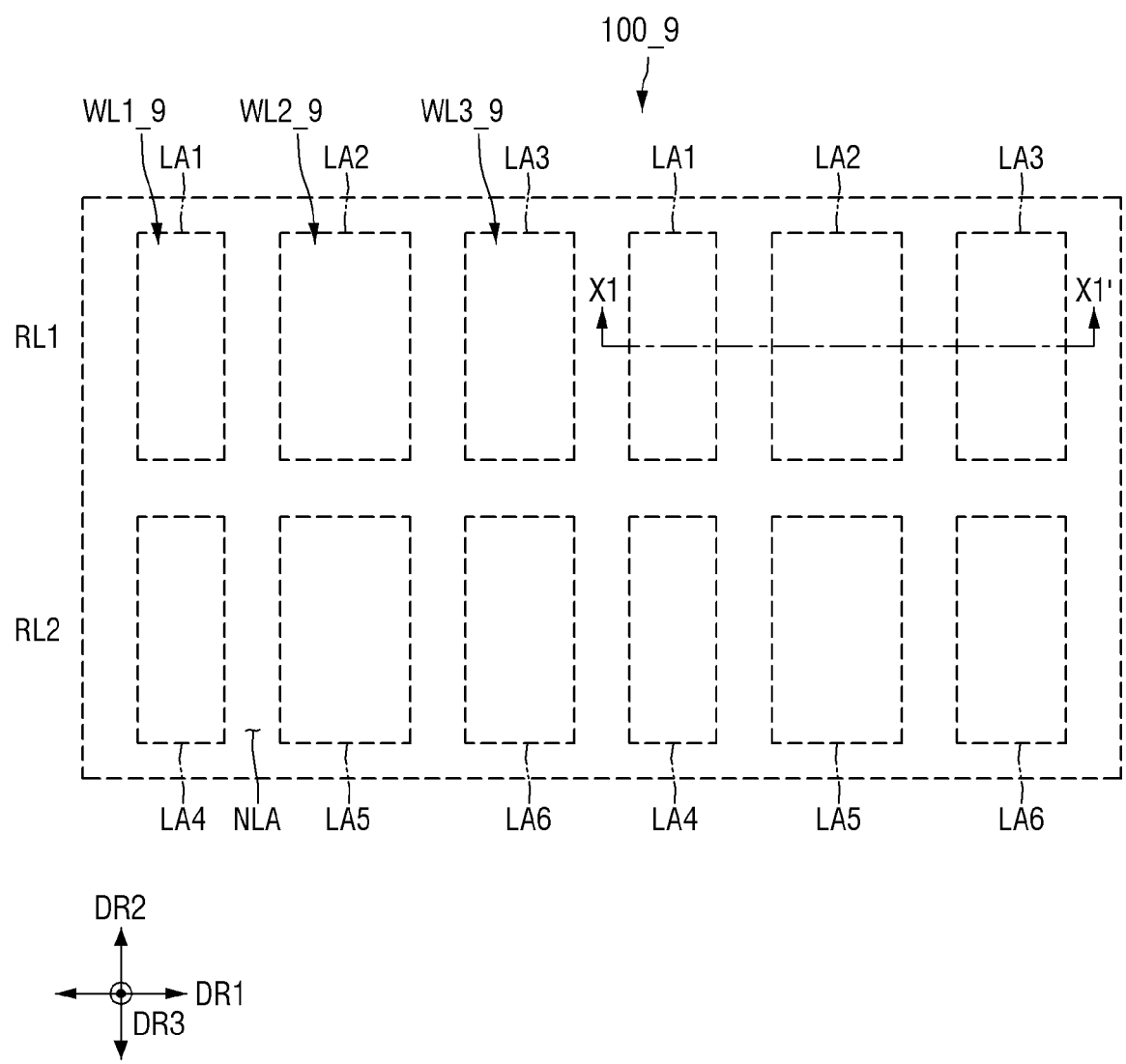
FIG. 37 is a schematic plan view showing a display area of a first display substrate according to some exemplary embodiments.
Figure 38:
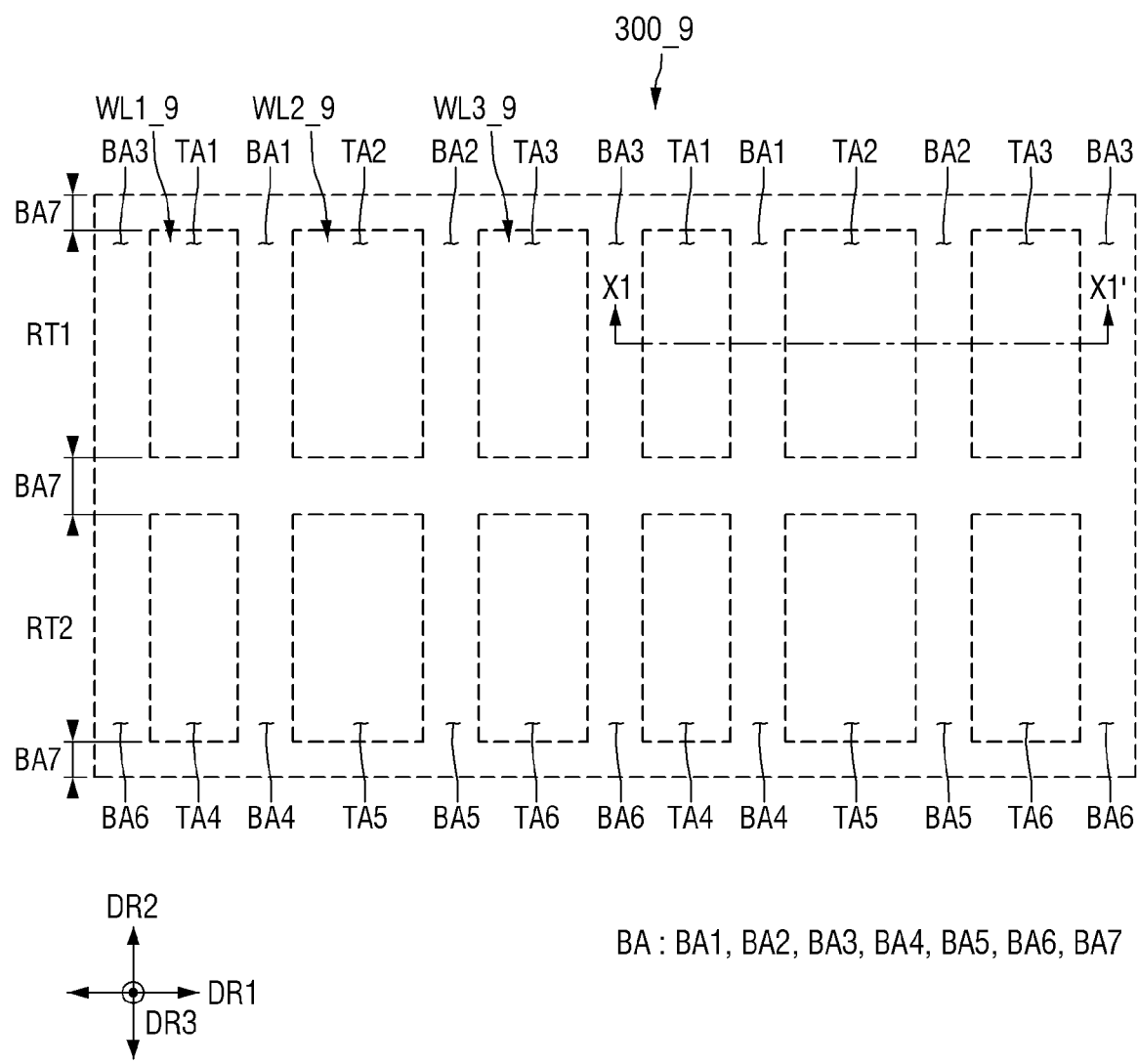
FIG. 38 is a schematic plan view showing a display area of a second display substrate according to some exemplary embodiments.
Figure 39:
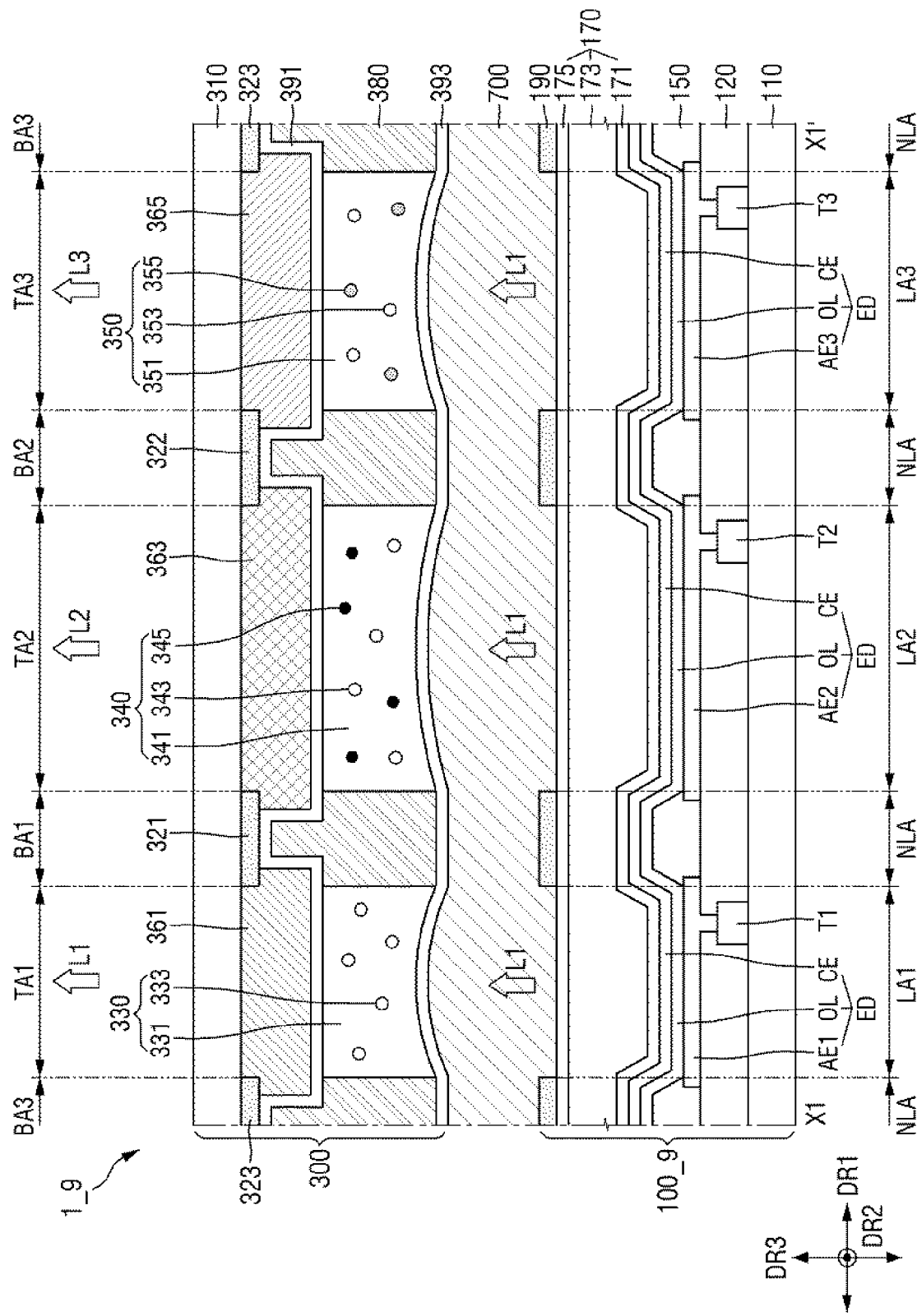
FIG. 39 is a cross-sectional view of the display device taken along sectional line X1-X1' in FIGS. 37 and 38 according to some exemplary embodiments.
Figure 40:
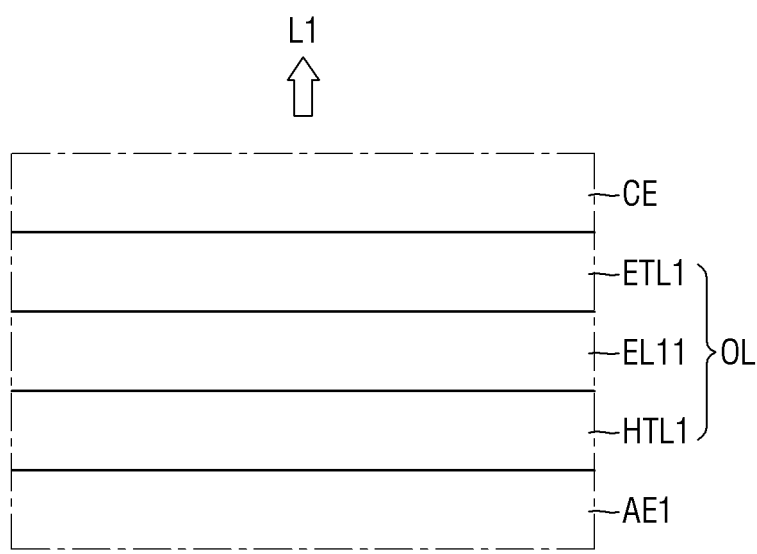
FIG. 40 is an enlarged cross-sectional view of portion Q in FIG. 39 according to some exemplary embodiments.

FIG. 37 is a schematic plan view showing a display area of a first display substrate according to some exemplary embodiments. FIG. 38 is a schematic plan view showing a display area of a second display substrate according to some exemplary embodiments. FIG. 39 is a cross-sectional view of the display device taken along sectional line X1-X1' in FIGS. 37 and 38 according to some exemplary embodiments. FIG. 40 is an enlarged cross-sectional view of portion Q in FIG. 39 according to some exemplary embodiments.

FIGS. 37 to 40 illustrate a case where a display device 1_9 includes an organic light emitting diode (OLED) as a first display substrate 100_9. FIG. 37 illustrates the display area DA of the first display substrate 100_9 including an organic light emitting layer OL, and FIG. 38 illustrates the display area DA of the second display substrate 300_9 when the first display substrate 100_9 includes the organic light emitting layer OL. In the following description, redundant descriptions will be omitted, and differences, in particular, the organic light emitting layer OL of the first display substrate 100_9 will be described in more detail.

Referring to FIGS. 37 to 40, when the first display substrate 100_9 is an organic light emitting diode (OLED) including the organic light emitting layer OL, the light emitting areas LA of the first display substrate 100_9 may have different widths WL_9 from each other.

In some embodiments, the first width WL1_9 of the first light emitting area LA1 measured along the first direction DR1 may be narrower than the width WL2_9 of the second light emitting area LA2 measured along the first direction DR1, and may be narrower than the third width WL3_9 of the third light emitting area LA3 measured along the first direction DR1. Further, the second width WL2_9 of the second light emitting area LA2 and the third width WL3_9 of the third light emitting area LA3 may also be different from each other. Illustratively, the second width WL2_9 of the second light emitting area LA2 may be wider than the third width WL3_9 of the third light emitting area LA3. In some embodiments, the area of the first light emitting area LA1 may be smaller than the area of the second light emitting area LA2 and may be smaller than the area of the third light emitting area LA3, and the area of the second light emitting area LA2 may be larger than the area of the third light emitting area LA3.

However, exemplary embodiments are not limited thereto, and in some cases, the area of the second light emitting area LA2 may be smaller than the area of the third light emitting area LA3. Although it is illustrated that in the first display substrate 100_9, the first light emitting area LA1 has the narrowest width, and the second light emitting area LA2 has a wider width than the third light emitting area LA3, exemplary embodiments are not limited thereto. Besides this difference, a description of the light emitting area LA of the first display substrate 100_9 is the same as that described above with reference to at least FIGS. 3 and 4.

The light transmitting area TA of the second display substrate 300_9 may be formed to substantially correspond to the light emitting area LA of the first display substrate 100_9. When the first display substrate 100_9 is an organic light emitting diode (OLED) including the organic light emitting layer OL, the light transmitting areas TA of the second display substrate 300_9 may have different widths WT_9 from each other.

In some embodiments, the widths WT_9 of the first light transmitting area TA1, the second light transmitting area TA2, and the third light transmitting area TA3 measured in the first direction DR1 may have a similar relationship to the widths WL_9 of the first light emitting area LA1, the second light emitting area LA2, and the third light emitting area LA3 measured in the first direction DR1. For example, the first width WT1_9 of the first light transmitting area TA1 measured along the first direction DR1 may be narrower than the second width WT2_9 of the second light transmitting area TA2 measured along the first direction DR1, and may be narrower than the third width WT3_9 of the third light transmitting area TA3 measured along the first direction DR1. Further, the second width WT2_9 of the second light transmitting area TA2 and the third width WT3_9 of the third light transmitting area TA3 may also be different from each other. Illustratively, the second width WT2_9 of the second light transmitting area TA2 may be wider than the third width WT3_9 of the third light transmitting area TA3.

In some embodiments, the area of the first light transmitting area TA1 may be smaller than the area of the second light transmitting area TA2 and may be smaller than the area of the third light transmitting area TA3, and the area of the second light transmitting area TA2 may be larger than the area of the third light transmitting area TA3. The fourth light transmitting area TA4, the fifth light transmitting area TA5, and the sixth light transmitting area TA6, which are adjacent to each other along the second direction DR1, may be substantially the same as the first light transmitting area TA1, the second light transmitting area TA2, and the third light transmitting area TA3 in terms of width, area, and structure of components in area, color of light emitted to the outside of the display device 1_9.

The first display substrate 100_9 may include an organic light emitting layer OL and may have an arrangement structure different from that of the various previously described embodiments, such as those embodiments previously described in association with at least FIG. 8. According to an embodiment, the first display substrate 100_9 may include first electrodes AE1, AE2, and AE3, a second electrode CE, and an organic light emitting layer OL disposed therebetween, and may further include a pixel defining layer 150 disposed in the non-display area NDA of the first display substrate 100_9.

As shown in FIG. 39, the first electrodes AE1, AE2, and AE3 may be disposed on the via layer 120 of the first display substrate 100_9. The first electrode AE1 disposed in the first light emitting area LA1 may be located in the first light emitting area LA1, but at least a portion thereof may extend to (or into) the non-light emitting area NLA. The first electrode AE2 disposed in the second light emitting area LA2 may be located in the second light emitting area LA2, but at least a portion thereof may extend to (or into) the non-light emitting area NLA. The first electrode AE3 disposed in the third light emitting area LA3 may be located in the third light emitting area LA3, but at least a portion thereof may extend to (or into) the non-light emitting area NLA. The first electrode AE1 disposed in the first light emitting area LA1 may be connected to a first switching element T1 through the via layer 120, the first electrode AE2 disposed in the second light emitting area LA2 may be connected to a second switching element T2 through the via layer 120, and the first electrode AE3 disposed in the third light emitting area LA3 may be connected to a third switching element T3 through the via layer 120.

In some embodiments, the widths or areas of the first electrodes AE1, AE2, and AE3 may be different from one another. Illustratively, the width of the first electrode AE1 disposed in the first light emitting area LA1 may be smaller than the width of the first electrode AE2 disposed in the second light emitting area LA2, and the width of the first electrode AE2 disposed in the second light emitting area LA2 may be larger than the width of the first electrode AE1 disposed in the first light emitting area LA1 and may be larger than the width of the first electrode AE3 disposed in the third light emitting area LA3. In some embodiments, the area of the first electrode AE1 disposed in the first light emitting area LA1 may be smaller than the area of the first electrode AE3 disposed in the third light emitting area LA3. However, exemplary embodiments are not limited thereto. The area of the first electrode AE1 disposed in the first light emitting area LA1 may be smaller than the area of the first electrode AE2 disposed in the second light emitting area LA2, and the area of the first electrode AE3 disposed in the third light emitting area LA3 may be larger than the area of the first electrode AE2 disposed in the second light emitting area LA2 and may be larger than the first electrode AE1 disposed in the first light emitting area LA1. In some cases, the widths or areas of the first electrodes AE1, AE2, and AE3 may be substantially the same as one another.

Each of the first electrodes AE1, AE2, AE3 may be a reflective electrode. In this case, each of the first electrodes AE1, AE2, AE3 may be a metal layer containing a metal, such as at least one of Ag, Mg, Al, Pt, Pd, Au, Ni, Nd, Ir, and Cr. In some embodiments, each of the first electrodes AE1, AE2, and AE3 may further include a metal oxide layer deposited on the metal layer. In an exemplary embodiment, each of the first electrodes AE1, AE2, and AE3 may have a double layer structure of ITO/Ag, Ag/ITO, ITO/Mg, or ITO/MgF, or a multi-layer structure of ITO/Ag/ITO, but exemplary embodiments are not limited thereto.

A pixel defining layer 150 may be disposed on the first electrodes AE1, AE2, and AE3. The pixel defining layer 150 may include an opening for exposing the first electrodes AE1, AE2, and AE3, and may define the first light emitting area LA1, the second light emitting area LA2, the third light emitting area LA3, and the non-light emitting area NLA. For instance, the first light emitting area LA1 may be an area of the first electrode AE1 disposed in the first light emitting area LA1, the area being exposed without being covered by the pixel defining layer 150. Similarly, the second light emitting area LA2 may be an area of the first electrode AE2 disposed in the second light emitting area LA2, the area being exposed without being covered by the pixel defining layer 150, and the third light emitting area LA2 may be an area of the first electrode AE3 disposed in the third light emitting area LA3, the area being exposed without being covered by the pixel defining layer 150. The non-light emitting area NLA may be an area where the pixel defining layer 150 is disposed.

In some embodiments, the pixel defining layer 150 may include an organic insulating material, such as at least one of an acrylic resin, an epoxy resin, a phenolic resin, a polyamide resin, a polyimide resin, an unsaturated polyester resin, a polyphenylene ether resin, polyphenylene sulfide resin, and benzocyclobutene (BCB).

In some embodiments, a portion of the pixel defining layer 150 may be disposed to overlap the partition wall 380. Illustratively, as shown in FIGS. 38 and 39, the pixel defining layer 150 may overlap the partition wall 380 disposed in the light blocking area BA.

The organic light emitting layer OL may be disposed on the first electrodes AE1, AE2, and AE3. In some embodiments, the organic light emitting layer OL may have a shape of a continuous layer formed over the plurality of light emitting areas LA1, LA2, LA3, LA4, LA5, and LA6 and the non-light emitting area NLA. The organic light emitting layer OL may emit light, and the light may be provided to the second display substrate 300. In some embodiments, the organic light emitting layer OL may emit light L1 of the first color. A more detailed description of the organic light emitting layer OL will be described later.

The second electrode CE may be disposed on the organic light emitting layer OL. In some embodiments, the second electrode CE may have semi-transmissivity or transmissivity. When the second electrode CE has semi-transmissivity, the second electrode CE may include a single layer or multiple layers of metal, such as at least one of Ag, Mg, Cu, Al, Pt, Pd, Au, Ni, Nd, Ir, Cr, Li, Ca, LiF/Ca, LiF/Al, Mo, and Ti, or any compound or any mixture thereof, for example, a mixture of Ag and Mg. When the thickness of the second electrode CE is several tens to several hundreds of angstroms, the second electrode CE may have semi-transmissivity.

When the second electrode CE has transmissivity, the second electrode CE may include a transparent conductive oxide (TCO). For example, the second electrode CE may include at least one of tungsten oxide ($W_xO_y$), titanium oxide ($TiO_2$), indium tin oxide (ITO), indium zinc oxide (IZO), zinc oxide (ZnO), indium tin zinc oxide (ITZO), and magnesium oxide (MgO), or the like.

In some embodiments, the organic light emitting layer OL may have a structure in which a plurality of layers are stacked.

Referring to FIG. 40, in an embodiment, the organic light emitting layer OL may include a first hole transport layer HTL1 disposed on the first electrode AE1 in the first light emitting area LA1, a first light emitting material layer EL11 disposed on the first hole transport layer HTL1, and a first electron transport layer ETL1 disposed on the first light emitting material layer EL11. The light emitting layer OL may include only one light emitting layer, for example, the first light emitting material layer EL11 as the light emitting layer, and the first light emitting material layer EL11 may be a blue light emitting layer. However, the laminated structure of the light emitting layer OL is not limited to the structure as described in association with FIG. 40.

Referring to FIG. 39 again, a thin film encapsulation layer 170 is disposed on the second electrode CE. The thin film encapsulation layer 170 is commonly disposed in the first light emitting area LA1, the second light emitting area LA2, the third light emitting area LA3, and the non-light emitting area NLA. In some embodiments, the thin film encapsulation layer 170 directly covers the second electrode CE. In some embodiments, a capping layer covering the second electrode CE may be further disposed between the thin film encapsulation layer 170 and the second electrode CE, and in this case, the thin film encapsulation layer 170 may directly cover the capping layer.

In some embodiments, the thin film encapsulation layer 170 may include a first inorganic encapsulation layer 171, an organic encapsulation layer 173, and a second inorganic encapsulation layer 175, which are sequentially stacked on the second electrode CE. A description thereof is the same as that described above.

According to some exemplary embodiments, the display device 1 may include a liquid crystal display (LCD) as the first display substrate 100.

Figure 41:
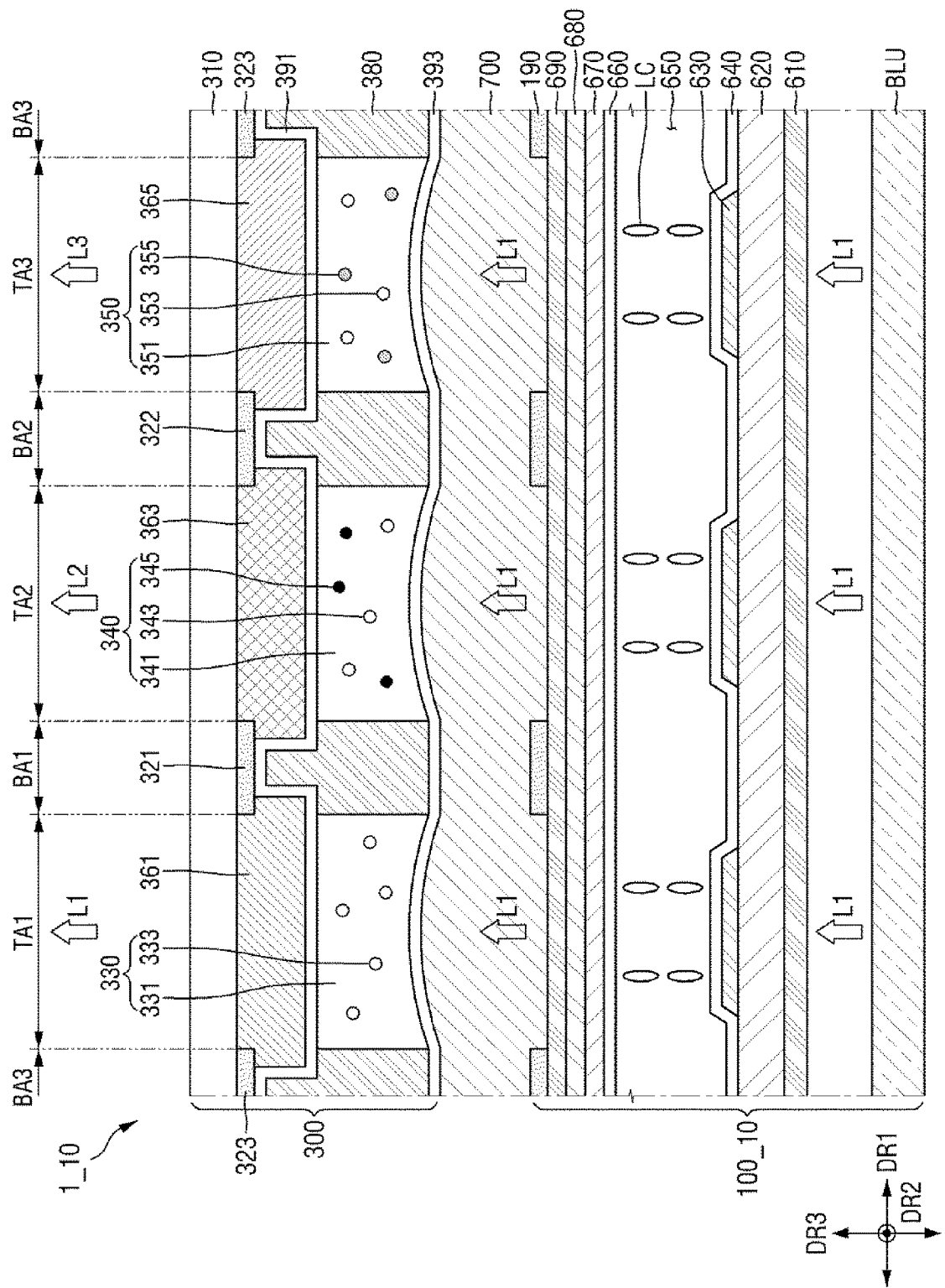
FIG. 41 is a schematic cross-sectional view of a display device according to some exemplary embodiments.

FIG. 41 is a schematic cross-sectional view of a display device according to some exemplary embodiments.

Referring to FIG. 41, in a display device 1_10, a first display substrate 100_10 may be a liquid crystal display (LCD) including liquid crystals LC. Hereinafter, only the structure of the first display substrate 100_10, which is a liquid crystal display (LCD), will be described, and a description of other structures will be omitted.

The first display substrate 100_10 may include a backlight unit BLU, a lower substrate 620, a first electrode 630, a liquid crystal layer 650, a second electrode 670, a lower alignment layer 640, an upper alignment layer 660, an upper substrate 680, a lower polarizer 610, and an upper polarizer 690.

According to an embodiment, first display substrate 100_10 may include a lower substrate 620, an upper substrate 680 facing the lower substrate 620, a liquid crystal layer 650 disposed between the lower substrate 620 and the upper substrate 680, and a backlight unit BLU disposed at a side opposite to the second display substrate 300 based on the liquid crystal layer 650, for example, at a side of the lower substrate 620.

The backlight unit BLU may be disposed under the first display substrate 100_10 to provide light having a specific wavelength to the first display substrate 100_10. The backlight unit BLU may include a light source that emits light directly, and a light guide plate that guides the light emitted from the light source and transmits the light to the first display substrate 100_10.

In an exemplary embodiment, the light source may emit light L1 of the first color. For instance, the backlight unit BLU may provide light L1 of the first color, e.g., a blue color, to the first display substrate 100_10. In some embodiments, the light source may emit light having a peak wavelength in the ultraviolet band, and the backlight unit BLU may provide the ultraviolet light to the first display substrate 100_10.

The lower substrate 620 may be disposed over the backlight unit BLU. The lower substrate 620 may include a switching element and a driving element, constituting a thin film transistor, and a plurality of insulating layers. For example, the lower substrate 620 may be a thin film transistor substrate for controlling the alignment of liquid crystals LC arranged between the lower substrate 620 and the upper substrate 680.

The first electrode 630 may be disposed for each light emitting area LA on the lower substrate 620. The second electrode 670 may be disposed on the first electrode 630 without defining the pixels. The liquid crystal layer 650 may include liquid crystals LC, and may be interposed between the first electrode 630 and the second electrode 670. The liquid crystals LC may be vertically aligned in an initial alignment state with negative dielectric anisotropy, but exemplary embodiments are not limited thereto.

When an electric field is formed between the first electrode 630 and the second electrode 670, the liquid crystals LC may be tilted or rotated, thereby changing the polarization state of light transmitted through the liquid crystal layer 650. In some embodiments, the liquid crystals LC may be horizontally aligned in an initial alignment state with positive dielectric anisotropy.

The lower alignment layer 640 may be disposed between the first electrode 630 and the liquid crystal layer 650, and the upper alignment layer 660 may be disposed between the second electrode 670 and the liquid crystal layer 650. The lower alignment layer 640 and the upper alignment layer 660 may induce the liquid crystals LC to have a predetermined pretilt angle in the initial alignment state.

The upper substrate 680 may support the second electrode 670. The upper substrate 680 may include a switching element and a driving element, constituting a thin film transistor, and a plurality of insulating layers. For instance, the upper substrate 680 may be a thin film transistor substrate for controlling the alignment of liquid crystals LC, but exemplary embodiments are not limited thereto. In some exemplary embodiments, the second substrate 680 may form the thin film transistor substrate with the first substrate 620, and, in this manner, may or may not include a switching element and/or a driving element.

The lower polarizer 610 may be disposed between the backlight unit BLU and the lower substrate 620, and the upper polarizer 690 may be disposed between the upper substrate 680 and the second display substrate 300. Each of the lower and upper polarizers 610 and 690 may be at least one of an absorptive polarizer and a reflective polarizer. For example, the absorptive polarizer may absorb polarization components parallel to the absorption axis and transmit polarization components parallel to the transmission axis to impart polarized light to transmitted light. The lower and upper polarizers 610 and 690 may perform an optical shutter function together with the liquid crystal layer 650 to control the amount of transmitted light for each light emitting area LA.

The arrangement positions of the lower and upper polarizers 610 and 690 are not limited to those shown in FIG. 41. For instance, the lower polarizer 610 may be disposed between the lower substrate 620 and the liquid crystal layer 650, and the upper polarizer 690 may be disposed between the second electrode 670 and the liquid crystal layer 650.

As described above, the first display substrate 100_10 may be a liquid crystal display (LCD) capable of displaying an image by adjusting the transmitted light through the control of the liquid crystal layer 650, and the light source transmitting light to the overlying second display substrate 300 may be a backlight unit BLU of the liquid crystal display (LCD).

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device, comprising:
 a first display substrate comprising a first base, a first electrode disposed on the first base, a second electrode spaced apart from the first electrode, and a light emitting element disposed between the first electrode and the second electrode; and
 a second display substrate facing the first display substrate, the second display substrate being configured to receive light emitted from the light emitting element, wherein:
 the second display substrate comprises a second base, a first color filter disposed on a surface of the second base, and a first wavelength conversion pattern disposed on the first color filter;

a portion of the surface of the second base comprises a depression; and the first color filter is disposed on the depression;

the first wavelength conversion pattern comprises a first surface facing the first display substrate, and a second surface facing the first surface and the first color filter;

the first color filter comprises: a third surface facing a surface of the second base, and a fourth surface facing the third surface and facing the first wavelength conversion pattern;

the first surface comprises a curved surface portion recessed toward the second surface; and each of the third and fourth surfaces comprises a curved surface portion formed corresponding to the depression.

2. The display device of claim 1, wherein:
the third and fourth surfaces are parallel with the surface of the second base; and
the second surface is parallel with the surface of the second base.

3. The display device of claim 2, wherein a first distance, which is a distance between a center of the first surface and a center of the second surface, is shorter than a second distance, which is a distance between corresponding sides of the first and second surfaces.

4. The display device of claim 1, wherein a portion of the second surface is curved along the curved surface portion of the fourth surface.

5. The display device of claim 1, wherein a first distance, which is a distance between a center of the first surface and a center of the second surface, is equal to a second distance, which is a distance between corresponding sides of the first and second surfaces.

6. The display device of claim 1, wherein a center of curvature of the curved surface portion is disposed between the first wavelength conversion pattern and the first display substrate.

7. The display device of claim 6, wherein:
the second display substrate further comprises a second color filter disposed on the surface of the second base and a light transmission pattern disposed on the second color filter;
the light transmission pattern comprises a surface facing the first display substrate and another surface facing the surface of the second base and facing the second color filter; and
the surface of the light transmission pattern comprises a curved surface portion.

8. The display device of claim 7, wherein the second display substrate further comprises:
a first light blocking member disposed between the first color filter and the second color filter; and
a partition wall disposed on the first light blocking member and disposed between the first wavelength conversion pattern and the light transmission pattern.

9. The display device of claim 1, wherein the first electrode and the second electrode are disposed on the first base.

10. The display device of claim 9, wherein the first electrode and the second electrode extend in a first direction on the first base and are spaced apart from each other in a second direction different from the first direction.

11. The display device of claim 10, wherein a first end portion of the light emitting element is electrically connected to the first electrode and a second end portion of the light emitting element is electrically connected to the second electrode.

12. A display device, comprising:
a first display substrate comprising a first light emitting area, a second light emitting area spaced apart from the first light emitting area in a first direction, a third light emitting area spaced apart from the first light emitting area and the second light emitting area, and a non-light emitting area disposed between the first to third light emitting areas;
a filler disposed on the first display substrate; and
a second display substrate disposed on the filler, the second display substrate comprising a first light transmitting area, a second light transmitting area spaced apart from the first light transmitting area in the first direction, a third light transmitting area spaced apart from the first and second light transmitting areas in the first direction, and a non-light transmitting area disposed between the first to third light transmitting areas,
wherein:
the first display substrate further comprises a first light emitting element disposed in the first light emitting area, a second light emitting element disposed in the second light emitting area, and a third light emitting element disposed in the third light emitting area,
the second display substrate further comprises a first color filter disposed in the first light transmitting area, a light transmission pattern disposed on the first color filter, a second color filter disposed in the second light transmitting area, a first wavelength conversion pattern disposed on the second color filter, a third color filter disposed in the third light transmitting area, a second wavelength conversion pattern disposed on the third color filter, and a capping layer disposed on the light transmission pattern, the first wavelength conversion pattern, and the second wavelength conversion pattern,
the first wavelength conversion pattern and the second wavelength conversion pattern include a wavelength conversion material, but the light transmission pattern does not include the wavelength conversion material,
each of the light transmission pattern, the first wavelength conversion pattern, and the second wavelength conversion pattern comprises a first surface facing the first display substrate and a second surface facing the first surface;
the first surface comprises a curved surface portion recessed toward the second surface, and
the capping layer a curved surface correspond to the first surface, and directly contacts the filler.

13. The display device of claim 12, wherein, in association with each of the light transmission pattern, the first wavelength conversion pattern, and the second wavelength conversion pattern, a first distance, which is a distance between a center of the first surface and a center of the second surface, is shorter than a second distance, which is a distance between corresponding sides of the first and second surfaces.

14. The display device of claim 12, wherein the second surface of the light transmission pattern comprises a curved surface portion protruding toward the first color filter.

15. The display device of claim 14, wherein, in association with the light transmission pattern, a first distance, which is a distance between a center of the first surface and a center of the second surface, is equal to a second distance, which is a distance between corresponding sides of the first and second surfaces.

16. The display device of claim 14, wherein:
the first color filter comprises:
- a third surface; and
- a fourth surface facing the third surface and facing the light transmission pattern; and
- each of the third and fourth surfaces comprises a curved surface portion.

17. The display device of claim 16, wherein:
centers of curvature of the first surface, the second surface, and the fourth surface are disposed between the light transmission pattern and the first display substrate; and
a center of curvature of the third surface is disposed between the first color filter and the first display substrate.

18. The display device of claim 12, wherein the second display substrate further comprises:
- a light blocking member disposed between the first color filter and the second color filter in the light blocking area; and
- a partition wall disposed on the first light blocking member and disposed between the light transmission pattern and the first wavelength conversion pattern.

19. The display device of claim 12, wherein:
in each of the first and second light emitting areas, the first display substrate further comprises a first electrode and a second electrode spaced apart from the first electrode;
the first light emitting element is disposed between the first electrode and the second electrode in the first light emitting area; and
the second light emitting element is disposed between the first electrode and the second electrode in the second light emitting area.

20. The display device of claim 19, wherein:
the first light emitting element is configured to emit light of a first color toward the light transmission pattern; and
the first color filter is configured to transmit light of the first color and block light other than light of the first color.

21. The display device of claim 20, wherein:
the second light emitting element is configured to emit light of the first color toward the first wavelength conversion pattern; and
the first wavelength conversion pattern is configured to convert light of the first color into light of a second color different from the first color and to provide the light of the second color to the second color filter.

22. The display device of claim 21, wherein the second color filter is configured to transmit light of the second color and block light other than light of the second color.

23. The display device of claim 20, wherein the second light emitting element is configured to emit light of a second color different from the first color toward the first wavelength conversion pattern.

24. The display device of claim 19, wherein the first display substrate further comprises a plurality of banks disposed in the non-light emitting area.

\* \* \* \* \*